(12) United States Patent
Tarui et al.

(10) Patent No.: US 12,477,789 B2
(45) Date of Patent: Nov. 18, 2025

(54) SEMICONDUCTOR DEVICE HAVING A PLURALITY OF PILLARS AND METHOD OF MANUFACTURING THE SEMICONDUCTOR DEVICE

(71) Applicant: Mitsubishi Electric Corporation, Tokyo (JP)

(72) Inventors: Yoichiro Tarui, Tokyo (JP); Nobuo Fujiwara, Tokyo (JP); Takanori Tanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 303 days.

(21) Appl. No.: 17/918,330

(22) PCT Filed: Jun. 24, 2020

(86) PCT No.: PCT/JP2020/024829
§ 371 (c)(1),
(2) Date: Oct. 12, 2022

(87) PCT Pub. No.: WO2021/260851
PCT Pub. Date: Dec. 30, 2021

(65) Prior Publication Data
US 2023/0147932 A1    May 11, 2023

(51) Int. Cl.
*H10D 62/10*    (2025.01)
*H01L 21/02*    (2006.01)
(Continued)

(52) U.S. Cl.
CPC ...... *H10D 62/111* (2025.01); *H01L 21/02529* (2013.01); *H01L 21/0475* (2013.01); *H10D 62/8325* (2025.01); *H10D 84/146* (2025.01)

(58) Field of Classification Search
CPC .............. H01L 29/063; H01L 29/0634; H01L 29/7811; H01L 21/02529; H01L 21/047;
(Continued)

(56) References Cited

U.S. PATENT DOCUMENTS

| 10,734,515 B2 * | 8/2020 | Takeuchi ............. H10D 62/126 |
| 2008/0211020 A1 * | 9/2008 | Saito ................... H01L 29/7811 |
| | | 257/342 |

(Continued)

FOREIGN PATENT DOCUMENTS

| JP | 2010-28018 A | 2/2010 |
| JP | 2011-108906 A | 6/2011 |

(Continued)

OTHER PUBLICATIONS

International Search Report and Written Opinion mailed on Sep. 29, 2020, received for PCT Application PCT/JP2020/024829, filed on Jun. 24, 2020, 9 pages including English Translation.

*Primary Examiner* — Eric A. Ward
(74) *Attorney, Agent, or Firm* — XSENSUS LLP

(57) ABSTRACT

The present disclosure relates a semiconductor device using a super junction structure, and includes: a semiconductor base body of a first conductivity type; a pillar part including a plurality of first pillars of a first conductivity type and a plurality of second pillars of a second conductivity type provided on the semiconductor base body to protrude in a thickness direction of the semiconductor base body; a pillar surrounding part of a first conductivity type or a second conductivity type provided around the pillar part; and a semiconductor element in which the pillar part is provided as an active region, wherein the plurality of first and second pillars have a striped shape in a plan view, and are alternately (Continued)

arranged in parallel to each other in a pillar width direction perpendicular to a longitudinal direction of each of the pillars.

21 Claims, 56 Drawing Sheets

(51) Int. Cl.
  *H01L 21/04* (2006.01)
  *H10D 62/832* (2025.01)
  *H10D 84/00* (2025.01)

(58) Field of Classification Search
  CPC ............ H01L 21/0475; H01L 29/0619; H01L 29/0657; H01L 29/0692; H01L 29/0696; H01L 29/1095; H01L 29/1608; H01L 29/66068; H01L 29/7806; H01L 29/872
  See application file for complete search history.

(56) References Cited

U.S. PATENT DOCUMENTS

| | | | |
|---|---|---|---|
| 2009/0096030 A1* | 4/2009 | Ishida | H10D 30/0297 |
| | | | 257/E27.081 |
| 2010/0032791 A1* | 2/2010 | Hozumi | H01L 29/7811 |
| | | | 257/493 |
| 2011/0115033 A1 | 5/2011 | Tamaki et al. | |
| 2014/0061644 A1* | 3/2014 | Cao | H01L 23/34 |
| | | | 257/48 |
| 2015/0072486 A1* | 3/2015 | Takeuchi | H01L 29/66068 |
| | | | 438/192 |
| 2018/0350974 A1* | 12/2018 | Okumura | H01L 29/405 |
| 2020/0235203 A1 | 7/2020 | Furuhashi et al. | |
| 2021/0111245 A1 | 4/2021 | Kosugi et al. | |

FOREIGN PATENT DOCUMENTS

| | | |
|---|---|---|
| JP | 2012-19088 A | 1/2012 |
| WO | 2019/069416 A1 | 4/2019 |
| WO | 2019/160086 A1 | 8/2019 |

* cited by examiner

SEMICONDUCTOR DEVICE HAVING A PLURALITY OF PILLARS AND METHOD OF MANUFACTURING THE SEMICONDUCTOR DEVICE

CROSS-REFERENCE TO RELATED APPLICATION

The present application is based on PCT filing PCT/JP2020/024829, filed Jun. 24, 2020, the entire contents of which are incorporated herein by reference.

TECHNICAL FIELD

The present disclosure relates to a semiconductor device, and particularly to a semiconductor device having a super junction structure.

BACKGROUND ART

Silicon carbide (SiC) used for a power device has higher withstand voltage than silicon (Si), and can have low resistance, thus an SiC Schottky barrier diode (SiC-SBD) and an SiC MOS field effect transistor (SiC-MOSFET) are manufactured.

A super junction structure (SJ) is an example of a structure exceeding a theoretical limitation as a unipolar device and achieving further high withstand voltage and low resistance in the SiC power device. The SJ structure is a structure in which a p-type impurity layer (p-type pillar) and an n-type impurity layer (n-type pillar) are alternately arranged in a direction perpendicular to a direction in which main current flows in a semiconductor layer.

A method of forming the SJ structure of an SiC power device includes a multi-epitaxial method of repeating an ion implantation and an epitaxial growth and an embedding epitaxial method of forming a trench to perform embedding epitaxy. Drift resistance is dominant in ON resistance, and there is a large merit in applying the SJ structure in a high withstand voltage device of 3.3 kV or more. In the high withstand voltage device of 3.3 kV or more, a thick SJ structure needs to be formed, thus an epitaxial method has an advantage in consideration of productivity.

When the SJ structure of the SiC power device is formed by the embedding epitaxy, a void is formed in an end portion of the trench as illustrated in FIG. 11 in Patent Document 1. When the void is formed, leakage current increases in a silicon carbide semiconductor device, thus a trench for scribing is formed as illustrated in FIG. 22 in Patent Document 1, and furthermore, a channel stopper region is formed as illustrated in FIG. 24 in Patent Document 1. The leakage current in the silicon carbide semiconductor device is reduced as illustrated in FIG. 31 in Patent Document 1 by a configuration obtained through such a process.

PRIOR ART DOCUMENTS

Patent Document(s)

Patent Document 1: International Publication No. 2019/160086

SUMMARY

Problem to be Solved by the Invention

An invalid region with an extremely large width having the void occurs in the manufacturing method in Patent Document 1, and an additional process and configuration are necessary for reducing the leakage current, thus there is a problem that cost of the semiconductor device increases.

The present disclosure therefore has been made to solve problems as described above, and it is an object of the present disclosure to provide a semiconductor device reducing an invalid region in the semiconductor device and reducing leakage current.

Means to Solve the Problem

A semiconductor device according to the present disclosure includes: a semiconductor base body of a first conductivity type; a pillar part including a plurality of first pillars of a first conductivity type and a plurality of second pillars of a second conductivity type provided on the semiconductor base body to protrude in a thickness direction of the semiconductor base body; a pillar surrounding part of a first conductivity type or a second conductivity type provided around the pillar part; and a semiconductor element in which the pillar part is provided as an active region, wherein the plurality of first and second pillars have a striped shape in a plan view, and are alternately arranged in parallel to each other in a pillar width direction perpendicular to a longitudinal direction of each of the pillars, the pillar surrounding part is provided to wholly surround, with a width, the pillar part protruding on the semiconductor base body so that upper surfaces of the plurality of first and second pillars are exposed, when a conductivity type of the pillar surrounding part is a second conductivity type, a product of a concentration of an impurity of the pillar surrounding part and the width of the pillar surrounding part is set to be larger than a product of a concentration of an impurity of a second conductivity type of the second pillar and a width of the second pillar, and when a conductivity type of the pillar surrounding part is a first conductivity type, a product of a concentration of an impurity of the pillar surrounding part and the width of the pillar surrounding part is set to be larger than a product of a concentration of an impurity of a first conductivity type of the first pillar and a width of the first pillar.

Effects of the Invention

According to the semiconductor device of the present disclosure, a void is hardly formed when the first and second pillars are formed by epitaxial growth, thus an invalid region in the semiconductor device is reduced, and leakage current can be reduced.

DESCRIPTION OF EMBODIMENT(S)

Introduction

Figure 1:
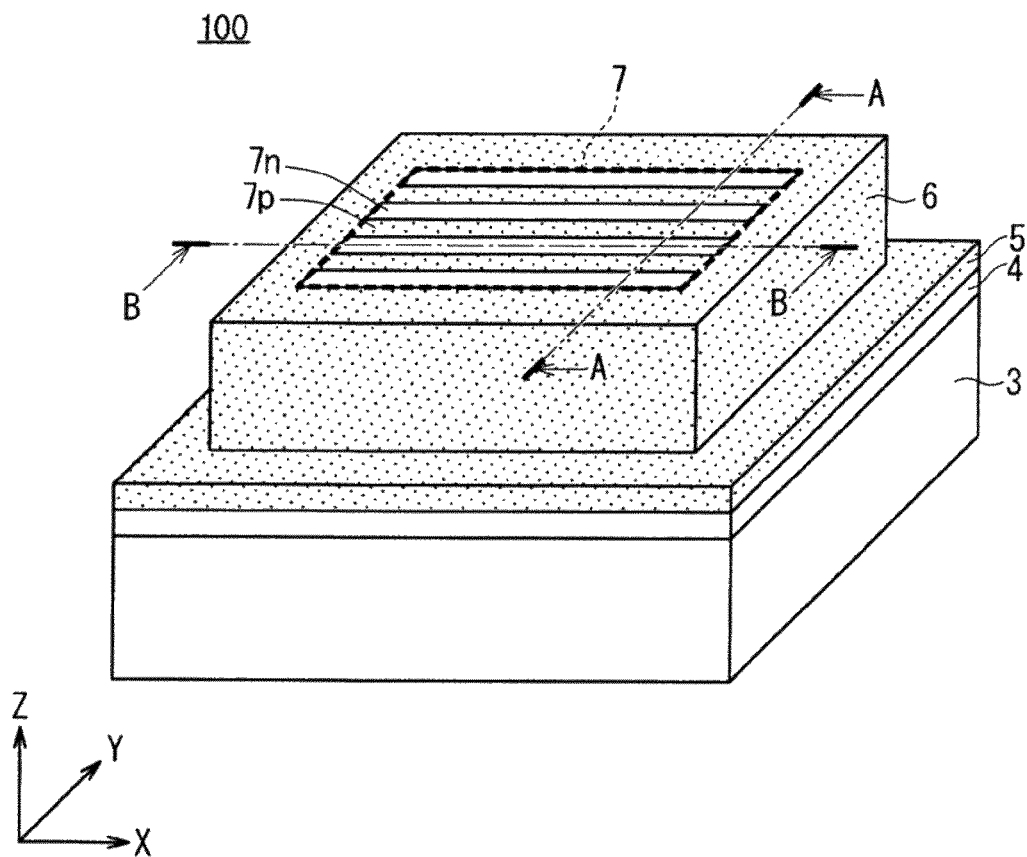
FIG. 1 A perspective view schematically illustrating a configuration of a pillar part of a silicon carbide semiconductor device according to an embodiment 1.

A semiconductor device according to each embodiment described hereinafter indicates a semiconductor chip obtained by separating a semiconductor device manufactured through a wafer process into chips by a dicing process, and a chip surrounding part indicates an outer peripheral portion of the semiconductor chip.

In the description hereinafter, "an outer side" is a direction toward an outer periphery of the semiconductor chip, and "an inner side" is a direction opposite to "the outer side".

In the description hereinafter, with respect to a conductivity type of an impurity, an n type is generally defined as "a first conductivity type" and a p type which is a conductivity type opposite to the n type is defined as "a second conductivity type", however, a reverse definition is also applicable. An $n^-$ type indicates that the $n^-$ type has a lower impurity concentration than the n type, and an $n^+$ type indicates that the $n^+$ type has a higher impurity concentration than the n type. Similarly, a $p-$ type indicates that the $p-$ type has a lower impurity concentration than the p type, and an $p+$ type indicates that the $p+$ type has a higher impurity concentration than the p type.

The drawings are schematically illustrated, thus a size of an image and a mutual relationship of positions thereof are not necessarily illustrated accurately, but can be appropriately changed. In the description hereinafter, the same reference numerals are assigned to the similar constituent elements in the illustration, and the same applies to names and functions thereof. Thus, a detailed description thereof may be omitted in some cases. When there are descriptions of "on . . . " and "cover . . . " in the present specification, they do not hinder presence of an intervening object between the constituent elements. For example, where there is a description of "B provided on A" or "A covers B", it can mean that the other constituent element C is provided or is not provided between A and B. Used in the description hereinafter are terms each indicating a specific position and direction such as "upper", "lower", "lateral", "bottom", "front", and "back", for example, however, these terms are used for convenience of easy understanding of contents of the embodiments, and do not relate to a direction in an actual use.

A term of "MOS" is formerly used for a junction structure of metal-oxide-semiconductor, and is considered to be made up of initials of Metal-Oxide-Semiconductor. However, specifically in a field-effect transistor having a MOS structure (MOSFET), materials of a gate insulating film and a gate electrode are improved from a viewpoint of a recent integration and improvement of a manufacturing process.

For example, in the MOSFET, polycrystal silicon has been adopted as a material of a gate electrode in place of metal from a viewpoint of a formation of mainly a source and drain in a self-aligned form. A high-dielectric constant material is adopted as the material of the gate insulating film from a viewpoint of improvement of electrical characteristics, however, the material is not necessarily limited to oxide.

Accordingly, the term of "MOS" is not necessarily adopted only to a lamination structure of metal-oxide-semiconductor, and the present specification is not based on such a premise. That is to say, in view of a technical common knowledge, "MOS" herein has a meaning of not only an abbreviated word derived from an origin of a word but also widely includes a lamination structure of conductive body-insulating body-semiconductor.

Embodiment 1

<Configuration of Device>

FIG. 1 is a perspective view schematically illustrating a configuration of a pillar part of a silicon carbide semiconductor device 100 having an SJ structure as a semiconductor device according to an embodiment 1. The silicon carbide semiconductor device 100 indicates a vertical MOSFET in which main current flows in a direction perpendicular to a main surface of the semiconductor device, however, illustrations of a main electrode and a MOSFET unit cell are omitted for convenience.

As illustrated in FIG. 1, a pillar part 7 is a region in which a plurality of n-type pillars 7n (first pillars) and a plurality of p-type pillars 7p (second pillars) having a striped shape in a plan view are alternately arranged on a semiconductor substrate 3 in parallel to each other in a width direction perpendicular to a longitudinal direction thereof. The arrangement direction thereof is a direction perpendicular to a direction in which main current of the silicon carbide semiconductor device 100 flows. A p-type pillar surrounding part 6 including a p-type impurity is provided to surround the pillar part 7, and a p-type chip surrounding part 5 including a p-type impurity is located on a further outer side of the p-type pillar surrounding part 6.

The semiconductor substrate 3 is an n$^+$ type SiC substrate, and is a commercially available 4H-1-SiC n-type substrate, for example. The semiconductor substrate 3 has an off angle of four degrees in [11-20] direction, and has a thickness of 300 to 400 μm, and a concentration of an n-type impurity is $5 \times 10^{18}$ to $1 \times 10^{20}$ cm$^{-3}$.

An n-type SiC layer 4 (first semiconductor layer) including an n-type impurity is provided between the semiconductor substrate 3 and the p-type chip surrounding part 5, and has a thickness of 0.5 to 10 μm and an n-type impurity concentration of $1 \times 10^{14}$ to $5 \times 10^{19}$ cm$^{-3}$. The semiconductor substrate 3 and the n-type SiC layer 4 are collectively referred to as the semiconductor base body in some cases.

Figure 2:
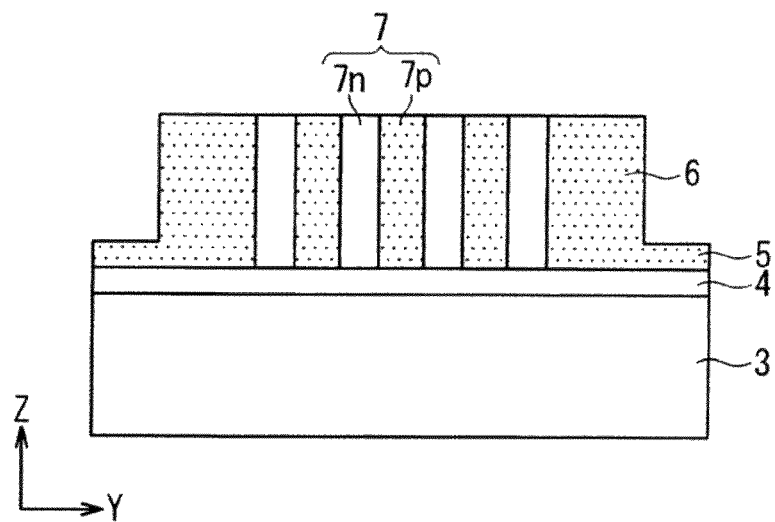
FIG. 2 A cross-sectional view illustrating a configuration of the pillar part of the silicon carbide semiconductor device according to the embodiment 1.
Figure 3:
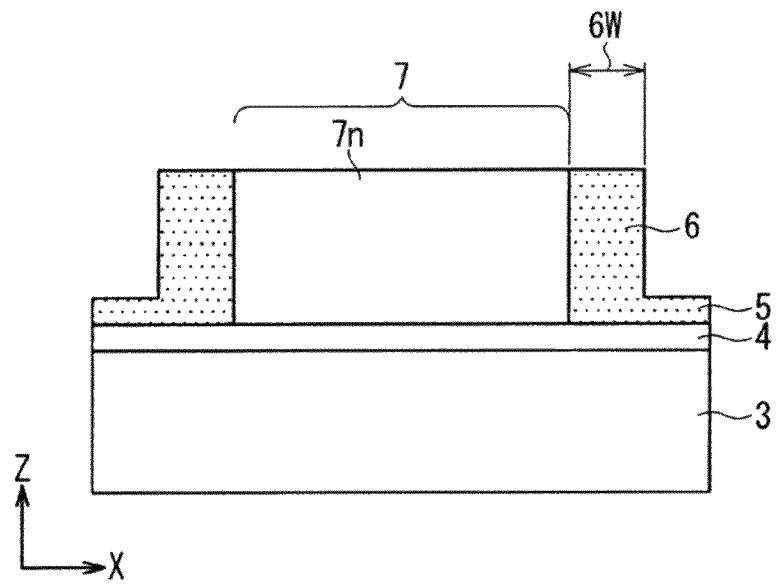
FIG. 3 A cross-sectional view illustrating a configuration of the pillar part of the silicon carbide semiconductor device according to the embodiment 1.

FIG. 2 illustrates a cross-sectional view along an A-A line (line in parallel to a Y axis) in FIG. 1 in an arrow direction, and FIG. 3 illustrates a cross-sectional view along a B-B line (line in parallel to an X axis) in FIG. 1 in an arrow direction. As illustrated in FIG. 2 and FIG. 3, an n-type pillar 7n and a p-type pillar 7p are provided to protrude from the n-type SiC layer 4 in a height direction (Z axis direction), the p-type pillar surrounding part 6 surrounds the pillar part 7, and the p-type chip surrounding part 5 covers an outer periphery of the n-type SiC layer 4. An end portion of the n-type SiC layer 4 is exposed to a side surface of the semiconductor chip.

Figure 4:
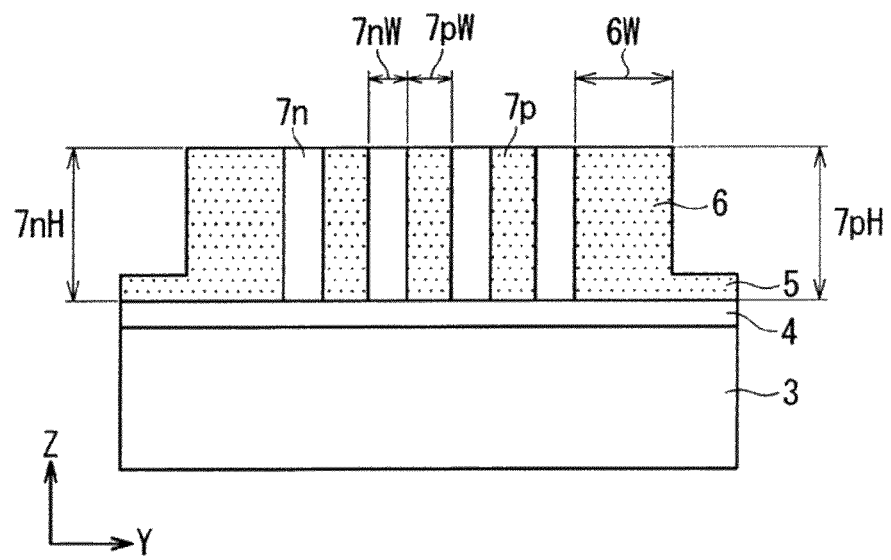
FIG. 4 A diagram illustrating a size of an n-type pillar and p-type pillar.

FIG. 4 is a diagram illustrating a size of the n-type pillar 7n and the p-type pillar 7p. A pillar width 7nW of the n-type pillar 7n and a pillar width 7pW of the p-type pillar 7p are equal to each other, and are formed to have a length of 0.5 to 5 μm, for example. A pillar height 7nH of the n-type pillar 7n and a pillar height 7pH of the p-type pillar 7p are equal to each other, and are formed to have a height of 5 to 100 μm, for example. The n-type pillar 7n and the p-type pillar 7p are formed so that a product of an impurity concentration and the width of the n-type pillar 7n is almost the same as that of the p-type pillar 7p, and each of the n-type impurity and the p-type impurity has a concentration of $5 \times 10^{15}$ to $1 \times 10^{16}$ cm$^{-3}$, for example. According to such a configuration, a depletion layer extends over the whole n-type pillar 7n and p-type pillar 7p when the silicon carbide semiconductor device 100 is in an off state.

The impurity concentration of the n-type SiC layer 4 is preferably equal to or lower than that of the n-type pillar 7n to reduce an electrical field in a joint part with the p-type pillar 7p, but can also be higher than that of the n-type pillar 7n. It is also applicable that the n-type SiC layer 4 is not provided, but the n-type pillar 7n and the p-type pillar 7p can be directly bonded to the semiconductor substrate 3. A smaller effect is obtained in a case where the impurity concentration of the n-type SiC layer 4 is higher than that of the n-type pillar 7n or a case where the n-type SiC layer 4 is not provided than in a case where the impurity concentration of the n-type SiC layer 4 is equal to or lower than that of the n-type pillar 7n, however, when the pillar part 7 illustrated in FIG. 1 is provided, the silicon carbide semiconductor device having higher withstand voltage and lower resistance than a conventional structure can be achieved.

FIG. 1 to FIG. 4 illustrate the configuration that three p-type pillars 7p and four n-type pillars 7n are provided in the pillar part 7, however, the p-type pillars 7p and the n-type pillars 7n, the number of which corresponds to a size of the silicon carbide semiconductor device, are actually formed. As described above, a width of the whole MOSFET cell region having a pillar width of 0.5 to 5 μm and provided with the MOSFET unit cell in the Y direction is 1 to 10 mm, for example, thus the p-type pillars 7p and the n-type pillars 7n, the number of which corresponds to a range that those pillars are housed in at least the MOSFET cell region, are formed.

As illustrated in FIG. 3 and FIG. 4, the width 6W of the p-type pillar surrounding part 6 is larger than the width 7pW of the p-type pillar 7p, thus when the p-type pillar surrounding part 6 and the p-type pillar 7p have the same impurity concentration, a product of the impurity concentration and the width of the p-type pillar surrounding part 6 is larger than that of the p-type pillar 7p. According to such a configuration, the depletion layer does not extend to the whole p-type pillar surrounding part 6, and an electrical field strength of the p-type pillar surrounding part 6 is suppressed to be low, thus increase in leakage current and discharge risk is suppressed. In this case, the width of the p-type pillar surrounding part 6 can be at least 1.2 times as large as that of the p-type pillar 7p.

Even in a case where the width 6W of the p-type pillar surrounding part 6 and the width 7pW of the p-type pillar 7p are the same as each other, when the impurity concentration of the p-type pillar surrounding part 6 is at least 1.2 times as large as that of the p-type pillar 7p, the depletion layer does not extend to the whole p-type pillar surrounding part 6, and an electrical field strength of the p-type pillar surrounding part 6 is suppressed to be low, thus increase in leakage current and discharge risk is suppressed.

Figure 5:
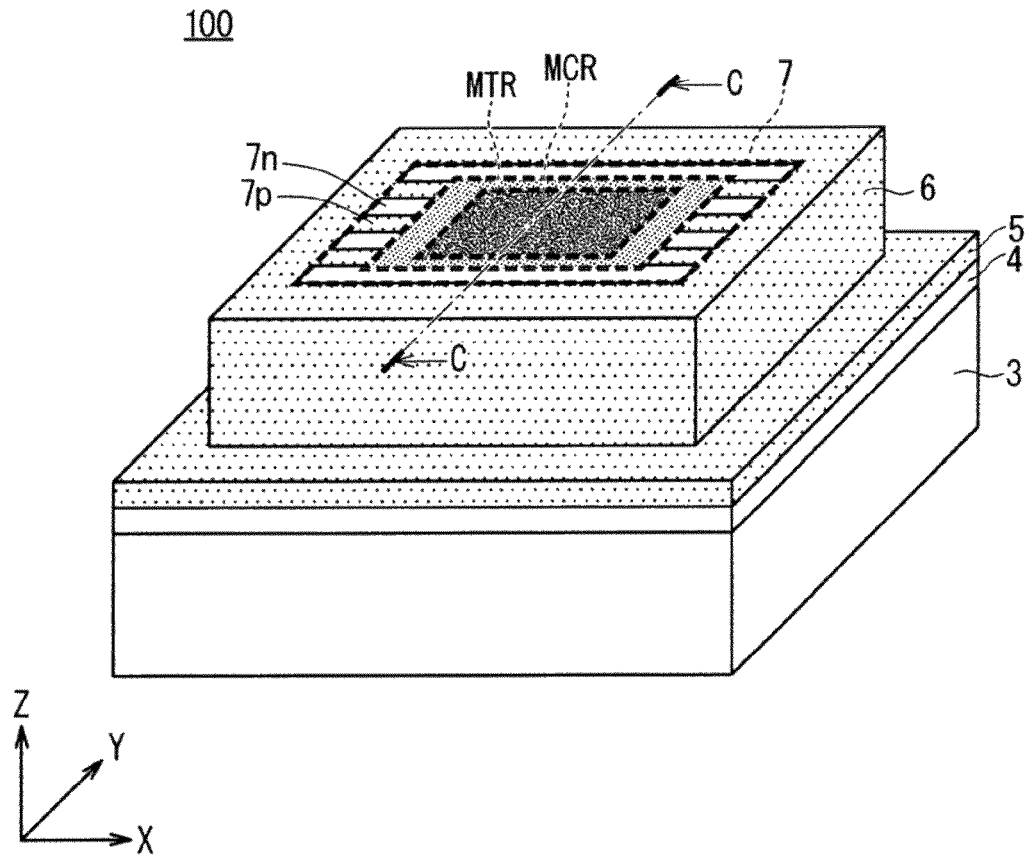
FIG. 5 A perspective view schematically illustrating the silicon carbide semiconductor device according to the embodiment 1.

FIG. 5 is a perspective view of the silicon carbide semiconductor device 100 schematically showing an MOSFET cell region MCR in a case where the MOSFET unit cell is provided in the pillar part 7 and an MOSFET terminal region MTR provided on an outer periphery thereof.

Figure 6:
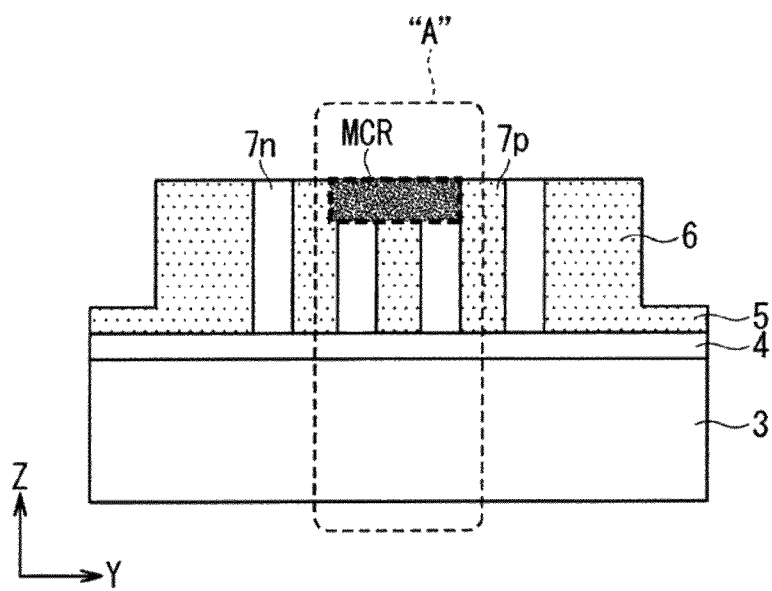
FIG. 6 A diagram illustrating a configuration of a MOSFET cell region.
Figure 7:
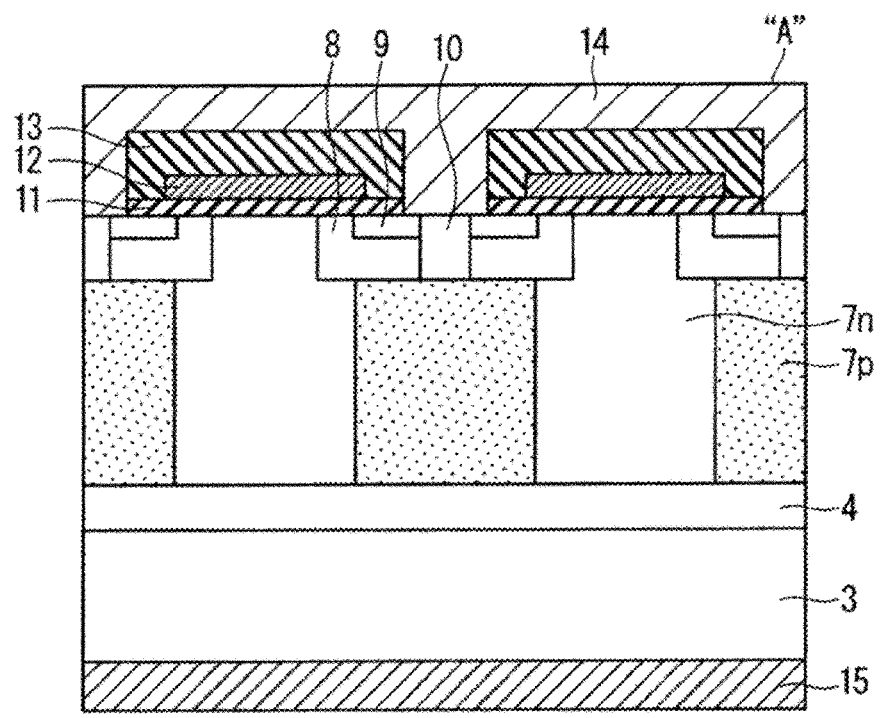
FIG. 7 A diagram illustrating a configuration of a MOSFET cell region.

A configuration of the MOSFET cell region MCR is described using FIG. 6 and FIG. 7. FIG. 6 is a cross-sectional view along a C-C line (line in parallel to the Y axis) in an arrow direction in FIG. 5, and FIG. 7 illustrates an enlarged view of a region A in FIG. 6.

As illustrated in FIG. 7, in the MOSFET, the n-type SiC layer 4 is provided on one main surface of the semiconductor substrate 3, and the plurality of p-type pillars 7p and the plurality of n-type pillars 7n are alternately provided on the n-type SiC layer 4. A plurality of p-type well regions 8 are selectively provided in a region from an upper layer portion of the p-type pillar 7p to an upper layer portion of the n-type pillar 7n, and a p-type contact region 10 is provided in each well region 8 to pass through the well region 8.

An n-type source region 9 is provided to have contact with both side surfaces of the contact region 10 on the upper layer portion of the well region 8. The source region 9 is provided to have a thickness smaller than the well region 8, and the contact region 10 is provided to have a thickness substantially equal to or slightly deeper than the well region 8, thus the contact region 10 is electrically connected to the p-type pillar 7p.

A gate insulating film 11 is selectively formed to extend over the source regions 9 of the well regions 8 adjacent to each other, and a gate electrode 12 is formed on the gate insulating film 11. That is to say, the gate insulating film 11 is provided to extend from a partial upper portion of the source region 9 to a partial upper portion of the source region 9 of the adjacent well region 8 over the well region 8 and the n-type pillar 7n between the source regions 9 adjacent to each other, and the gate electrode 12 is provided on the gate insulating film 11.

An interlayer insulating film 13 is formed to cover the gate insulating film 11 and the gate electrode 12, and a source electrode 14 is formed to cover the interlayer insulating film 13. Provided in the interlayer insulating film 13 is a contact hole passing through the interlayer insulating film 13 in a thickness direction to reach a part of the source region 9 and a whole surface of the contact region 10 in a region other than a region covering the gate electrode 12. The contact hole is filled with the source electrode 14, and the source electrode 14 is connected to the source region 9 and the contact region 10.

A drain electrode 15 is provided on the other main surface (rear surface) of the semiconductor substrate 3 on a side opposite to a side on which the source electrode 14 is provided. An example of a configuration of the MOSFET cell region MCR and the MOSFET terminal region MTR is further described hereinafter.

As described above, provided on the semiconductor substrate 3 is the pillar part 7 in which the plurality of n-type pillars 7n and the plurality of p-type pillars 7p having a striped shape in a plan view are alternately arranged, thus the void is not formed when the p-type pillar 7p is formed by an epitaxial growth, and the invalid region can be reduced. Thus, processing for separating the void is unnecessary, and manufacturing cost can be reduced.

FIG. 7 illustrates the configuration of providing two MOSFET unit cells, however, the unit cell, the number of which corresponds to a size of the silicon carbide semiconductor device, is actually formed.

Modification Example 1

Figure 8:
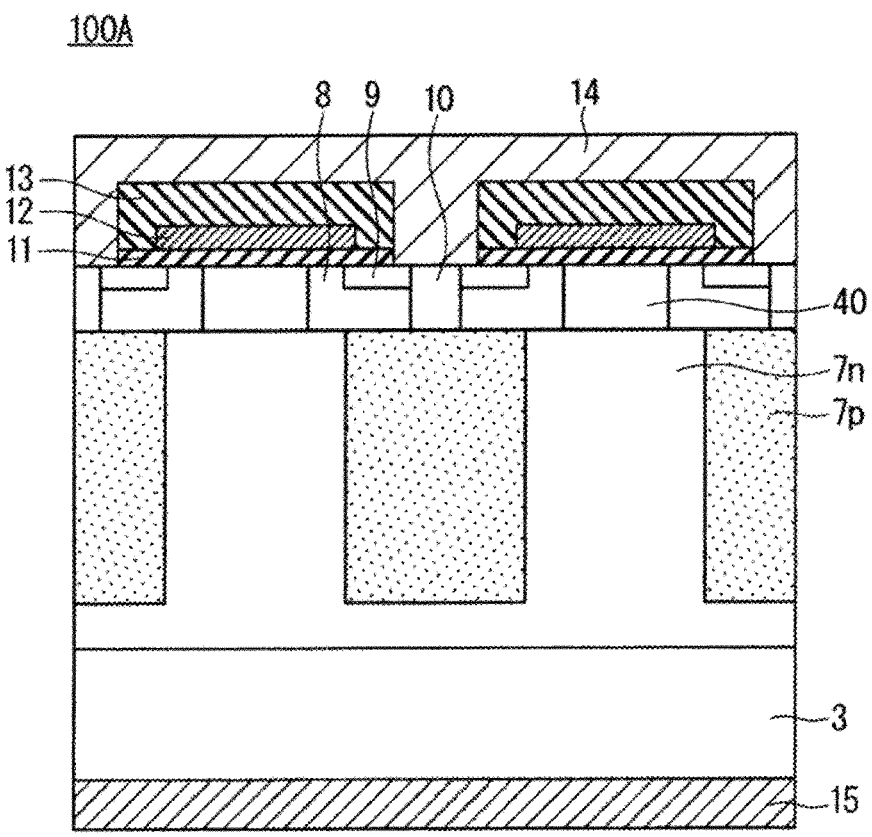
FIG. 8 A cross-sectional view illustrating a configuration of a silicon carbide semiconductor device according to a modification example 1 of the embodiment 1.

FIG. 8 is a cross-sectional view illustrating a configuration of a silicon carbide semiconductor device 100A according to a modification example 1 of the embodiment 1, and is a cross-sectional view corresponding to FIG. 7. As illustrated in FIG. 8, the silicon carbide semiconductor device 100A is provided with an n-type SiC layer 40 (second n-type SiC layer) between the well regions 8 in place of the n-type SiC layer 4.

Modification Example 2

Figure 9:
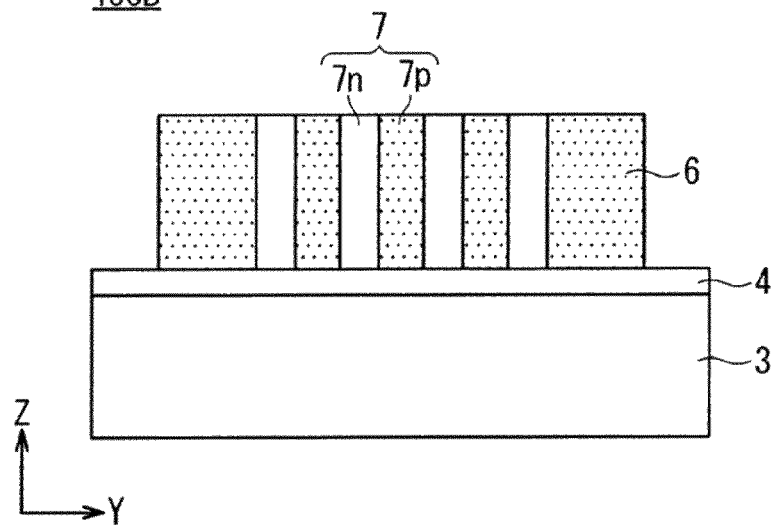
FIG. 9 A cross-sectional view illustrating a configuration of a silicon carbide semiconductor device according to a modification example 2 of the embodiment 1.

FIG. 9 is a cross-sectional view illustrating a configuration of a silicon carbide semiconductor device 100B according to a modification example 2 of the embodiment 1, and is a cross-sectional view corresponding to FIG. 2. As illustrated in FIG. 9, the silicon carbide semiconductor device 100B has a configuration that the p-type chip surrounding part 5 is not provided on the n-type SiC layer 4.

Such a configuration has a feature that the p-type pillar 7p is easily made by whole surface etching when the p-type pillar 7p is formed by embedding epitaxial method. The n-type SiC layer 4 has a uniform thickness in FIG. 9, however, a thickness of the n-type SiC layer 4 in a region where the p-type chip surrounding part 5 is removed may be smaller than that on a lower portion of the p-type pillar surrounding part 6 and the p-type pillar 7p.

Modification Example 3

Figure 10:
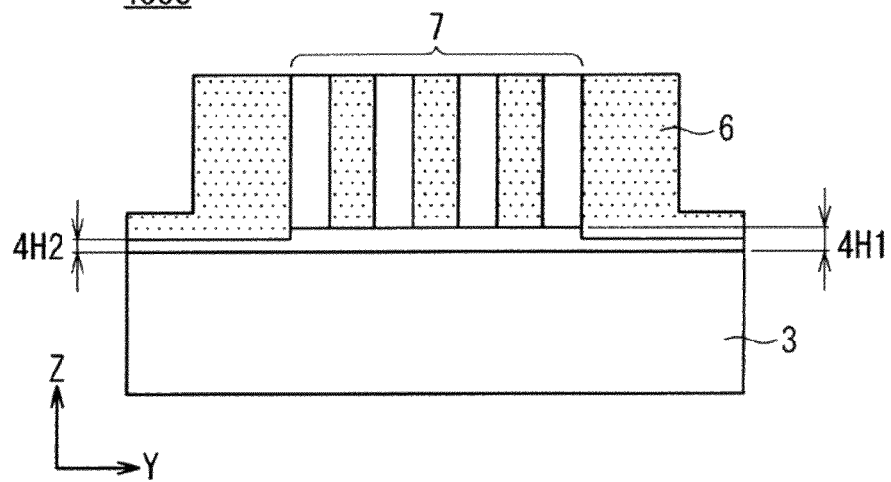
FIG. 10 A cross-sectional view illustrating a configuration of a silicon carbide semiconductor device according to a modification example 3 of the embodiment 1.
Figure 11:
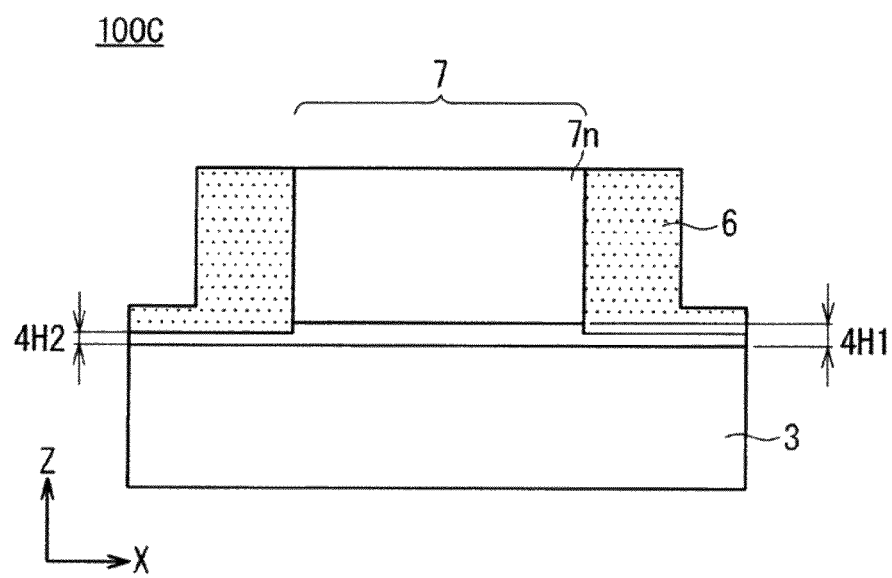
FIG. 11 A cross-sectional view illustrating a configuration of a silicon carbide semiconductor device according to a modification example 3 of the embodiment 1.

FIG. 10 and FIG. 11 are cross-sectional views each illustrating a configuration of a silicon carbide semiconductor device 100C according to a modification example 3 of the embodiment 1, and are cross-sectional views corresponding to FIG. 2 and FIG. 3, respectively. As illustrated in FIG. 10 and FIG. 11, in the silicon carbide semiconductor device 100B, a pillar surrounding part height 4H2 in the n-type SiC layer 4 is lower than a height 4H1 of the n-type SiC layer 4 in the pillar part 7.

Figure 12:
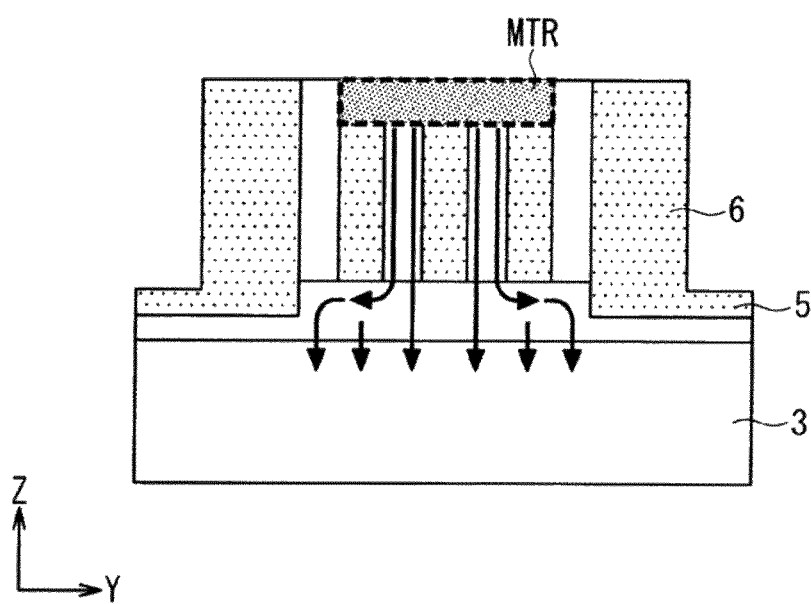
FIG. 12 A diagram schematically illustrating a flow of main current in the silicon carbide semiconductor device according to the modification example 3 of the embodiment 1.

FIG. 12 is a diagram schematically illustrating a flow of main current in the MOSFET cell region MCR in a case of adopting such a configuration by an arrow. As illustrated in FIG. 12, the main current in the MOSFET cell region MCR flows in the MOSFET cell region MCR, and current hardly flows in the chip surrounding part. The reason is that when the thickness of the pillar surrounding part of the n-type SiC layer 4 is reduced, a current route is reduced, and an extension width of the main current to the chip surrounding part is reduced, thus the main current reaches the semiconductor substrate 3 before the main current extends to the chip surrounding part. A ratio of the height 4H1 to the height 4H2 can be substantially 2:1, for example.

The chip surrounding part has a defect in dicing, for example, thus a problem occurs easily when main current flows. When the pillar surrounding part height 4112 of the n-type SiC layer 4 is lower than the pillar height 4111 of the n-type SiC layer 4 in the pillar part 7, the main current hardly flows in the chip surrounding part, thus current capacity increases in a case where large current flows as the main current in the MOSFET.

The silicon carbide semiconductor device using silicon carbide as a semiconductor is excellent in pressure resistance and has a high allowable current density compared with a semiconductor device using silicon as a semiconductor, thus a semiconductor device excellent in heat resistance and capable of operating in high temperature can be obtained.

Embodiment 2

<Method of Manufacturing Pillar Part>

Figure 13:
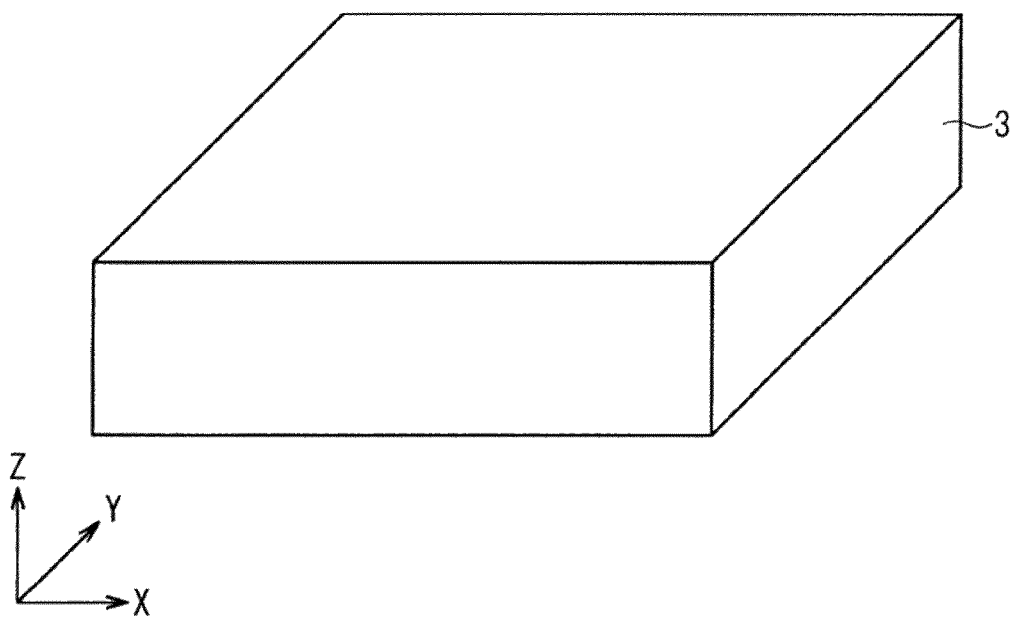
FIG. 13 A perspective view schematically illustrating a method of manufacturing a pillar part of a silicon carbide semiconductor device according to an embodiment 2.

Described next is a method of manufacturing a pillar part of a silicon carbide semiconductor device 200 as an embodiment 2. Prepared firstly in a process illustrated in FIG. 13 is the semiconductor substrate 3 as a commercially available 4H-SiC n-type substrate, for example. The semiconductor substrate 3 has an off angle of four degrees in [11-20] direction, and has a thickness of 300 to 400 μm, and a concentration of an n-type impurity is $5 \times 10^{18}$ to $1 \times 10^{20}$ cm$^{-3}$.

Figure 14:
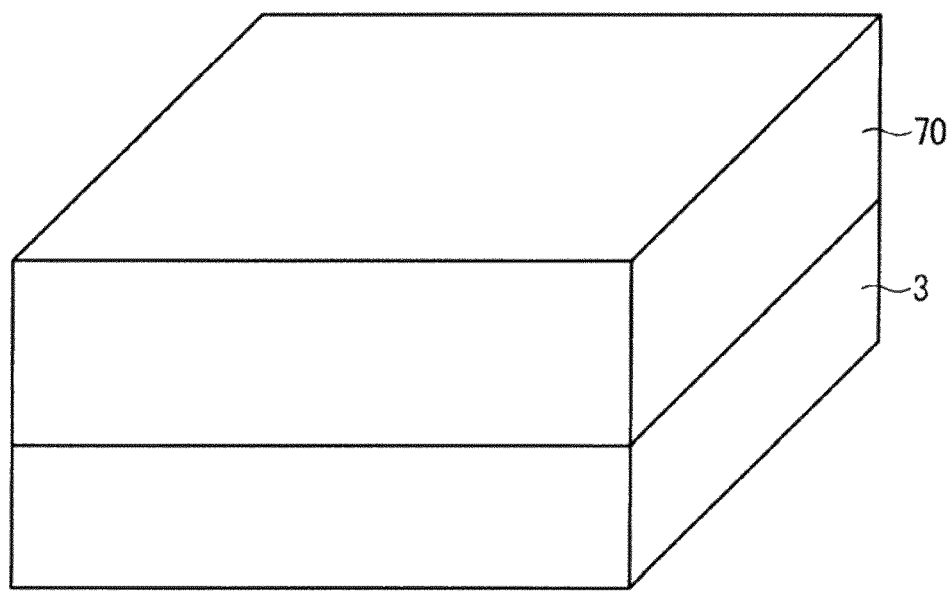
FIG. 14 A perspective view schematically illustrating the method of manufacturing the pillar part of the silicon carbide semiconductor device according to the embodiment 2.

Next, in a process illustrate in FIG. 14, an n-type SiC layer 70 (first semiconductor layer) including an n-type impurity is formed by epitaxial growth on one main surface of the semiconductor substrate 3. The n-type SiC layer 70 may have a thickness of 5 to 100 μm, and have an n-type impurity concentration of $1 \times 10^{15}$ to $1 \times 10^{18}$ cm$^{-3}$, for example. The semiconductor substrate 3 and the n-type SiC layer 70 are collectively referred to as the semiconductor base body in some cases.

Figure 15:
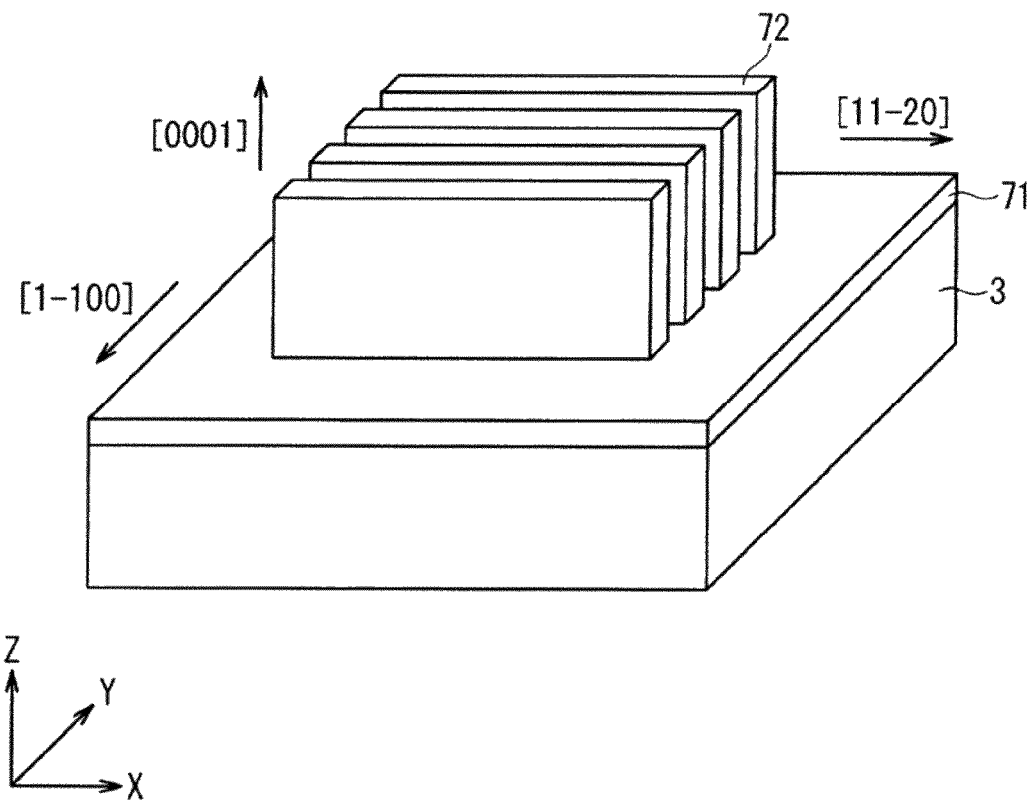
FIG. 15 A perspective view schematically illustrating the method of manufacturing the pillar part of the silicon carbide semiconductor device according to the embodiment 2.

Next, in a process illustrated in FIG. 15, the n-type SiC layer 70 is etched by dry etching to form a convex part 72 of the n-type SiC layer 70 and an n-type chip surrounding part 71 of the n-type SiC layer 70. When the semiconductor substrate 3 has the off angle of four degrees in the [11-20] direction, the convex part 72 has a striped shape extending in a direction in parallel to the X axis ([11-20] direction) in a plan view, and the plurality of convex parts 72 are arranged at intervals along a direction along the Y axis ([1-100] direction). The n-type SiC layer 70 has a symmetrical shape in a direction perpendicular to the [11-20] direction, thus the shape of the p-type SiC layer can be easily controlled in forming the p-type SiC layer between the convex parts 72 by the epitaxial growth. The convex part 72 is formed so that a width in the Y axis direction is within a range of 0.5 to 5 μm, and a height in the Z axis direction ([0001] direction) is within a range of 5 to 100 μm, for example.

In the meanwhile, when a substrate with no off angle is used for the semiconductor substrate 3, the convex part 72 having the striped shape can be formed in an orientation rotated at 90 degrees around an [0001] axis from the [11-20] direction. That is to say, even when the convex part 72 is formed in the orientation in which the [11-20] axis and the [1-100] axis in FIG. 15 are replaced with each other, the p-type SiC layer formed between the convex parts 72 by the epitaxial growth has a symmetrical shape, thus the shape of the p-type SiC layer can be easily controlled.

Figure 16:
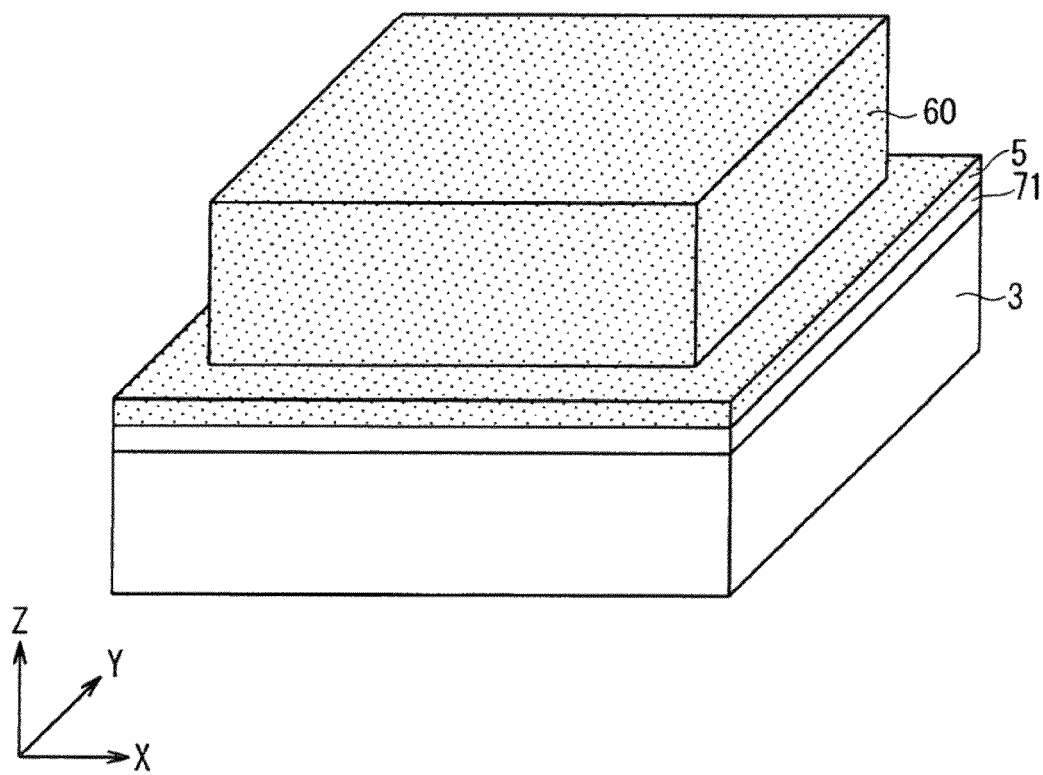
FIG. 16 A perspective view schematically illustrating the method of manufacturing the pillar part of the silicon carbide semiconductor device according to the embodiment 2.

Next, in a process illustrated in FIG. 16, a p-type SiC layer 60 (second semiconductor layer) is formed to cover the n-type chip surrounding part 71 and the convex part 72 of the n-type SiC layer 70 by the epitaxial growth. In FIG. 16, a surface of the p-type SiC layer 60 around the convex part 72 of the n-type SiC layer 70 is flat, but may have a concave-convex portion.

As illustrated in FIG. 15, the p-type SiC layer 60 is epitaxially grown in the state where the surrounding part of the convex part 72 of the n-type SiC layer 70 is dug down as the n-type chip surrounding part 71, thus a void due to a difference of a crystal growth speed caused by a difference of a crystal plane orientation is not formed, and an invalid region can be reduced. Thus, processing for separating the void is unnecessary, and manufacturing cost can be reduced.

It is sufficient that a concentration of the p-type impurity of the p-type SiC layer 60 is set so that a product of the impurity concentration and width of the n-type pillar 7n substantially coincides with a product of the impurity concentration and width of the p-type pillar 7p.

Figure 17:
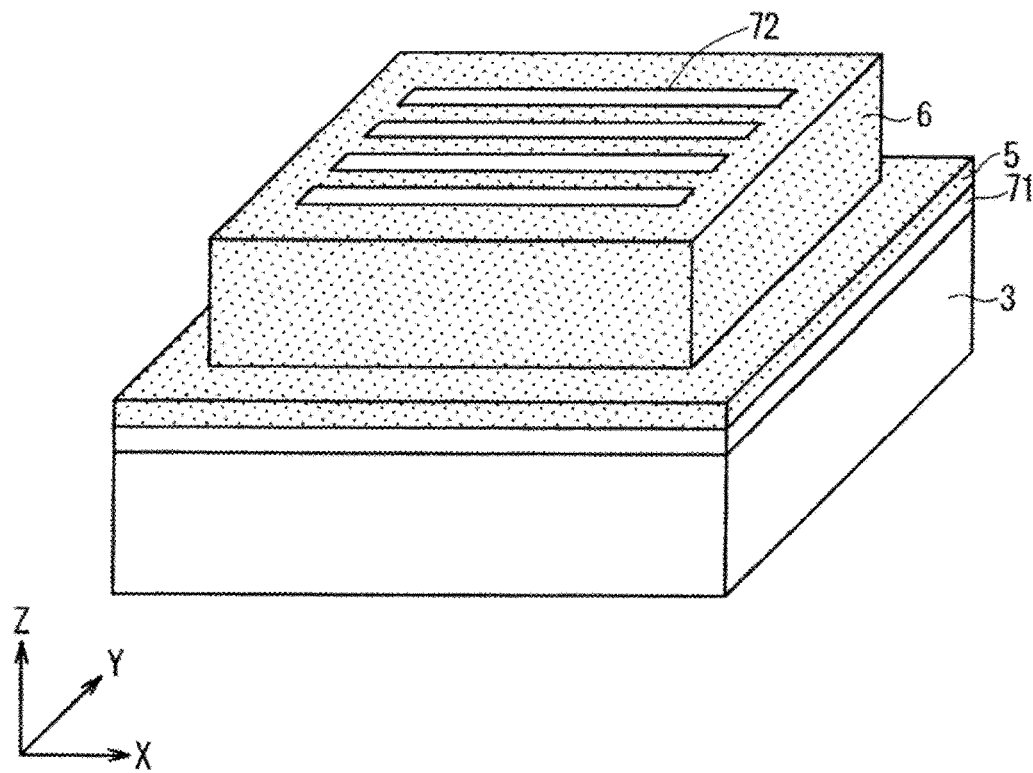
FIG. 17 A perspective view schematically illustrating the method of manufacturing the pillar part of the silicon carbide semiconductor device according to the embodiment 2.

Next, in a process illustrated in FIG. 17, the p-type SiC layer 60 on the convex part 72 of the n-type SiC layer 70 is removed by polishing or dry etching to expose an upper surface of the convex part 72 and leave the p-type SiC layer 60 between the convex parts 72. The convex part 72 constitutes the n-type pillar 7n and the p-type SiC layer 60 between the convex parts 72 constitutes the p-type pillar 7p to constitute the pillar part 7. The p-type pillar surrounding part 6 having a predetermined width is formed to surround the pillar part 7. An upper portion of the convex part 72 of the n-type SiC layer 70 can be partially removed. An upper portion of the p-type chip surrounding part 5 on the n-type chip surrounding part 71 of the n-type SiC layer 70 can be partially removed.

Figure 18:
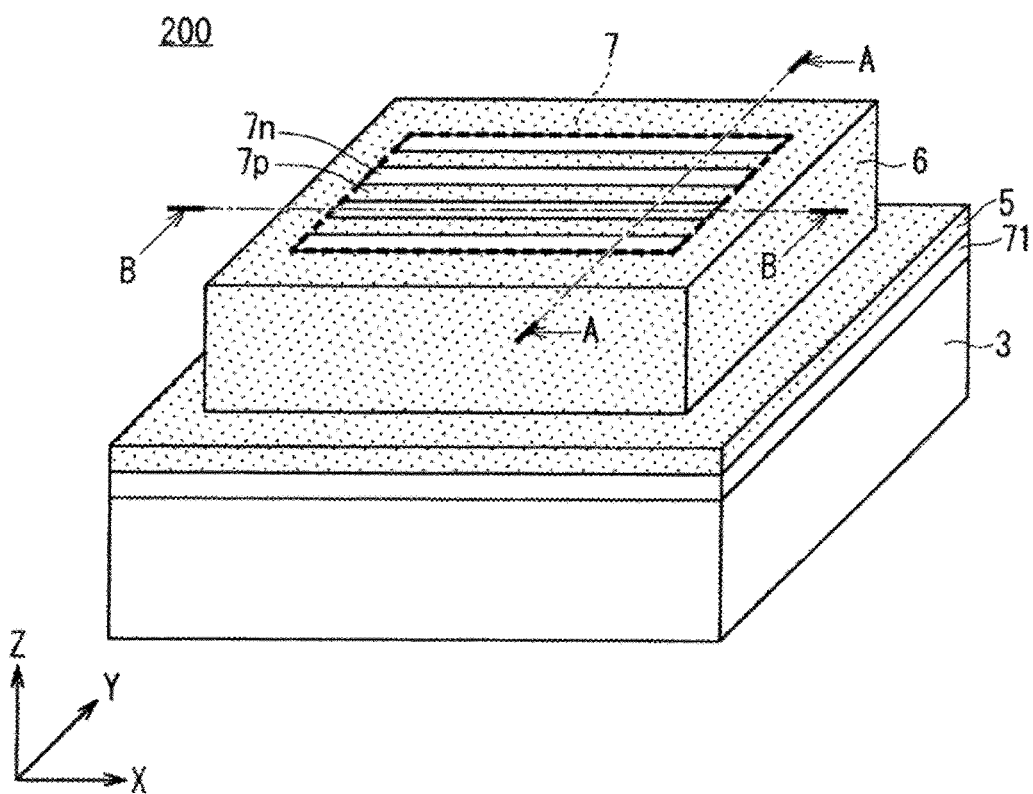
FIG. 18 A perspective view schematically illustrating a configuration of the pillar part of the silicon carbide semiconductor device according to the embodiment 2.

FIG. 18 illustrates a perspective view of the silicon carbide semiconductor device 200 formed by the above method in a state before the MOSFET cell region MCR and the MOSFET terminal region MTR are formed. As illustrated in FIG. 18, the silicon carbide semiconductor device 200 is the same as the silicon carbide semiconductor device 100 illustrated in FIG. 1 except that an edge surface of the n-type chip surrounding part 71 of the n-type SiC layer 70 is exposed to a side surface of the semiconductor chip.

FIG. 14 to FIG. 18 illustrate the configuration that three p-type pillars 7p and four n-type pillars 7n are provided in the pillar part 7, however, the p-type pillars 7p and the n-type pillars 7n, the number of which corresponds to a size of the silicon carbide semiconductor device, are actually formed.

Described next is a modification example of a method of manufacturing the pillar part of the silicon carbide semiconductor device 200 using a cross-sectional view along an A-A line (line in parallel to the Y axis) in an arrow direction and a cross-sectional view along a B-B line (line in parallel to the X axis) in an arrow direction in FIG. 18.

Figure 19:
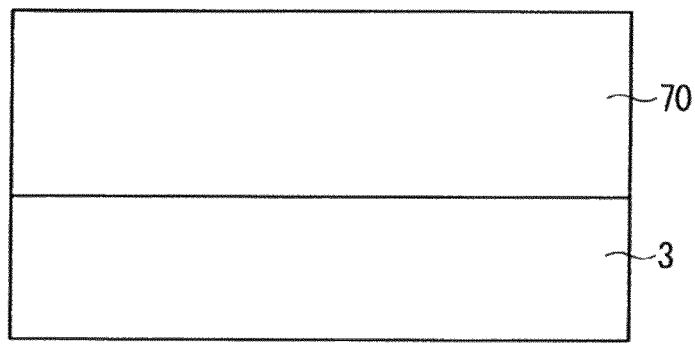
FIG. 19 A cross-sectional view illustrating a method of manufacturing the pillar part of the silicon carbide semiconductor device according to the embodiment 2.
Figure 19:
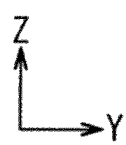
Figure 20:
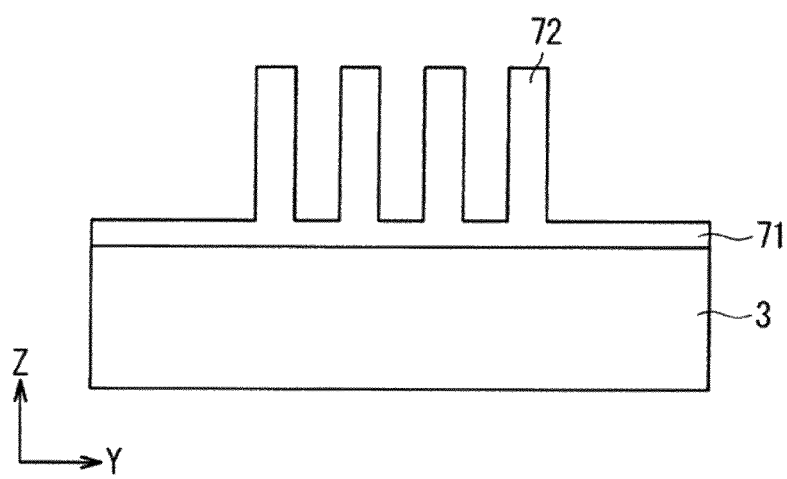
FIG. 20 A cross-sectional view illustrating a method of manufacturing the pillar part of the silicon carbide semiconductor device according to the embodiment 2.
Figure 21:
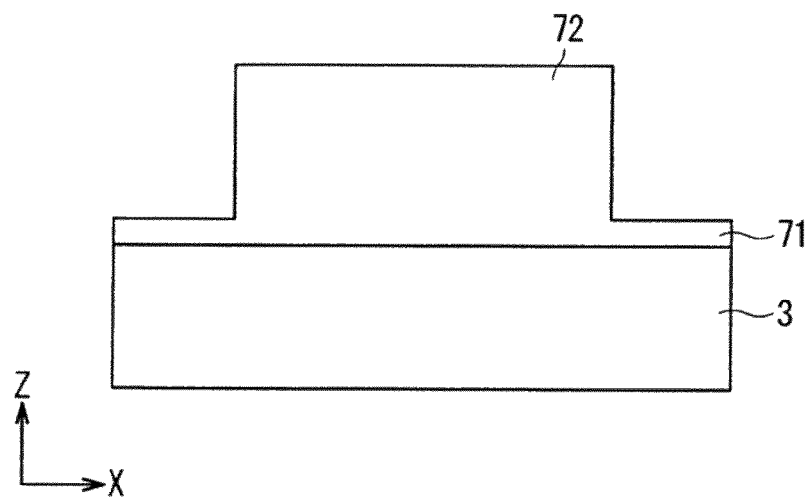
FIG. 21 A cross-sectional view illustrating the method of manufacturing the pillar part of the silicon carbide semiconductor device according to the embodiment 2.
Figure 22:
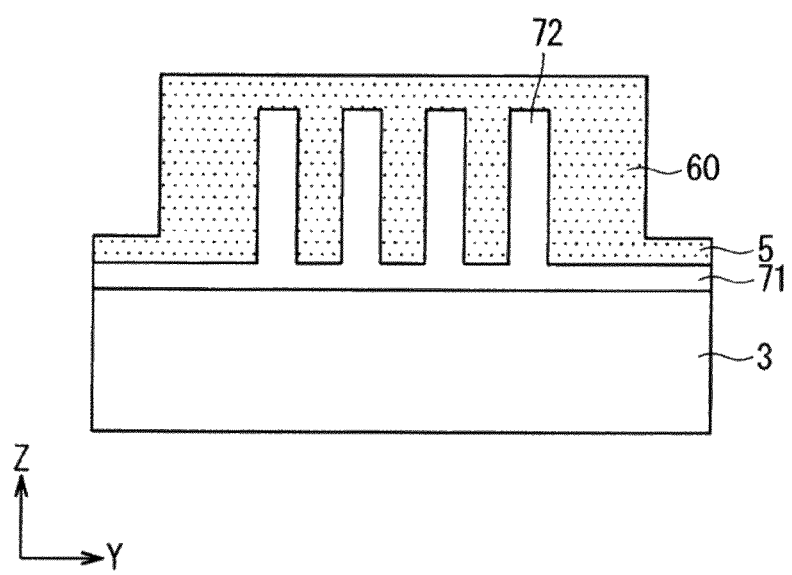
FIG. 22 A cross-sectional view illustrating the method of manufacturing the pillar part of the silicon carbide semiconductor device according to the embodiment 2.
Figure 23:
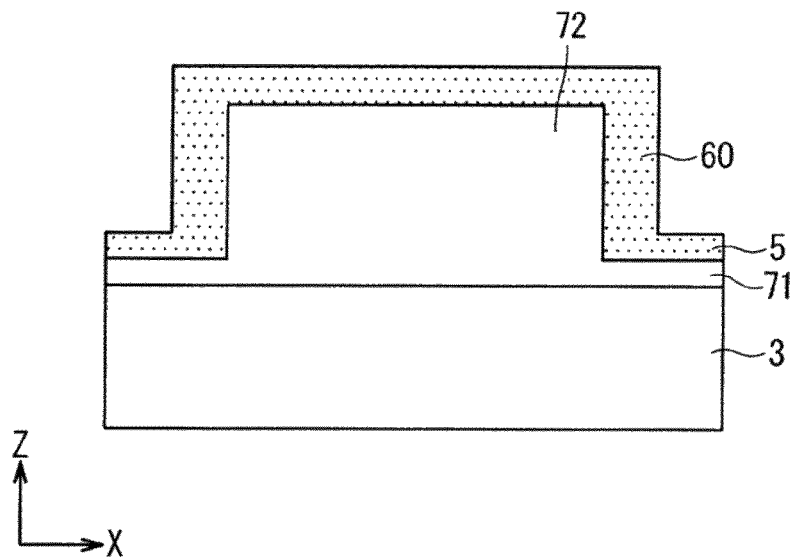
FIG. 23 A cross-sectional view illustrating the method of manufacturing the pillar part of the silicon carbide semiconductor device according to the embodiment 2.
Figure 24:
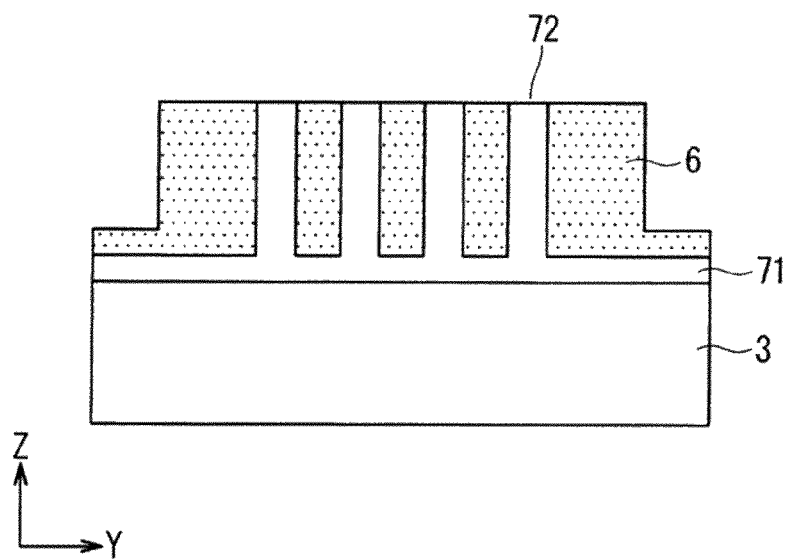
FIG. 24 A cross-sectional view illustrating the method of manufacturing the pillar part of the silicon carbide semiconductor device according to the embodiment 2.
Figure 25:
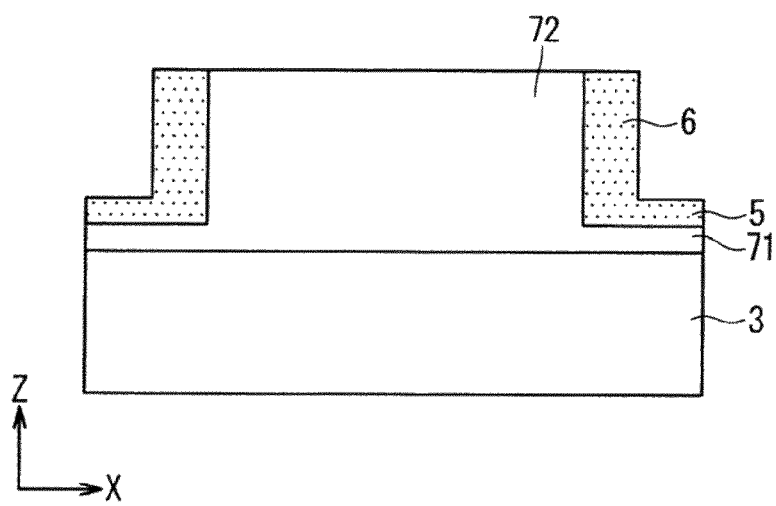
FIG. 25 A cross-sectional view illustrating the method of manufacturing the pillar part of the silicon carbide semiconductor device according to the embodiment 2.

Firstly, FIG. 19 to FIG. 25 illustrate cross-sectional views along the A-A line and B-B line in the processes illustrated in FIG. 14 to FIG. 17. FIG. 19 is a cross-sectional view along the A-A line in the process illustrated in FIG. 14. The cross-sectional view along the B-B line is the same as that in FIG. 19. FIG. 20 is a cross-sectional view along the A-A line in the process illustrated in FIG. 15, and FIG. 21 is a cross-sectional view along the B-B line. FIG. 22 is a cross-sectional view along the A-A line in the process illustrated in FIG. 16, and FIG. 23 is a cross-sectional view along the B-B line. FIG. 24 is a cross-sectional view along the A-A line in the process illustrated in FIG. 17, and FIG. 25 is a cross-sectional view along the B-B line.

Modification Example 1 of Method of Manufacturing Pillar Part

Figure 26:
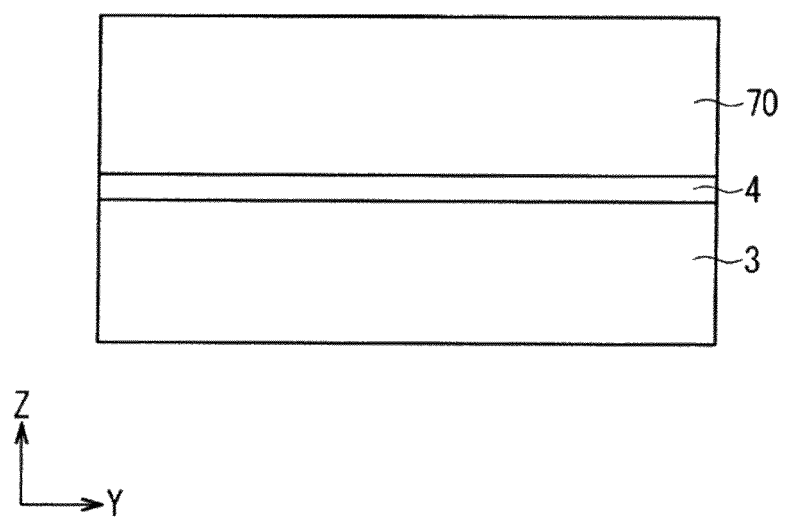
FIG. 26 A cross-sectional view illustrating a modification example 1 of the method of manufacturing the pillar part of the silicon carbide semiconductor device according to the embodiment 2.

Added to the configuration illustrated in FIG. 19 is a configuration that the n-type SiC layer 4 including the n-type impurity is formed by the epitaxial growth on one main surface of the semiconductor substrate 3 as in FIG. 26, and the n-type SiC layer 70 including the n-type impurity is further formed thereon by the epitaxial growth, thus a double layer structure can be obtained. In this case, the n-type SiC layer 4 as a first layer can have a thickness of 0.5 to 10 μm and an n-type impurity concentration of $1 \times 10^{14}$ to $1 \times 10^{19}$ $cm^{-3}$, for example, and the n-type SiC layer 70 as a second layer can have a thickness of 5 to 100 μm and an n-type impurity concentration of $1 \times 10^{15}$ to $1 \times 10^{18}$ $cm^{-3}$, for example. Both the n-type SiC layer 4 and the n-type SiC layer 70 can be referred to as the first n-type SiC layer.

The first n-type SiC layer has the double layer structure in this manner, thus a distortion due to a difference of a lattice constant of crystal caused by a difference of an impurity concentration can be reduced between the semiconductor substrate 3 and the epitaxial layer. The thickness and the impurity concentration are changed between the first layer and the second layer by reason that the thickness and the impurity concentration necessary to reduce the distortion are different between the first layer and the second layer.

Figure 27:
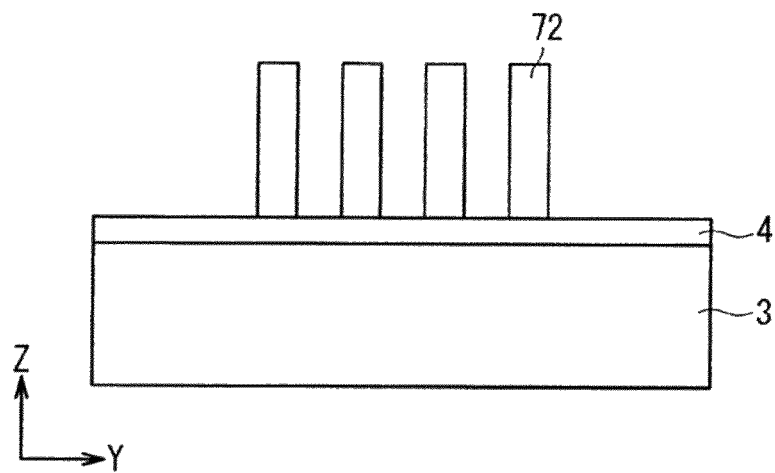
FIG. 27 A cross-sectional view illustrating a modification example 1 of the method of manufacturing the pillar part of the silicon carbide semiconductor device according to the embodiment 2.

When the first n-type SiC layer has a double layer structure, in the configuration illustrated in FIG. 20, a surrounding part of the first n-type SiC layer can be made up of only a single layer of the n-type SiC layer 4 as illustrated in FIG. 27, and the thickness of the n-type SiC layer 4 as a single layer can be reduced. The thickness of the first n-type SiC layer of the chip surrounding part is reduced in this manner, thus the main current of the MOSFET hardly flows in the chip surrounding part as described using FIG. 12, and current capacity increases in a case where large current flows as the main current in the MOSFET.

Figure 28:
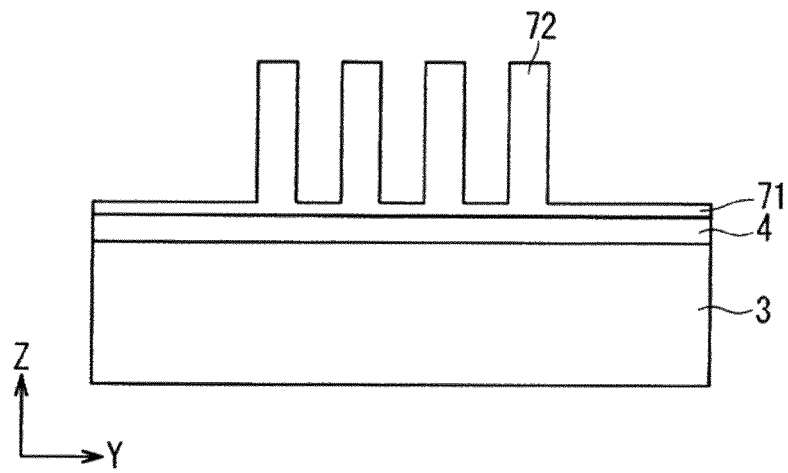
FIG. 28 A cross-sectional view illustrating a modification example 1 of the method of manufacturing the pillar part of the silicon carbide semiconductor device according to the embodiment 2.

It is also possible to partially leave the n-type SiC layer 70 as the second layer in the surrounding part of the first n-type SiC as illustrated in FIG. 28. According to such a configuration, a bottom part of the pillar has contact with the epitaxial layer having the same impurity concentration, thus a design keeping an electrical field balance in a contact portion can be easily achieved, and withstand voltage can be easily maintained.

Modification Example 2 of Method of
Manufacturing Pillar Part

Figure 29:
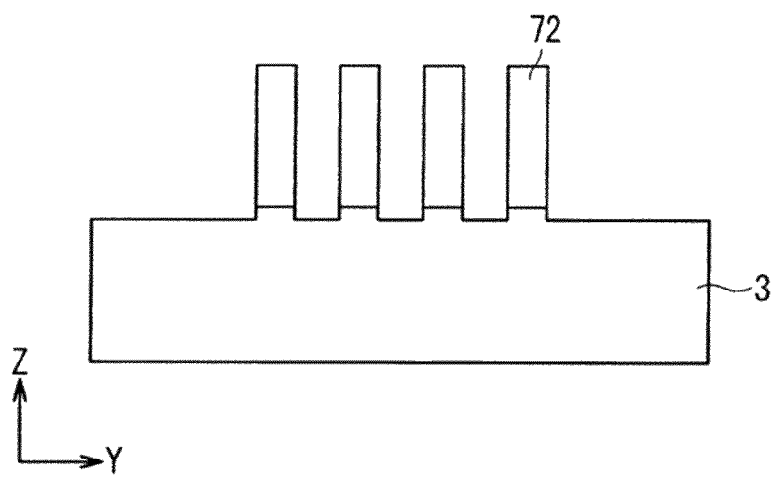
FIG. 29 A cross-sectional view illustrating a modification example 2 of the method of manufacturing the pillar part of the silicon carbide semiconductor device according to the embodiment 2.

When the first n-type SiC layer has the single layer structure as with the configuration illustrated in FIG. 19, the semiconductor substrate 3 is partially removed by over etching at a time of etching the n-type SiC layer 70 by dry etching to be able to form a concave-convex portion in the semiconductor substrate 3 as illustrated in FIG. 29. According to such a configuration, the bottom part of the pillar has contact with the semiconductor substrate 3 having the high impurity concentration, thus resistance can be reduced.

Figure 30:
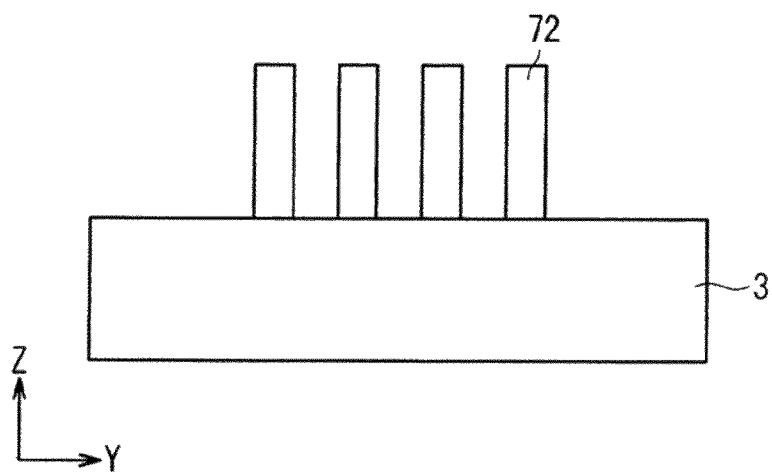
FIG. 30 A cross-sectional view illustrating a modification example 2 of the method of manufacturing the pillar part of the silicon carbide semiconductor device according to the embodiment 2.

As illustrated in FIG. 30, etching is performed to prevent over etching when the n-type SiC layer 70 is etched by dry etching, thus achievable is a configuration that the first n-type SiC, that is to say, the n-type SiC layer 70 does not remain below the convex part 72. According to such a configuration, the bottom part of the pillar has contact with the semiconductor substrate 3 having the high impurity, thus resistance can be reduced, and a design keeping an electrical field balance can be easily achieved compared with the configuration illustrated in FIG. 29.

<Method of Manufacturing Semiconductor Device>

Figure 31:
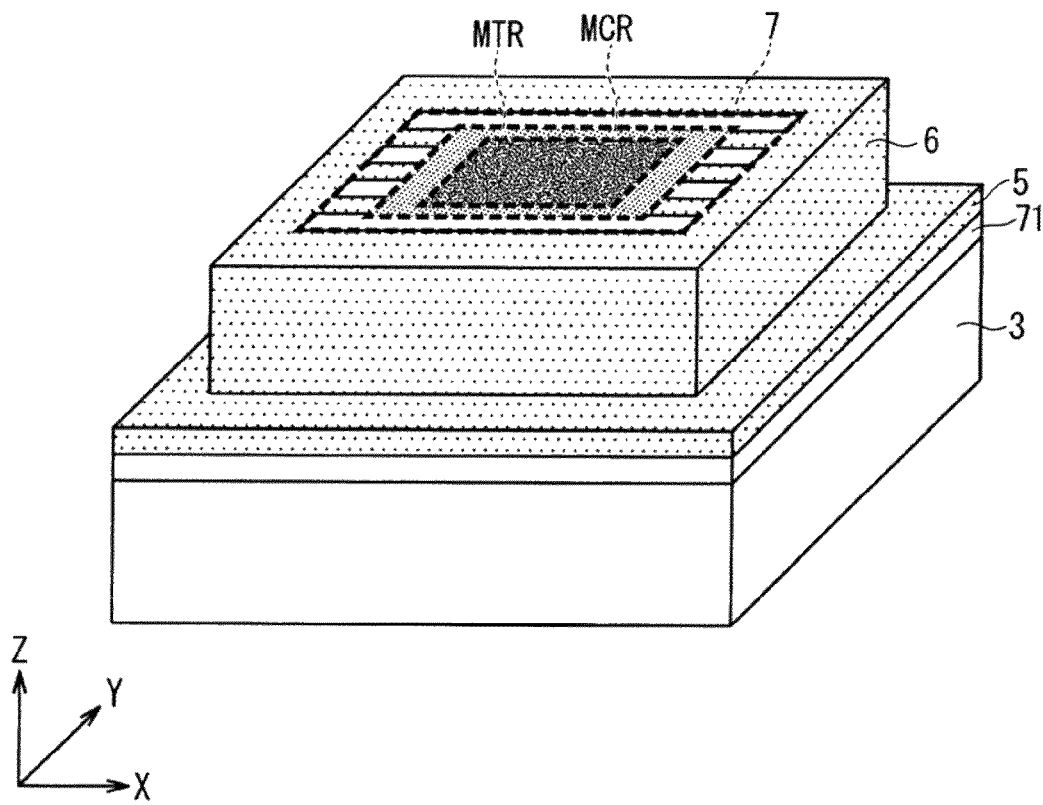
FIG. 31 A perspective view schematically illustrating the silicon carbide semiconductor device according to the embodiment 2.

FIG. 31 is a perspective view of the silicon carbide semiconductor device 200 schematically showing the MOSFET cell region MCR in the case where the MOSFET unit cell is provided in the pillar part 7 and the MOSFET terminal region MTR provided on the outer periphery thereof.

Figure 32:
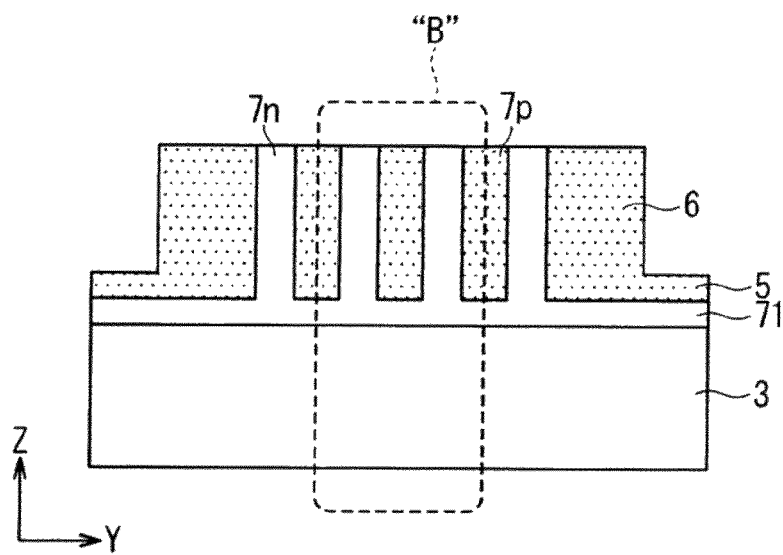
FIG. 32 A cross-sectional view illustrating a process of manufacturing a MOSFET cell in a MOSFET cell region.
Figure 33:
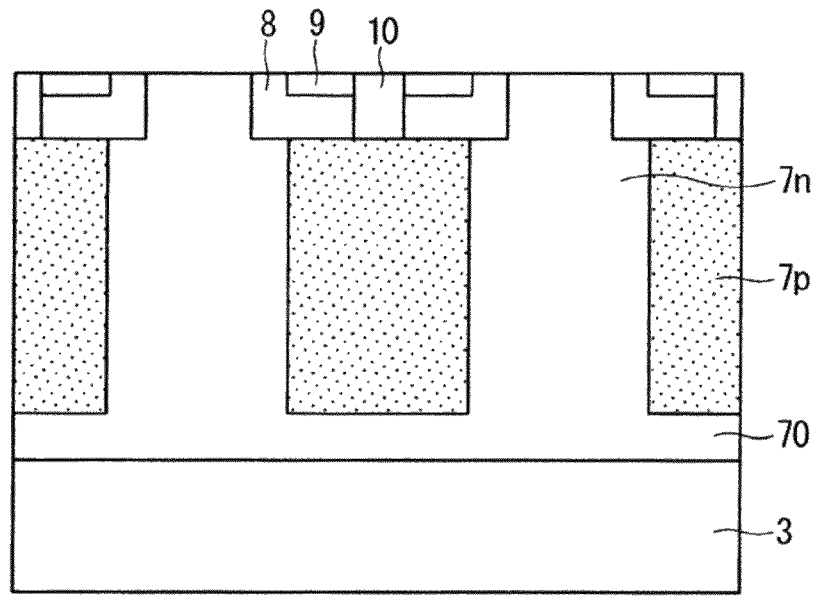
FIG. 33 A cross-sectional view illustrating a process of manufacturing the MOSFET cell in the MOSFET cell region.

A process of manufacturing the MOSFET cell in the MOSFET cell region MCR is described using FIG. 32 to FIG. 35. FIG. 32 is a cross-sectional view corresponding to FIG. 24, and FIG. 33 illustrates an enlarged view of a region B in FIG. 32. In FIG. 33, the same reference numerals are assigned to the same constituent elements as those in the configuration described using FIG. 7, and the repetitive description is omitted.

As illustrated in FIG. 33, the n-type SiC layer 70 is provided on one main surface of the semiconductor substrate 3, and the plurality of p-type pillars 7p and the plurality of n-type pillars 7n are alternately provided on the n-type SiC layer 70. Then, the plurality of p-type well regions 8 are selectively formed by ion implantation of the p-type impurity from the upper layer portion of the p-type pillar 7p to the upper layer portion of the n-type pillar 7n. The p-type contact region 10 is formed in each well region 8 by ion implantation of the p-type impurity to pass through the well region 8. The n-type source region 9 is formed in the upper layer portion of the well region 8 by ion implantation of the n-type impurity to have contact with both side surfaces of the contact region 10. Activation annealing is performed to recover crystal defect formed by the ion implantation to activate the implanted impurity.

The p-type well region 8 can have a thickness of 0.2 to 1.5 μm and a p-type impurity concentration of $1\times10^{14}$ to $1\times10^{19}$ cm$^{-3}$, for example, the source region 9 can have a thickness of 0.1 to 0.5 μm and an n-type impurity concentration of $1\times10^{17}$ to $1\times10^{21}$ cm$^{-3}$, for example, and the contact region 10 can have a thickness of 0.2 to 1.5 μm and a p-type impurity concentration of $1\times10^{18}$ to $1\times10^{21}$ cm$^{-3}$, for example. In the diagrams, the well region 8 and the contact region 10 have the same thickness, however, the thickness thereof is not limited thereto.

Figure 34:
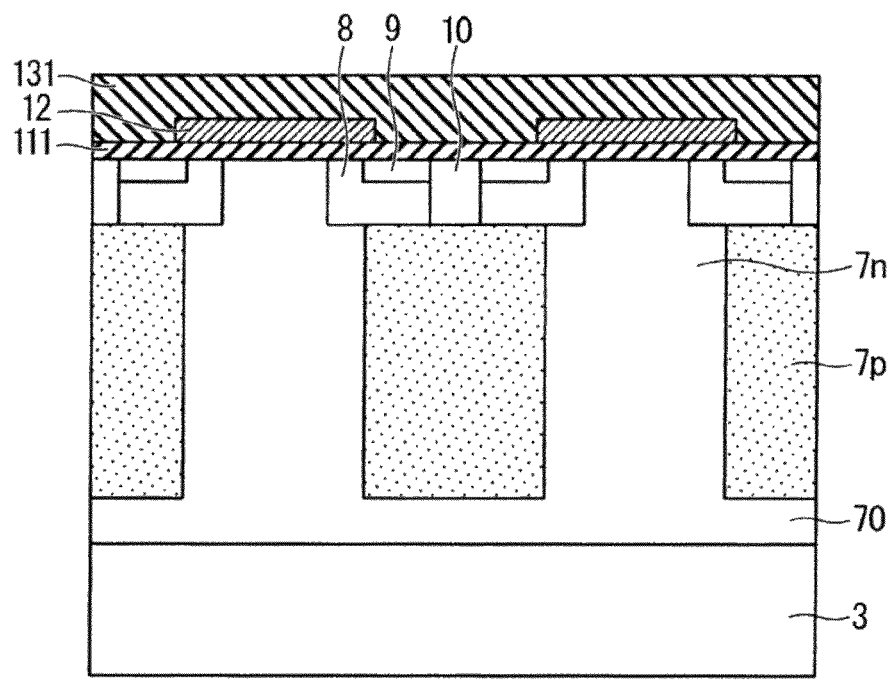
FIG. 34 A cross-sectional view illustrating a process of manufacturing the MOSFET cell in the MOSFET cell region.

Subsequently, in a process illustrated in FIG. 34, an insulating film such as a silicon oxide film 111 as a material of the gate insulating film 11 is formed on the pillar part 7, and a conductor film such as a polysilicon film as a gate electrode 12 is further formed on the silicon oxide film 111. Then, the polysilicon film is patterned to form the gate electrode 12 over an upper side of end edge portions of the source regions 9 adjacent to each other. Subsequently, an insulating film such as a silicon oxide film 131 as a material of the interlayer insulating film 13 is formed to cover the gate electrode 12 and the silicon oxide film 111.

Subsequently, in a process illustrated in FIG. 35, the silicon oxide films 111 and 131 are patterned to form the interlayer insulating film 13 covering the gate insulating film 11 and the gate electrode 12. Formed in this patterning is a contact hole passing through the interlayer insulating film 13 in the thickness direction to reach the part of the source region 9 and the whole surface of the contact region 10. Subsequently, a conductor film is formed to fill the contact hole and cover the interlayer insulating film 13, thereby forming the source electrode 14, and a drain electrode 15 is formed on the other main surface (rear surface) of the semiconductor substrate 3 on a side opposite to a side on which the source electrode 14 is provided, thus the silicon carbide semiconductor device 200 is completed. An example of a method of manufacturing the MOSFET cell region MCR and the MOSFET terminal region MTR is further described hereinafter.

Figure 35:
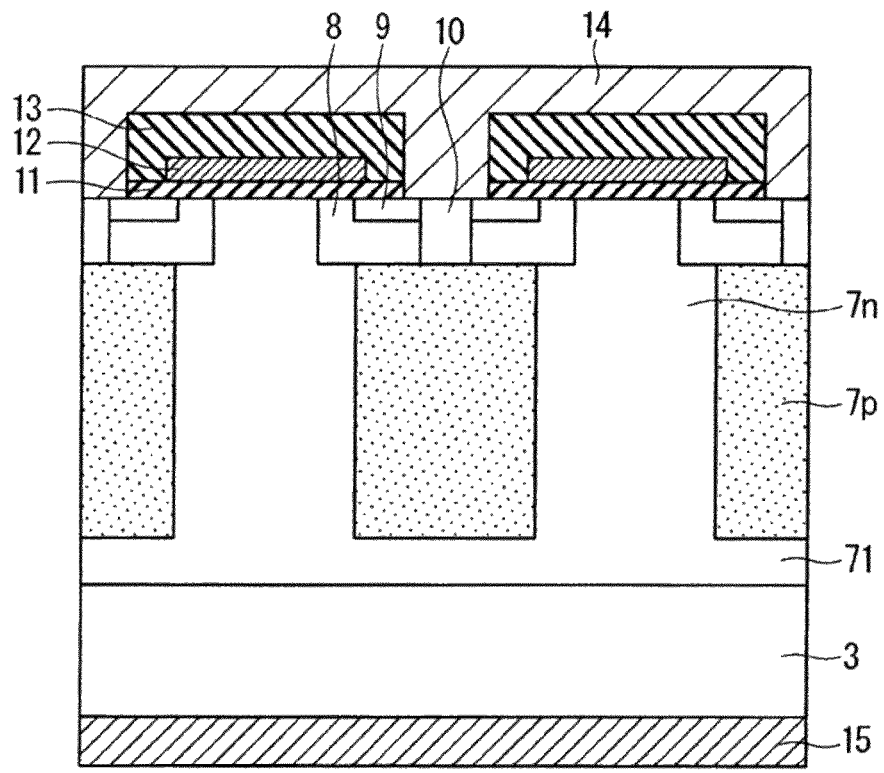
FIG. 35 A cross-sectional view illustrating a process of manufacturing the MOSFET cell in the MOSFET cell region.

The silicon carbide semiconductor device 200 illustrated in FIG. 35 has the configuration that the plurality of p-type well regions 8 are selectively provided from the upper layer portion of the p-type pillar 7p to the upper layer portion of the n-type pillar 7n, and the p-type contact region 10 and the n-type source region 9 are provided in each well region 8. However, also applicable is a configuration that the p-type well region 8, for example, is not provided on the upper layer portions of the n-type pillar 7n and the p-type pillar 7p but the n-type SiC layer 40 (third semiconductor layer) is formed on the n-type pillar 7n and the p-type pillar 7p, thus the p-type well region 8 is provided in the n-type SiC layer 40. A manufacturing process thereof is described hereinafter using FIG. 36 to FIG. 40 as the other example of a method of manufacturing the semiconductor device.

Figure 36:
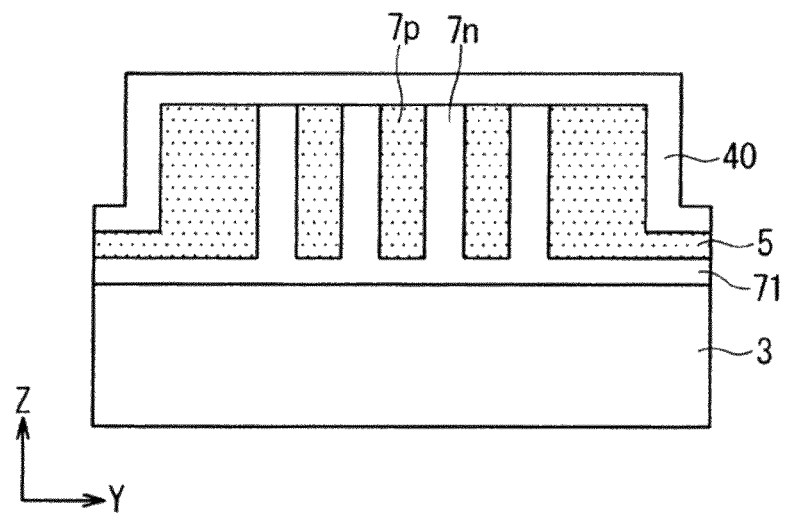
FIG. 36 A cross-sectional view illustrating a process of manufacturing the MOSFET cell in the MOSFET cell region.

After the process described using FIG. 17, the n-type SiC layer 40 is formed by epitaxial growth to cover a region from the pillar part 7 to the p-type chip surrounding part 5 in the process illustrated in FIG. 36. The n-type SiC layer 40 may be formed on the whole surface of the semiconductor chip, only the MOSFET cell region forming the MOSFET cell, or both the MOSFET cell region and the MOSFET terminal region.

Figure 37:
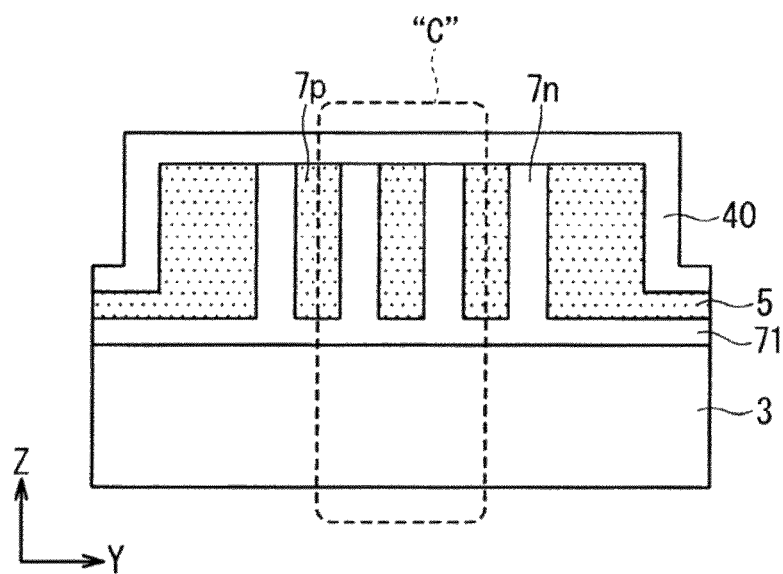
FIG. 37 A cross-sectional view illustrating a process of manufacturing the MOSFET cell in the MOSFET cell region.
Figure 38:
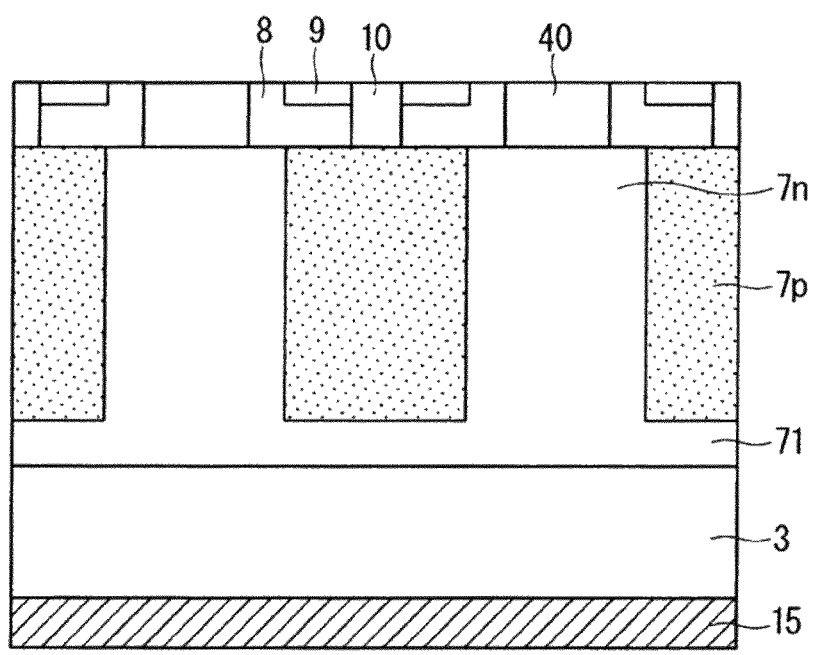
FIG. 38 A cross-sectional view illustrating a process of manufacturing the MOSFET cell in the MOSFET cell region.

FIG. 37 is a diagram illustrating an enlarged region in FIG. 36, and FIG. 38 illustrates an enlarged view of a region C in FIG. 37. In FIG. 38, the same reference numerals are assigned to the same constituent elements as those in the configuration described using FIG. 7, and the repetitive description is omitted.

As illustrated in FIG. 38, the plurality of p-type well regions 8 are selectively formed by ion implantation of the p-type impurity in the n-type SiC layer 40 from the upper side of the p-type pillar 7p to the upper side of the n-type pillar 7n. The p-type contact region 10 is formed in each well region 8 by ion implantation of the p-type impurity to pass through the well region 8. The n-type source region 9 is formed in the upper layer portion of the well region 8 by ion implantation of the n-type impurity to have contact with both side surfaces of the contact region 10. Activation annealing is performed to recover crystal defect formed by the ion implantation to activate the implanted impurity.

Figure 39:
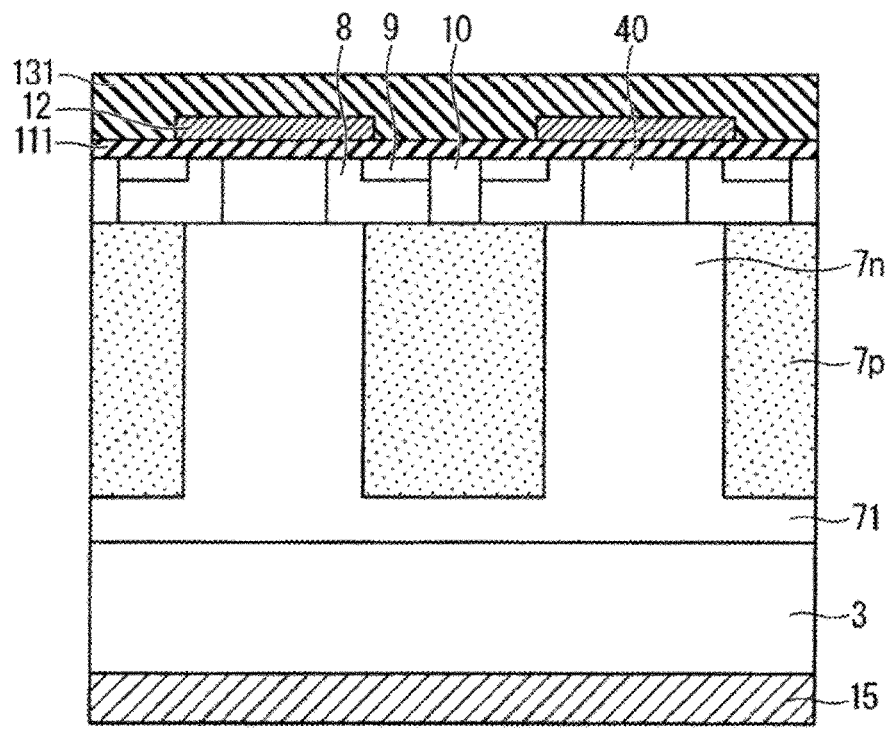
FIG. 39 A cross-sectional view illustrating a process of manufacturing the MOSFET cell in the MOSFET cell region.

Subsequently, in a process illustrated in FIG. 39, an insulating film such as the silicon oxide film 111 as the material of the gate insulating film 11 is formed on the n-type SiC layer 40, and a conductor film such as a polysilicon film as the gate electrode 12 is further formed on the silicon oxide film 111. Then, the polysilicon film is patterned to form the gate electrode 12 over the upper side of the end edge portions of the source regions 9 adjacent to each other. Subsequently, an insulating film such as the silicon oxide film 131 as the material of the interlayer insulating film 13 is formed to cover the gate electrode 12 and the silicon oxide film 111.

Subsequently, in a process illustrated in FIG. 40, the silicon oxide films 111 and 131 are patterned to form the interlayer insulating film 13 covering the gate insulating film 11 and the gate electrode 12. Formed in this patterning is a contact hole passing through the interlayer insulating film 13 in the thickness direction to reach the part of the source region 9 and the whole surface of the contact region 10. Subsequently, a conductor film is formed to fill the contact hole and cover the interlayer insulating film 13, thereby forming the source electrode 14, and the drain electrode 15 is formed on the other main surface (rear surface) of the semiconductor substrate 3 on the side opposite to the side on which the source electrode 14 is provided, thus a silicon carbide semiconductor device 200A is completed.

Figure 40:
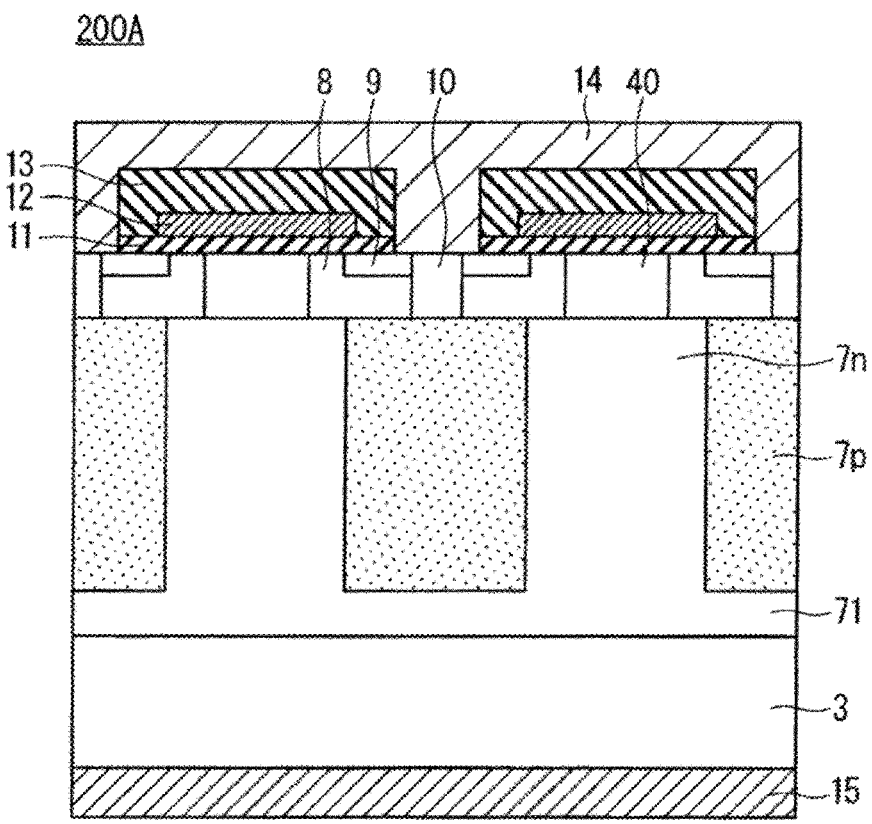
FIG. 40 A cross-sectional view illustrating a configuration of a modification example of the silicon carbide semiconductor device according to the embodiment 2.
Figure 41:
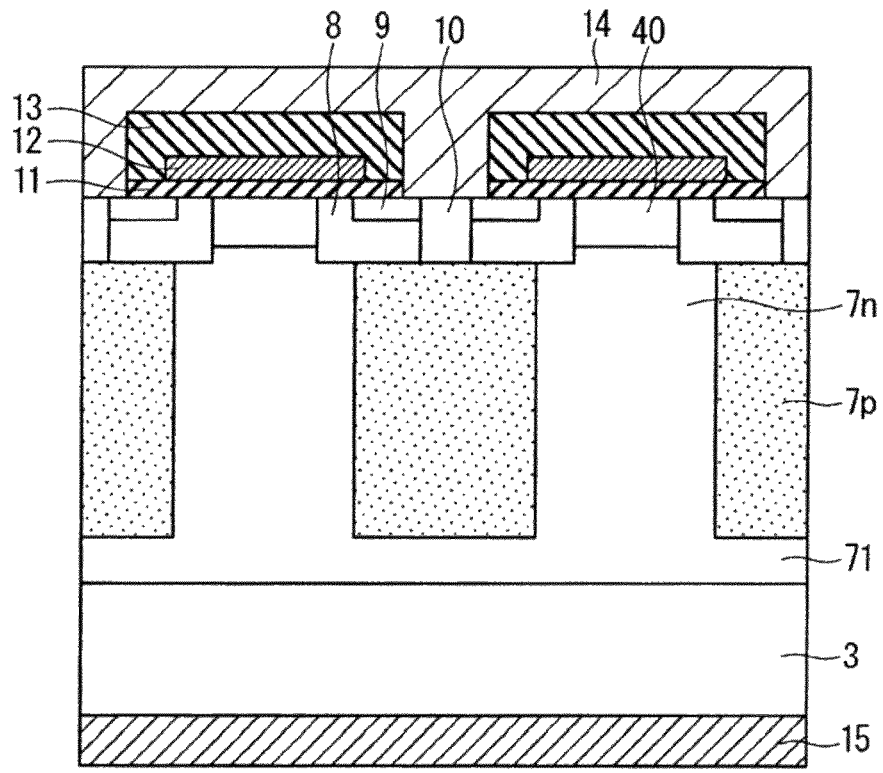
FIG. 41 A cross-sectional view illustrating a configuration of the modification example of the silicon carbide semiconductor device according to the embodiment 2.

In the silicon carbide semiconductor device 200A illustrated in FIG. 40, the thickness of the p-type well region 8 is equivalent to that of the n-type SiC layer 40, however, the p-type well region 8 can be formed to be deeper than the thickness of the n-type SiC layer 40 as illustrated in FIG. 41. According to such a configuration, a corner part of the p-type well region 8 does not have contact with the n-type SiC layer 40 having a high concentration, thus an electrical field strength of the corner part of the p-type well region 8 is reduced at a time of applying high voltage to the MOSFET, and withstand voltage can be maintained. The depth of the p-type well region 8 is deeper than the thickness of the n-type SiC layer 40 by approximately 0.1 to 1 μm.

Also in the silicon carbide semiconductor devices 200 and 200A according to the embodiment 2 described above, the void is not formed when the p-type pillar 7p is formed by epitaxial growth, thus the invalid region can be reduced. Thus, processing for separating the void is unnecessary, and manufacturing cost can be reduced.

FIG. 35 and FIG. 40 illustrate the configuration of providing two MOSFET unit cells, however, the unit cell, the number of which corresponds to a size of the silicon carbide semiconductor device, is actually formed.

Modification Example 1 of Method of Manufacturing Semiconductor Device

Figure 42:
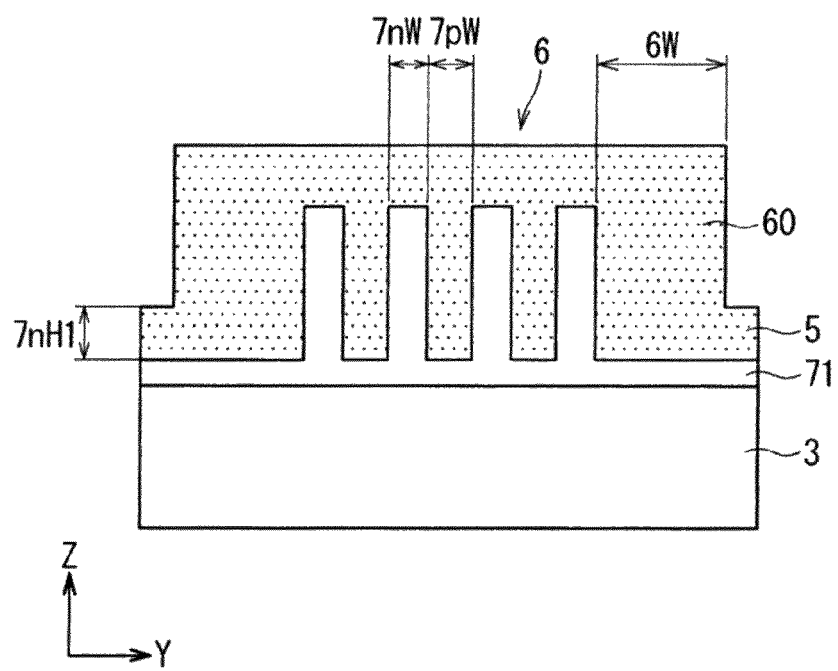
FIG. 42 A cross-sectional view illustrating a modification example 1 of the method of manufacturing the silicon carbide semiconductor device according to the embodiment 2.
Figure 43:
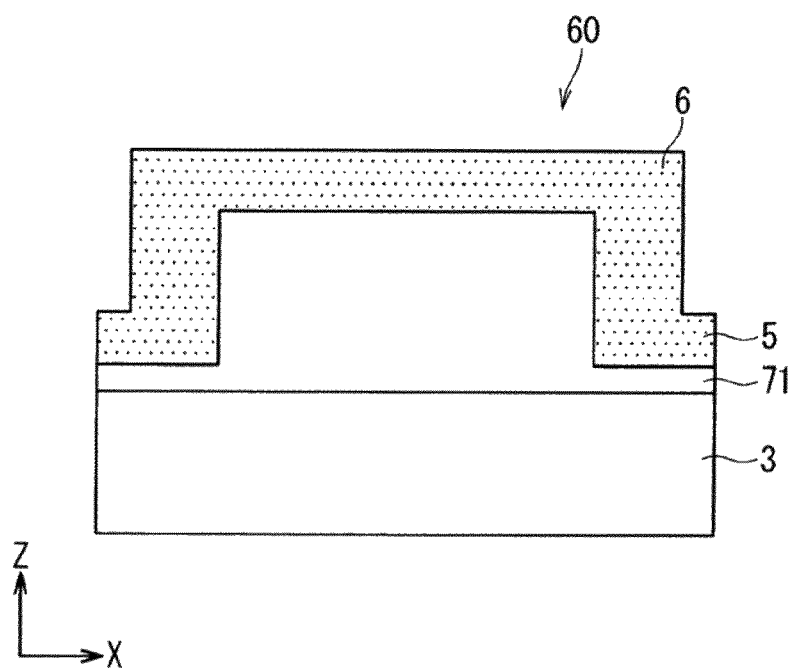
FIG. 43 A cross-sectional view illustrating the modification example 1 of the method of manufacturing the silicon carbide semiconductor device according to the embodiment 2.

A modification example 1 of the method of manufacturing the silicon carbide semiconductor device according to the embodiment 2 is described using FIG. 42 and FIG. 43. FIG. 42 and FIG. 43 are diagrams corresponding to FIG. 22 and FIG. 23, respectively.

As described using FIG. 15 and FIG. 20, after the convex part 72 of the n-type SiC layer 70 and the n-type chip surrounding part 71 of the n-type SiC layer 70 are formed, when the p-type SiC layer 60 is formed to cover the n-type chip surrounding part 71 of the n-type SiC layer 70 and the convex part 72 by the epitaxial growth, the epitaxial growth of the p-type SiC layer 60 is continued after the portion between the convex parts 72 of the n-type SiC layer 70 is filled as illustrated in FIG. 42 and FIG. 43, thus the width 6W of the p-type pillar surrounding part 6 is formed to be significantly larger than the width 7pW of the p-type pillar 7p.

As a result, when the p-type pillar surrounding part 6 and the p-type pillar 7p have the same impurity concentration, the product of the impurity concentration and the width of the p-type pillar surrounding part 6 is significantly larger than that of the p-type pillar 7p. According to such a configuration, the depletion layer does not extend to the whole p-type pillar surrounding part 6, and an electrical field strength of the p-type pillar surrounding part 6 is suppressed to be low, thus increase in leakage current and discharge risk is suppressed.

Modification Example 2 of Method of Manufacturing Semiconductor Device

Figure 44:
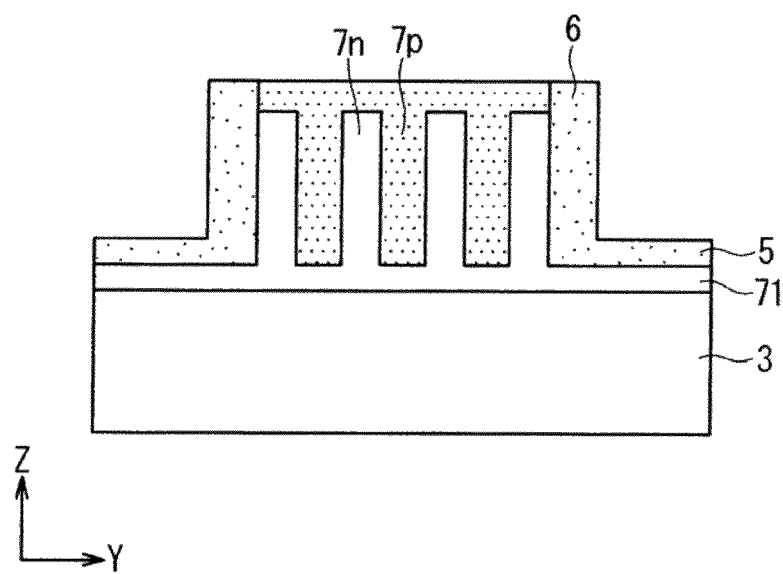
FIG. 44 A cross-sectional view illustrating a modification example 2 of the method of manufacturing the silicon carbide semiconductor device according to the embodiment 2.
Figure 45:
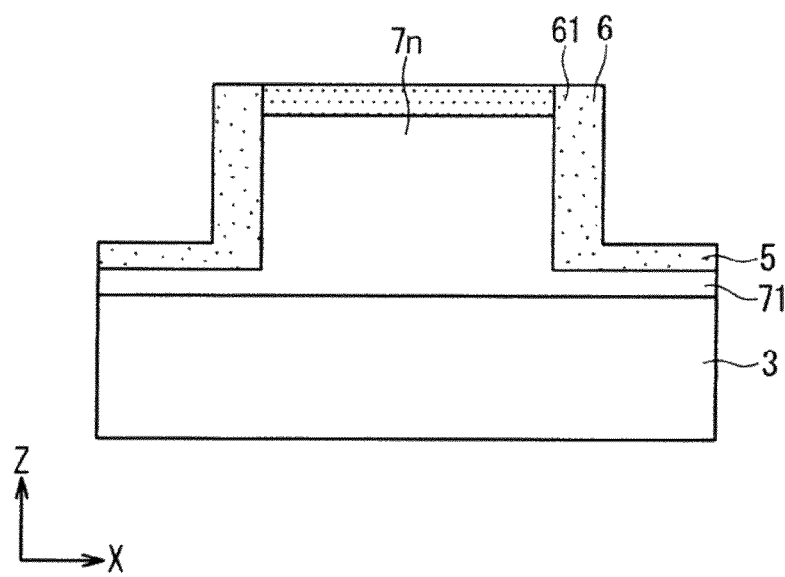
FIG. 45 A cross-sectional view illustrating the modification example 2 of the method of manufacturing the silicon carbide semiconductor device according to the embodiment 2.

A modification example 2 of the method of manufacturing the silicon carbide semiconductor device according to the embodiment 2 is described using FIG. 44 and FIG. 45. FIG. 44 and FIG. 45 are diagrams corresponding to FIG. 22 and FIG. 23, respectively.

As described using FIG. 15 and FIG. 20, after the convex part 72 of the n-type SiC layer 70 and the n-type chip surrounding part 71 of the n-type SiC layer 70 are formed, when the p-type SiC layer 60 is formed to cover the n-type chip surrounding part 71 and the convex part 72 of the n-type SiC layer 70 by the epitaxial growth, the p-type SiC layer 60 is formed so that the p-type pillar surrounding part 6 has the p-type impurity concentration higher than the p-type pillar 7p as illustrated in FIG. 44 and FIG. 45. For this purpose, an epitaxial condition of the p-type SiC layer 60 is adjusted so that the p-type pillar surrounding part 6 takes in the p-type impurity more easily than the portion between the convex parts 72 of the n-type SiC layer 70.

That is to say, a material gas ratio, a temperature, and a pressure are adjusted at the time of epitaxial growth, thus an intake amount of the impurity at a crystal surface is changed. Crystal growth in the p-type pillar surrounding part 6 is almost limited to crystal growth from a bottom surface of a trench, however, crystal growth is performed from a plurality of surfaces, that is a bottom surface and a sidewall of the trench between the convex parts 72, thus the intake amount of the impurity is different from each other. There is also an influence of difference of a degree of easiness of supplying material gas and impurity gas between the p-type pillar surrounding part 6 dug down over a large area and the portion between the convex parts 72 dug down at a small width, thus the epitaxial condition of the p-type SiC layer 60 is adjusted in consideration of these elements.

As a result, even when the width 6W of the p-type pillar surrounding part 6 and the width 7pW of the p-type pillar 7p are the same as each other, the product of the impurity concentration and the width of the p-type pillar surrounding part 6 is larger than that of the p-type pillar 7p. According to such a configuration, the depletion layer does not extend to the whole p-type pillar surrounding part 6, and an electrical field strength of the p-type pillar surrounding part 6 is suppressed to be low, thus increase in leakage current and discharge risk is suppressed.

The p-type SiC layer 60 is formed by combining the configurations of FIG. 42 to FIG. 45, thus the product of the impurity concentration and the width of the p-type pillar surrounding part 6 can be set to be significantly larger than the product of that of the p-type pillar 7p. According to such a configuration, the depletion layer does not extend to the whole p-type pillar surrounding part 6, and an electrical field strength of the p-type pillar surrounding part 6 is suppressed to be low, thus increase in leakage current and discharge risk is suppressed.

Modification Example 3 of Method of Manufacturing Semiconductor Device

Figure 46:
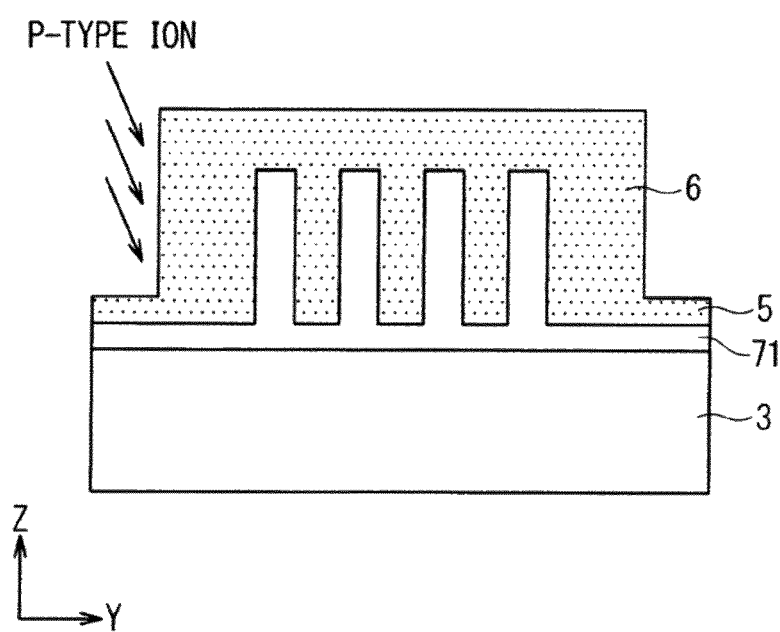
FIG. 46 A cross-sectional view illustrating a modification example 3 of the method of manufacturing the silicon carbide semiconductor device according to the embodiment 2.
Figure 47:
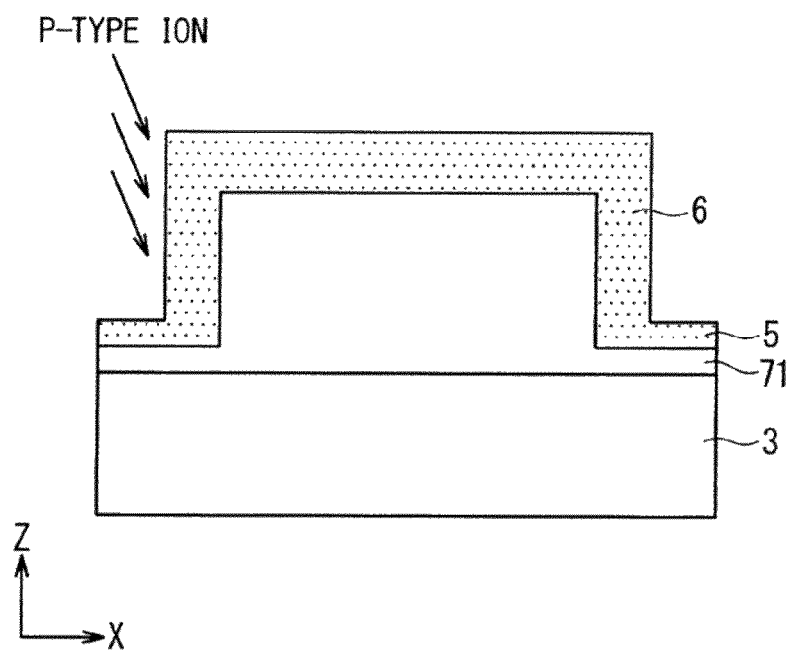
FIG. 47 A cross-sectional view illustrating a modification example 3 of the method of manufacturing the silicon carbide semiconductor device according to the embodiment 2.

A modification example 3 of the method of manufacturing the silicon carbide semiconductor device according to the embodiment 2 is described using FIG. 46 and FIG. 47. FIG. 46 and FIG. 47 are diagrams corresponding to FIG. 22 and FIG. 23, respectively.

As described using FIG. 15 and FIG. 20, after the convex part 72 of the n-type SiC layer 70 and the n-type chip surrounding part 71 of the n-type SiC layer 70 are formed, the p-type SiC layer 60 is formed to cover the n-type chip surrounding part 71 and the convex part 72 of the n-type SiC layer 70 by the epitaxial growth, and then ion implantation of the p-type impurity is performed on the p-type pillar surrounding part 6 as illustrated in FIG. 46 and FIG. 47, thus the concentration of the p-type impurity of the p-type pillar surrounding part 6 is set to be higher than that of than the p-type pillar 7p.

As a result, the product of the impurity concentration and the width of the p-type pillar surrounding part 6 is larger than that of the p-type pillar 7p. According to such a configuration, the depletion layer does not extend to the whole p-type pillar surrounding part 6, and an electrical field strength of the p-type pillar surrounding part 6 is suppressed to be low, thus increase in leakage current and discharge risk is suppressed.

The ion implantation can be performed on only a necessary position in the p-type pillar surrounding part 6. In the case of SiC, an epitaxial growth speed and an epitaxial concentration are different depending on a crystal orientation in some cases. As a result, when the p-type SiC layer 60 is epitaxially grown, the product of the impurity concentration and the width of the p-type pillar surrounding part 6 is not uniform in some cases, thus there is a position where the product of the impurity concentration and the width of the p-type pillar surrounding part 6 is smaller than that of the p-type pillar 7p. In this case, the ion implantation is performed on only a portion where the product of the concentration and the width of the p-type pillar surrounding part 6 is smaller than the product of the impurity concentration and the width of the p-type pillar surrounding part 6, thus the product of the concentration and the width of the p-type pillar surrounding part 6 can be larger than the product of the impurity concentration and the width of the p-type pillar surrounding part 6.

In a case of a semiconductor device having the same structure and size, a position where the product of the impurity concentration and the width of the p-type pillar surrounding part 6 is smaller than the product of the impurity concentration and the width of the p-type pillar 7p always occurs in the same position, thus can be specified by making a sample, and resolving and testing the sample.

Considered as a cause that the product of the impurity concentration and the width of the p-type pillar surrounding part 6 is smaller than that of the p-type pillar 7p is that the width of the p-type pillar surrounding part 6 is small, or an intake amount of the p-type impurity in the crystal surface is small, thus the concentration of the p-type impurity is small depending on the epitaxial condition.

Modification Example 4 of Method of Manufacturing Semiconductor Device

Figure 48:
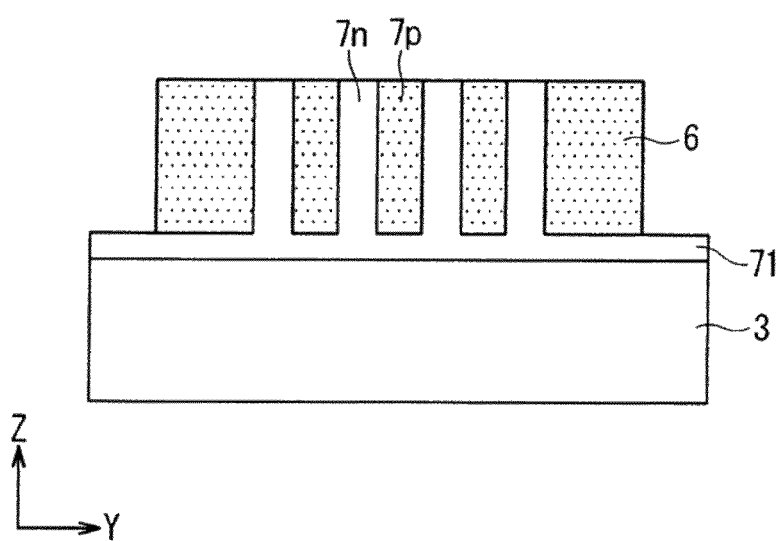
FIG. 48 A cross-sectional view illustrating a modification example 4 of the method of manufacturing the silicon carbide semiconductor device according to the embodiment 2.

A modification example 4 of the method of manufacturing the silicon carbide semiconductor device according to the embodiment 2 is described using FIG. 48. FIG. 48 is a diagram corresponding to FIG. 24.

As described using FIG. 17 and FIG. 24, the p-type chip surrounding part 5 on the outer side of the p-type pillar surrounding part 6 is removed as illustrated in FIG. 48 when the p-type SiC layer 60 on the convex part 72 of the n-type SiC layer 70 is removed by polishing or dry etching to expose the upper surface of the convex part 72.

According to such a configuration, the p-type chip surrounding part 5 can be removed together with the p-type SiC layer 60 on the convex part 72 of the p-type SiC layer 60 by whole surface etching, thus the manufacturing process can be simplified. At this time, the n-type chip surrounding part 71 of the n-type SiC layer 70 can also be partially removed.

Modification Example 5 of Method of Manufacturing Semiconductor Device

Figure 49:
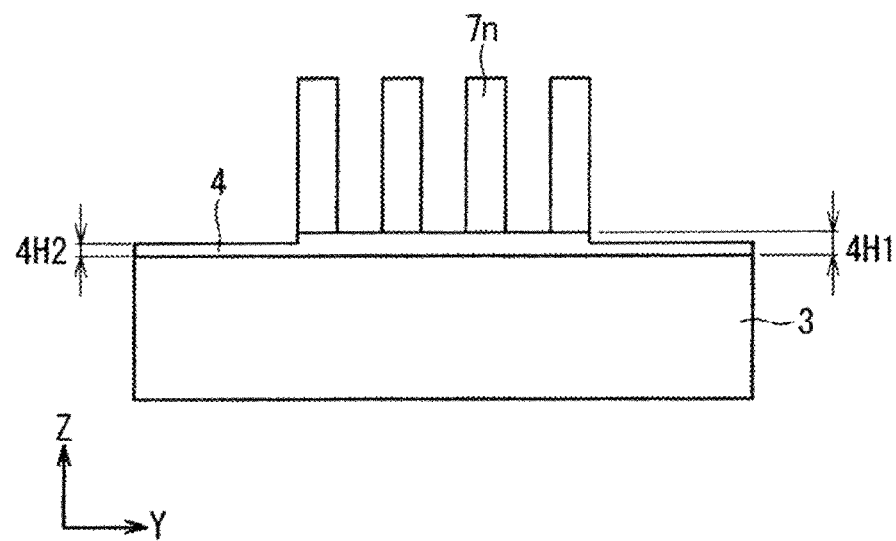
FIG. 49 A cross-sectional view illustrating a modification example 5 of the method of manufacturing the silicon carbide semiconductor device according to the embodiment 2.
Figure 50:
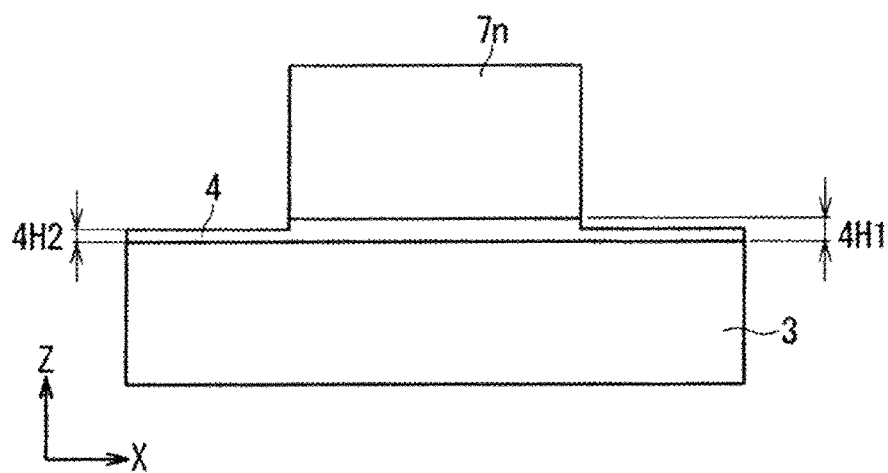
FIG. 50 A cross-sectional view illustrating a modification example 5 of the method of manufacturing the silicon carbide semiconductor device according to the embodiment 2.

A modification example 5 of the method of manufacturing the silicon carbide semiconductor device according to the embodiment 2 is described using FIG. 49 and FIG. 50. FIG. 49 and FIG. 50 are diagrams corresponding to FIG. 20 and FIG. 21, respectively.

As described using FIG. 27, when the surrounding part of the first n-type SiC layer has a single layer of the n-type SiC layer 4, the thickness of the n-type SiC layer 4 as the single layer can also be reduced. As a result, the pillar surrounding part height 4H2 of the n-type SiC layer 4 is smaller than the height 4H1 of the n-type SiC layer 4 in the pillar part 7. The thickness of the first n-type SiC layer of the chip surrounding part is reduced in this manner, thus the main current of the MOSFET hardly flows in the chip surrounding part as described using FIG. 12, and current capacity increases in a case where large current flows as the main current in the MOSFET.

<Dicing Process>

Figure 51:
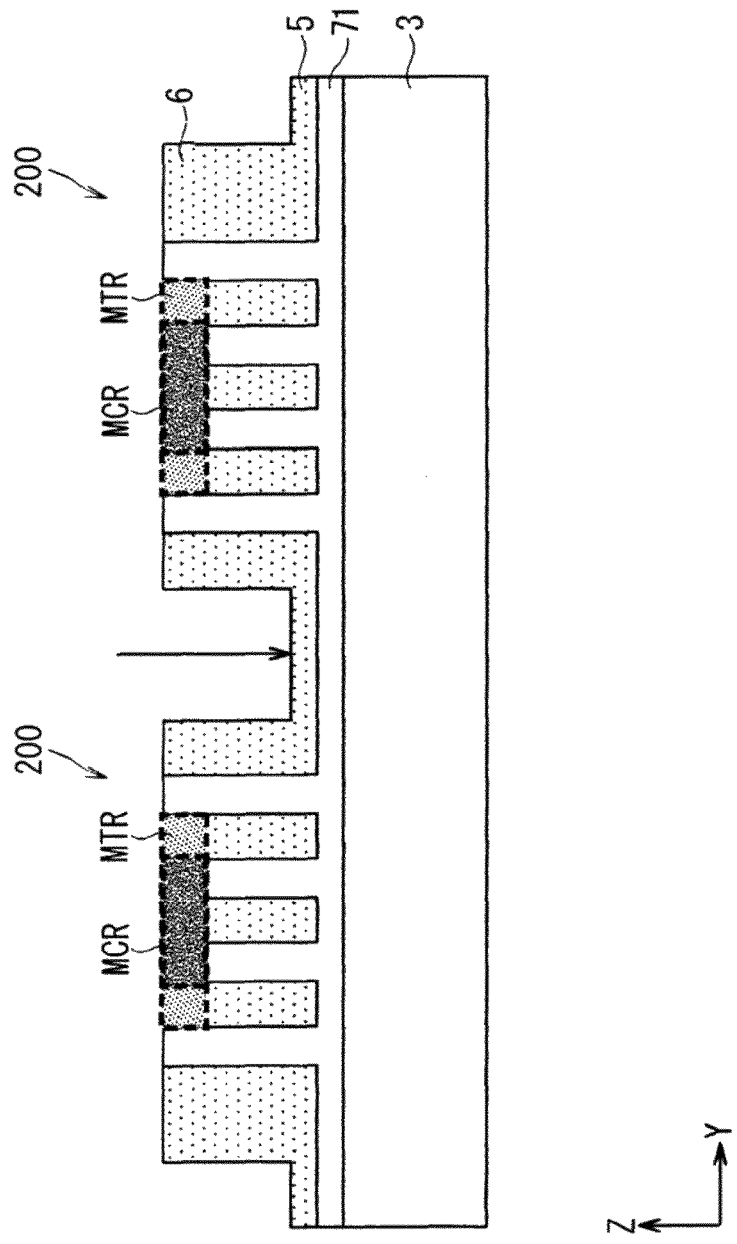
FIG. 51 A cross-sectional view for describing a dicing process of adjacent two silicon carbide semiconductor devices.
Figure 52:
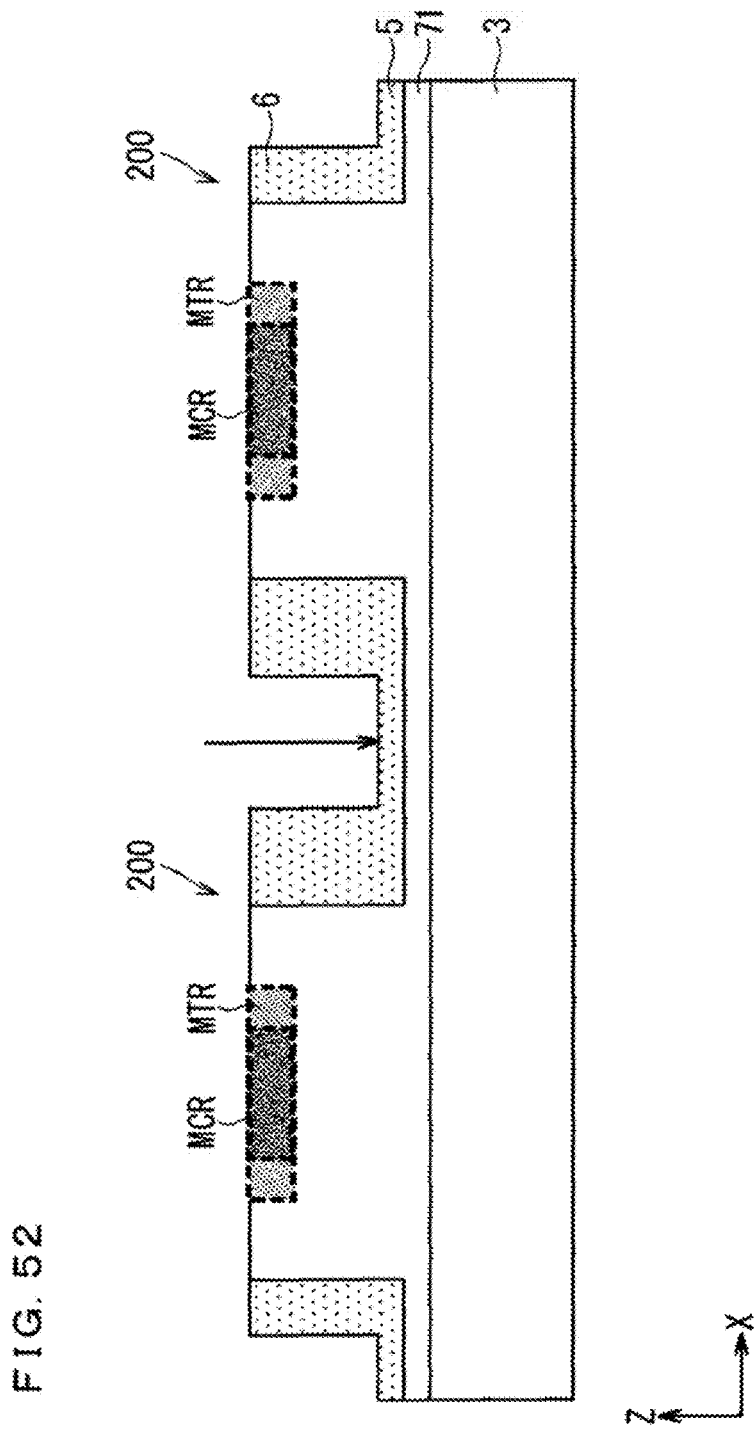
FIG. 52 A cross-sectional view for describing the dicing process of the adjacent two silicon carbide semiconductor devices.

Described using FIG. 51 and FIG. 52 is a dicing process of separating the semiconductor device manufactured through the wafer process into chips. FIG. 51 and FIG. 52 correspond to cross-sectional views illustrating the silicon carbide semiconductor devices 200 adjacent to each other in a form of wafer, FIG. 51 is a cross-sectional view along an A-A line in an arrow direction in FIG. 18, and FIG. 52 corresponds to a cross-sectional view along a B-B line in an arrow direction in FIG. 18. The silicon carbide semiconductor device 200 is in the state illustrated in FIG. 35, however, the source electrode 14 and the drain electrode 15, for example, are omitted.

In FIG. 51 and FIG. 52, dicing is performed at a position indicated by an arrow between two silicon carbide semiconductor devices 200 to separate the silicon carbide semiconductor device 200 into chips. In order to perform such a dicing, an interval of the convex parts 72 of the n-type SiC layer 70 is set to be at least ten times as large as a pillar width of 0.5 to 5 μm of the n-type pillar 7n and the p-type pillar 7p, that is 50 μm or more, for example, in the silicon carbide semiconductor device adjacent to each other.

Figure 53:
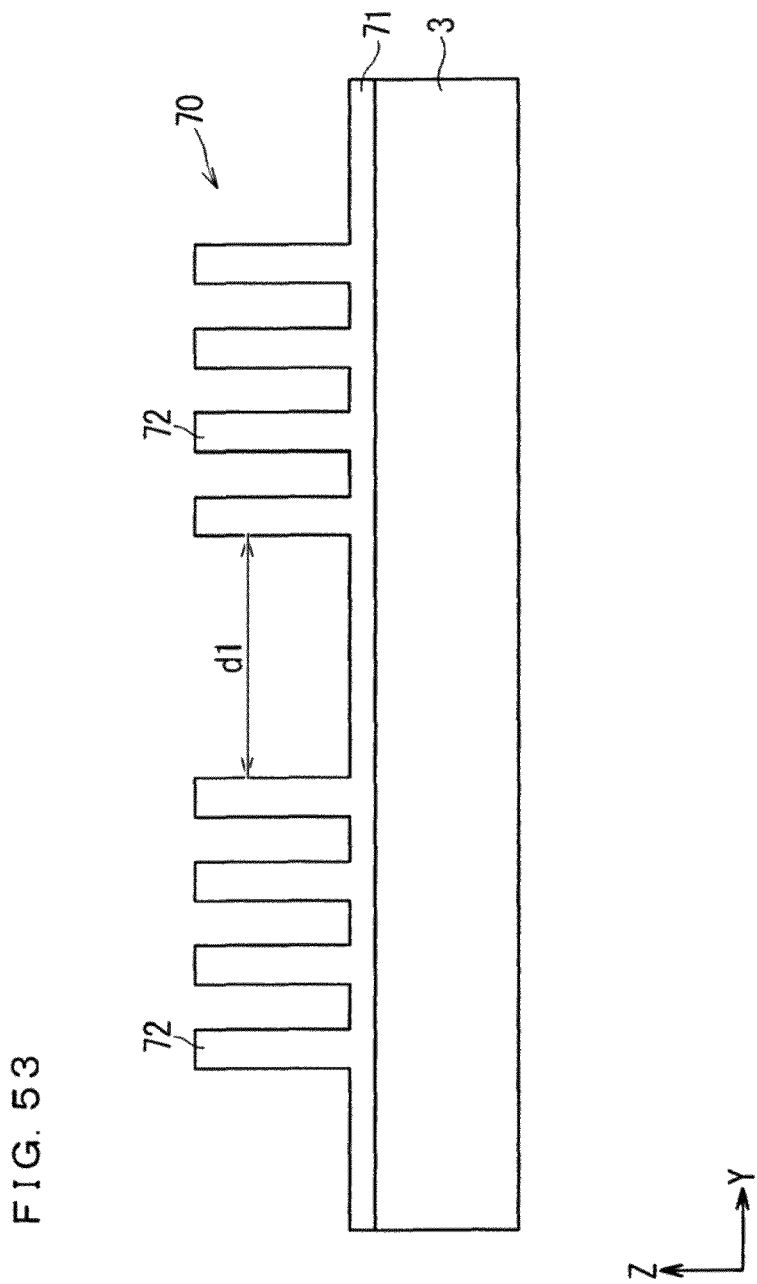
FIG. 53 A cross-sectional view illustrating a method of manufacturing the adjacent two silicon carbide semiconductor devices.
Figure 54:
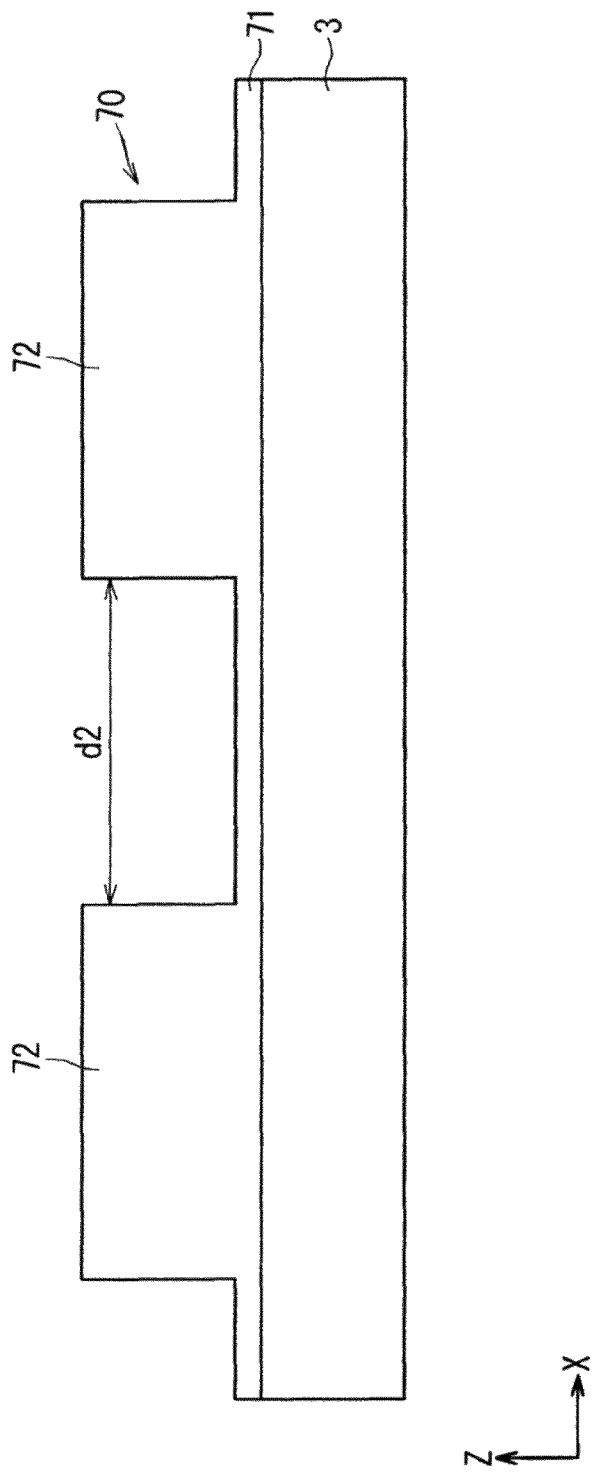
FIG. 54 A cross-sectional view illustrating a method of manufacturing the adjacent two silicon carbide semiconductor devices.

FIG. 53 and FIG. 54 illustrate the convex part 72 of the n-type SiC layer 70 in the process illustrated in FIG. 20, and FIG. 53 and FIG. 54 correspond to FIG. 51 and FIG. 52, respectively. The interval between the convex parts 72 in the silicon carbide semiconductor devices adjacent to each other is d1 in FIG. 53, and the interval between the convex parts 72 in the silicon carbide semiconductor device adjacent to each other is d2 in FIG. 54.

The interval between the convex parts 72 of the n-type SiC layer 70 in the silicon carbide semiconductor device adjacent to each other is widened, thus the dicing can be performed, and formation of the void at a time of forming the p-type SiC layer 60 by epitaxial growth can be suppressed. Particularly, an interval d2 of the convex parts 72 in a direction illustrated in FIG. 54 is larger than an interval d1 of the convex parts 72 in a direction illustrated in FIG. 53, thus the formation of the void can be suppressed more effectively.

Embodiment 3

<Method of Manufacturing Pillar Part

Described next is a method of manufacturing a pillar part of a silicon carbide semiconductor device 300 as an embodiment 3. As described using FIG. 13 in the embodiment 2, prepared is the semiconductor substrate 3 as a commercially available 4H-SiC n-type substrate, for example. The semiconductor substrate 3 has an off angle of four degrees in [11-20] direction, and has a thickness of 300 to 400 μm, and a concentration of an n-type impurity is $5 \times 10^{18}$ to $1 \times 10^{20}$ $cm^{-3}$.

Figure 55:
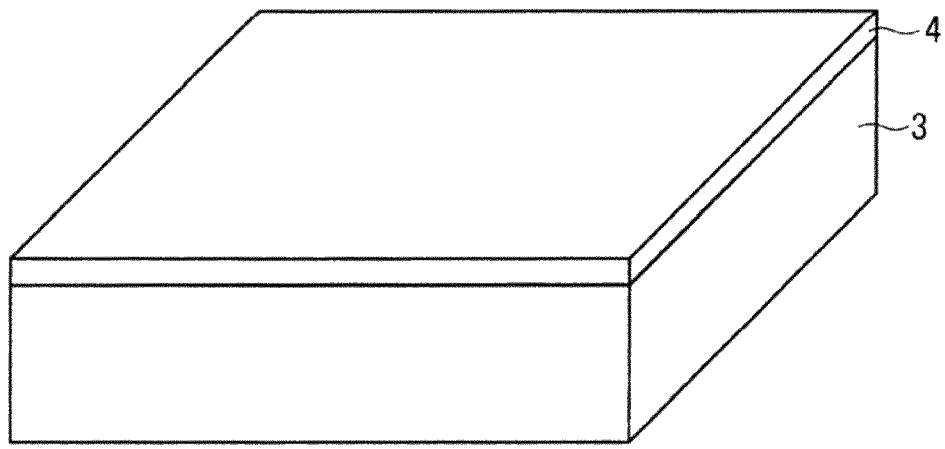
FIG. 55 A perspective view schematically illustrating a method of manufacturing a pillar part of a silicon carbide semiconductor device according to an embodiment 3.

Next, in a process illustrate in FIG. 55, the n-type SiC layer 4 (semiconductor layer) including an n-type impurity is formed by epitaxial growth on one main surface of the semiconductor substrate 3. The n-type SiC layer 4 may have a thickness of 0.5 to 10 μm, and have an n-type impurity concentration of $1 \times 10^{14}$ to $1 \times 10^{19}$ $cm^{-3}$, for example. The formation of the n-type SiC layer 4 can be omitted.

Figure 56:
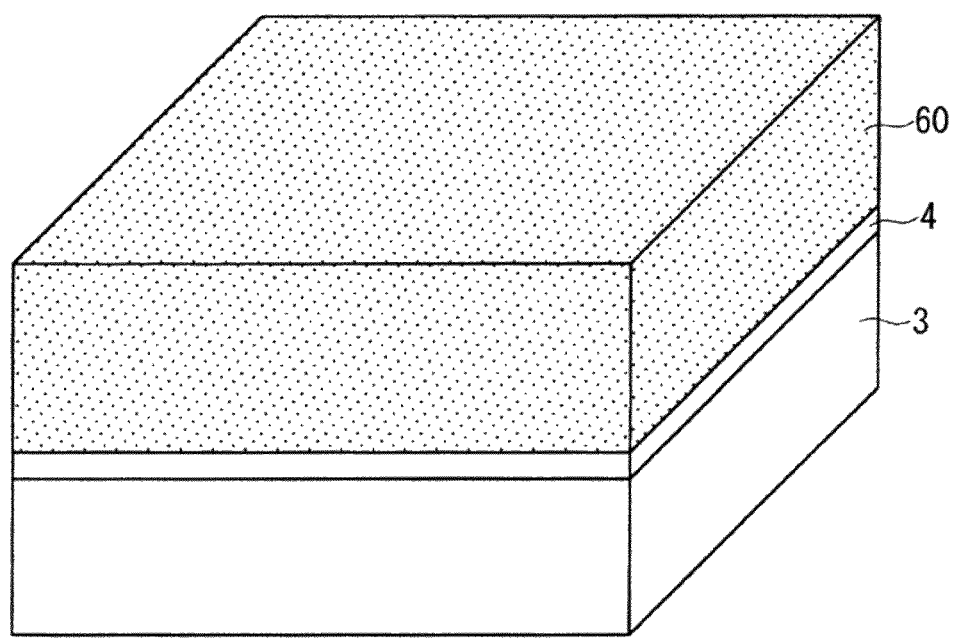
FIG. 56 A perspective view schematically illustrating the method of manufacturing the pillar part of the silicon carbide semiconductor device according to the embodiment 3.

Next, in a process illustrated in FIG. 56, the p-type SiC layer 60 (first semiconductor layer) including a p-type impurity is formed by epitaxial growth on the n-type SiC later 4.

Figure 57:
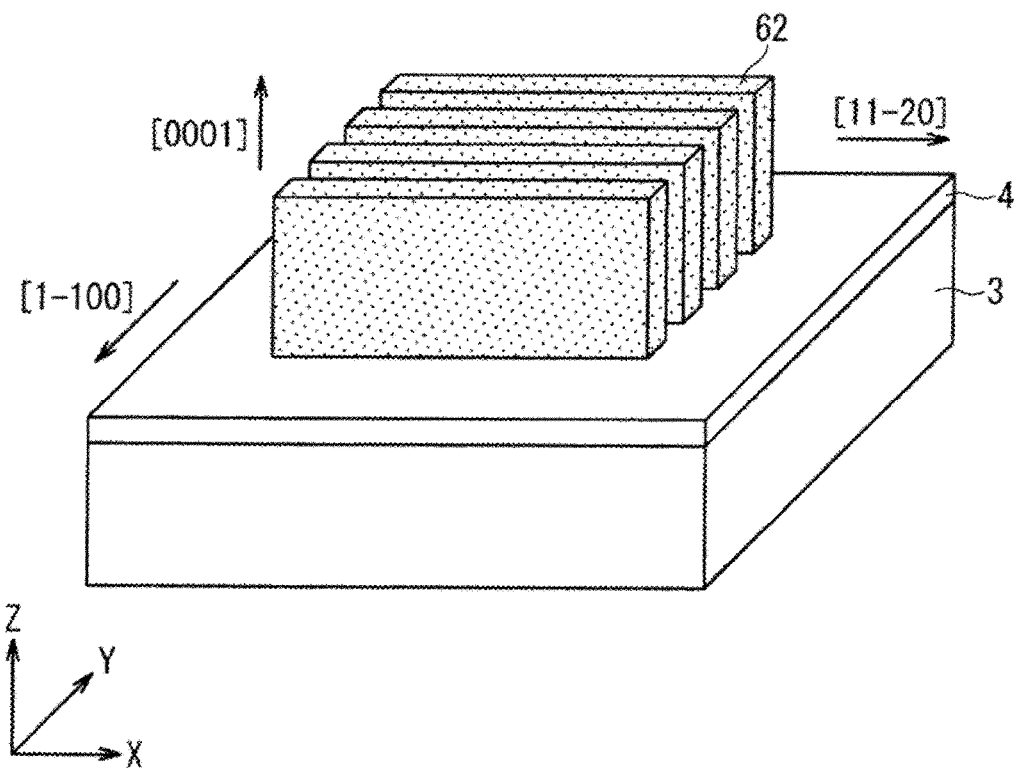
FIG. 57 A perspective view schematically illustrating the method of manufacturing the pillar part of the silicon carbide semiconductor device according to the embodiment 3.

Next, in a process illustrated in FIG. 57, the p-type SiC layer 60 is etched by dry etching to form a convex part 62 of the p-type SiC layer 60, and the p-type SiC layer 60 around the convex part 62 is removed to expose the surface of the surrounding part of the n-type SiC layer 4. At this time, the n-type SiC layer 4 can be partially removed to form a concave-convex portion on the surface of the n-type SiC layer 4.

When the semiconductor substrate 3 has the off angle of four degrees in the [11-20] direction, the convex part 62 has the striped shape extending in a direction in parallel to the X axis ([11-20] direction) in a plan view, and the plurality of convex parts 62 are arranged at intervals along the direction along the Y axis ([1-100] direction). The p-type SiC layer 60 has a symmetrical shape in a direction perpendicular to the [11-20] direction, thus the shape of the n-type SiC layer can be easily controlled in forming the n-type SiC layer between the convex parts 62 by the epitaxial growth. The convex part 62 is formed so that a width in the Y axis direction is within a range of 0.5 to 5 μm, and a height in the Z axis direction ([0001] direction) is within a range of 5 to 100 μm, for example.

In the meanwhile, when a substrate with no off angle is used for the semiconductor substrate 3, the convex part 62 having the striped shape can be formed in an orientation rotated at 90 degrees around an [0001] axis from the [11-20] direction. That is to say, even when the convex part 62 is formed in the orientation in which the [11-20] axis and the [1-100] axis in FIG. 57 are replaced with each other, the n-type SiC layer formed between the convex parts 62 by the epitaxial growth has a symmetrical shape, thus the shape of the n-type SiC layer can be easily controlled.

Figure 58:
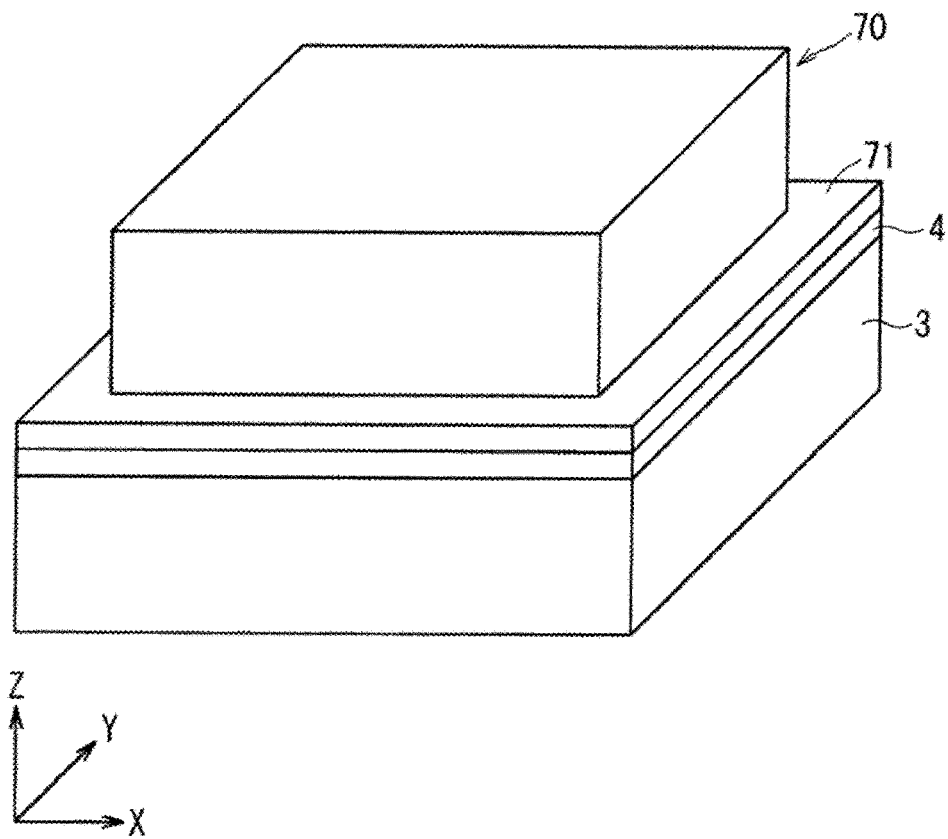
FIG. 58 A perspective view schematically illustrating the method of manufacturing the pillar part of the silicon carbide semiconductor device according to the embodiment 3.

Next, in a process illustrated in FIG. 58, the n-type SiC layer 70 (second semiconductor layer) is formed to cover the convex part 62 of the p-type SiC layer 60 and the surrounding part of the n-type SiC layer 4 around the convex part 62 by the epitaxial growth. In FIG. 57, the surface of the n-type SiC layer 70 around the convex part 62 of the p-type SiC layer 60 is flat, but may have a concave-convex portion.

As illustrated in FIG. 57, the n-type SiC layer 70 is epitaxially grown in the state where the surrounding part of the convex part 62 of the p-type SiC layer 60 is dug down to expose the surface of the n-type SiC layer 4, thus a void due to a difference of a crystal growth speed caused by a difference of a crystal plane orientation is not formed, and an invalid region can be reduced. Thus, processing for separating the void is unnecessary, and manufacturing cost can be reduced.

A concentration of the n-type impurity of the n-type SiC layer 70 can be set so that a product of the impurity concentration and width of the p-type pillar 7p substantially coincides with a product of the impurity concentration and width of the n-type pillar 7n.

Figure 59:
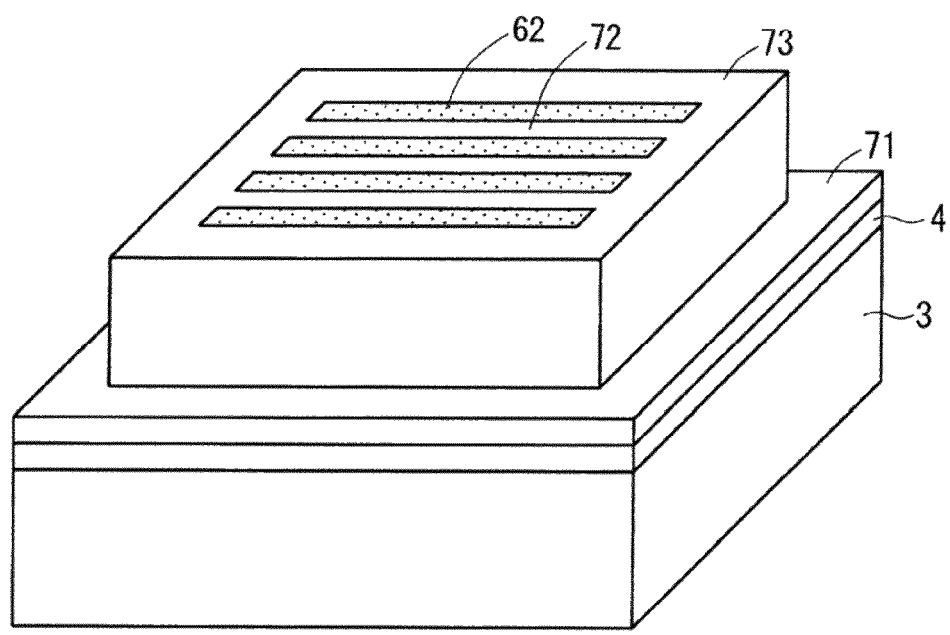
FIG. 59 A perspective view schematically illustrating the method of manufacturing the pillar part of the silicon carbide semiconductor device according to the embodiment 3.

Next, in a process illustrated in FIG. 59, the n-type SiC layer 70 on the convex part 62 of the p-type SiC layer 60 is removed by polishing or dry etching to expose the upper surface of the convex part 62. At this time, the upper portion of the convex part 62 of the p-type SiC layer 60 can be partially removed. An upper portion of the n-type chip surrounding part 71 on the n-type SiC layer 70 can be partially removed.

Figure 60:
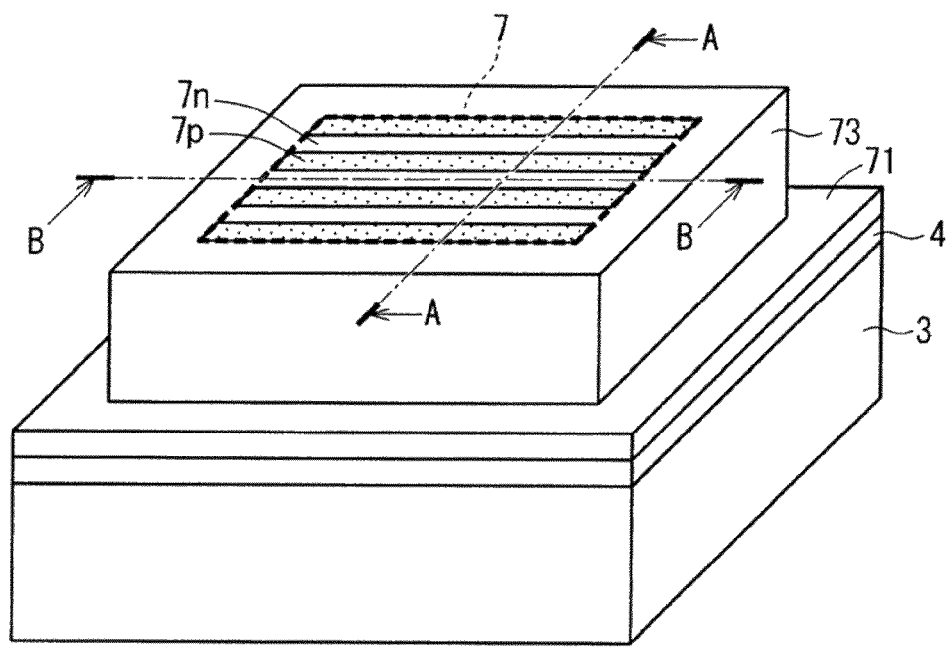
FIG. 60 A perspective view schematically illustrating a configuration of the pillar part of the silicon carbide semiconductor device according to the embodiment 3.
Figure 60:
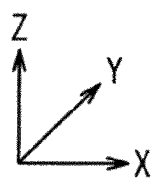

FIG. 60 illustrates a perspective view of the silicon carbide semiconductor device 300 formed by the above method in the state before the MOSFET cell region MCR and the MOSFET terminal region MTR are formed. As illustrated in FIG. 60, the pillar part 7 is a region in which the plurality of n-type pillars 7n and the plurality of p-type pillars 7p having a striped shape in a plan view are alternately arranged on the semiconductor substrate 3, and an arrangement direction thereof is a direction perpendicular to a direction in which main current of the silicon carbide semiconductor device 300 flows. An n-type pillar surrounding part 73 including an n-type impurity is provided to surround the pillar part 7, and an outer side of the n-type pillar surrounding part 73 constitutes an n-type chip surrounding part 71 including an n-type impurity.

FIG. 55 to FIG. 60 illustrate the configuration that three p-type pillars 7p and four n-type pillars 7n are provided in the pillar part 7, however, the p-type pillars 7p and the n-type pillars 7n, the number of which corresponds to a size of the silicon carbide semiconductor device, are actually formed.

Figure 61:
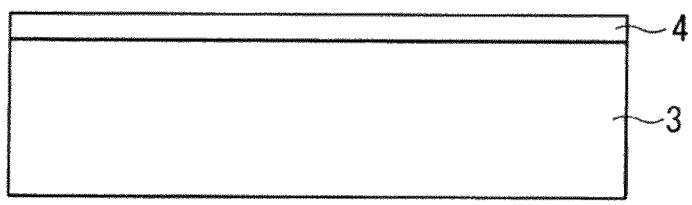
FIG. 61 A cross-sectional view illustrating the method of manufacturing the pillar part of the silicon carbide semiconductor device according to the embodiment 3.
Figure 61:
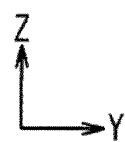
Figure 62:
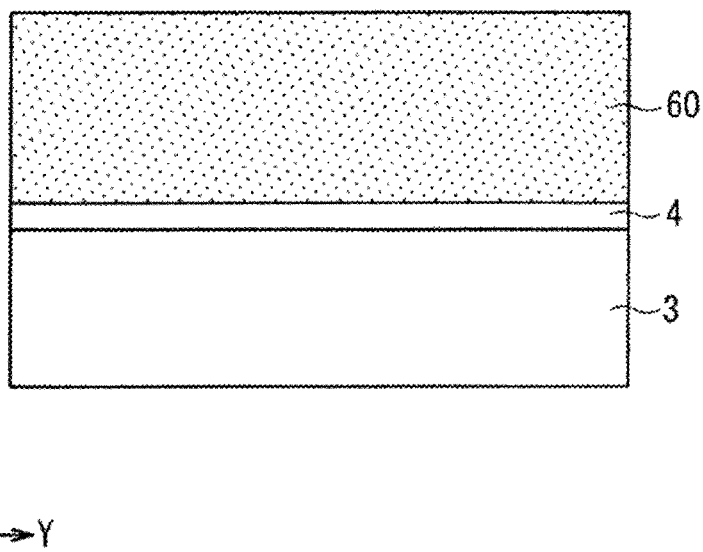
FIG. 62 A cross-sectional view illustrating the method of manufacturing the pillar part of the silicon carbide semiconductor device according to the embodiment 3.
Figure 63:
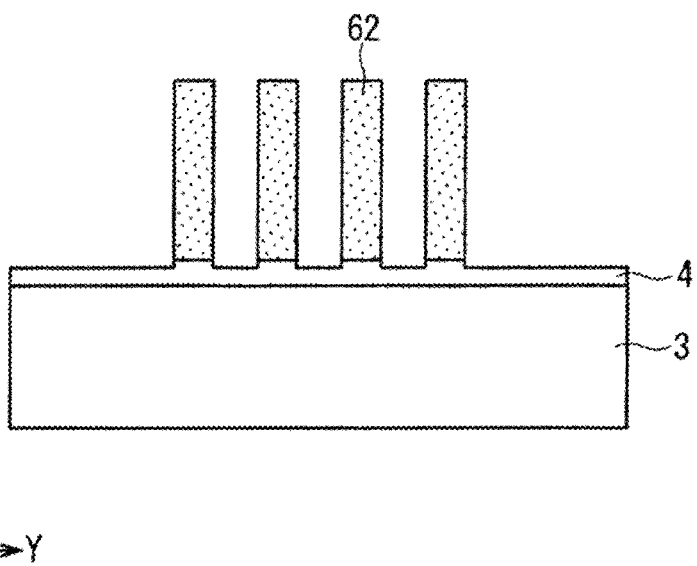
FIG. 63 A cross-sectional view illustrating the method of manufacturing the pillar part of the silicon carbide semiconductor device according to the embodiment 3.
Figure 64:
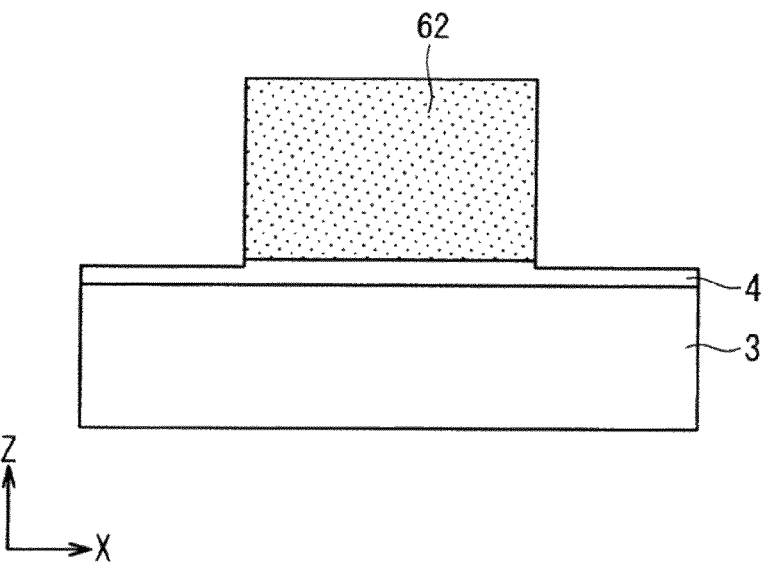
FIG. 64 A cross-sectional view illustrating the method of manufacturing the pillar part of the silicon carbide semiconductor device according to the embodiment 3.
Figure 65:
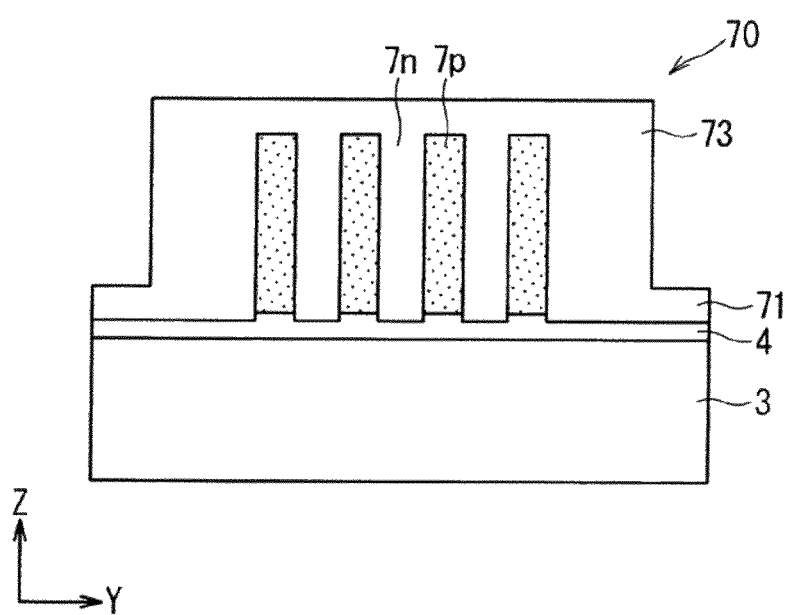
FIG. 65 A cross-sectional view illustrating the method of manufacturing the pillar part of the silicon carbide semiconductor device according to the embodiment 3.
Figure 66:
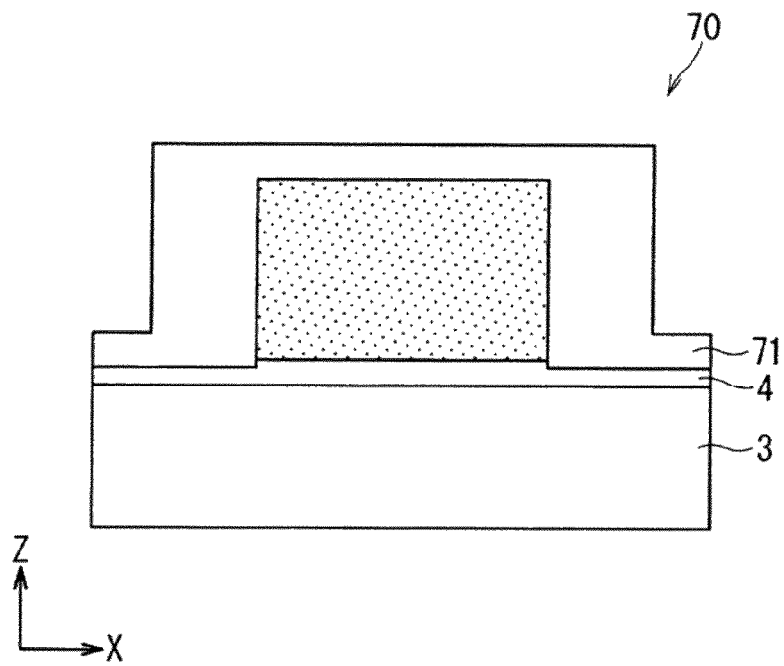
FIG. 66 A cross-sectional view illustrating the method of manufacturing the pillar part of the silicon carbide semiconductor device according to the embodiment 3.
Figure 67:
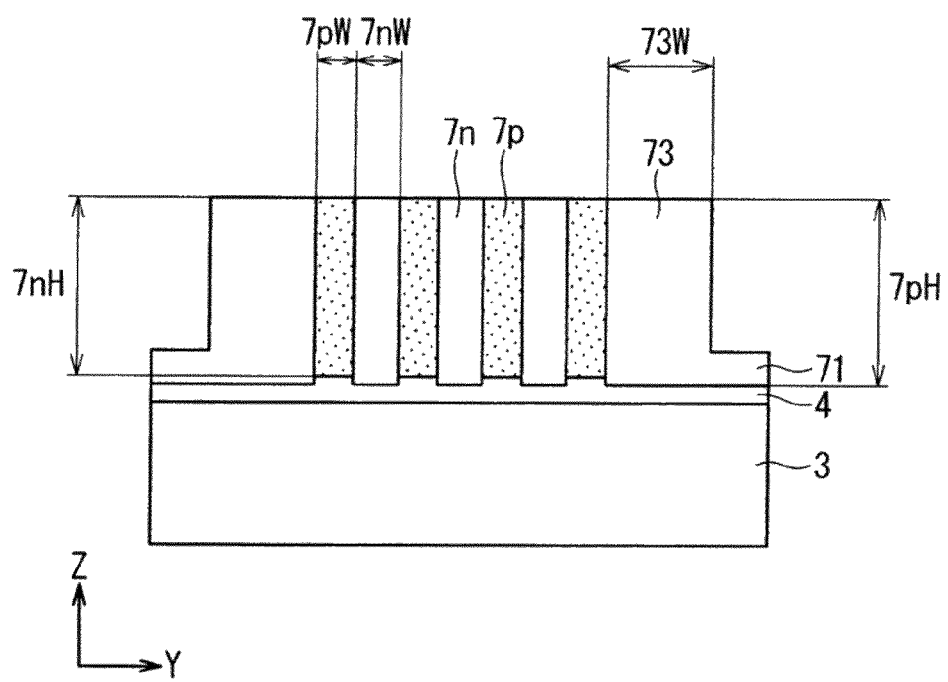
FIG. 67 A cross-sectional view illustrating the method of manufacturing the pillar part of the silicon carbide semiconductor device according to the embodiment 3.
Figure 68:
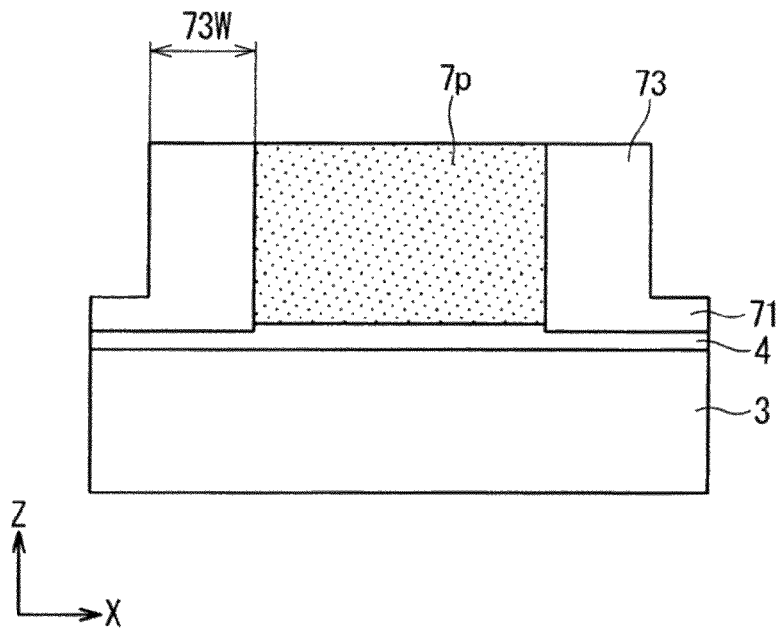
FIG. 68 A cross-sectional view illustrating the method of manufacturing the pillar part of the silicon carbide semiconductor device according to the embodiment 3.

FIG. 61 to FIG. 66 illustrate cross-sectional views along an A-A line (line in parallel to the Y axis) in the arrow direction and cross-sectional views along a B-B line (line in parallel to the X axis) in the arrow direction in FIG. 60. FIG. 61 is a cross-sectional view along the A-A line in the process illustrated in FIG. 55. The cross-sectional view along the B-B line is the same as that in FIG. 55. FIG. 62 is a cross-sectional view along the A-A line in the process illustrated in FIG. 56. The cross-sectional view along the B-B line is the same as that in FIG. 56. FIG. 63 is a cross-sectional view along the A-A line in the process illustrated in FIG. 57, and FIG. 64 is a cross-sectional view along the B-B line. FIG. 65 is a cross-sectional view along the A-A line in the process illustrated in FIG. 58, and FIG. 66 is a cross-sectional view along the B-B line. FIG. 67 is a cross-sectional view along the A-A line in the process illustrated in FIG. 59, and FIG. 68 is a cross-sectional view along the B-B line. As illustrated in FIG. 67, a width 73W of the n-type pillar surrounding part 73 is larger than a width 7nW of the n-type pillar 7n, thus when the n-type pillar surrounding part 73 and the n-type pillar 7n have the same impurity concentration, a product of an impurity concentration and a width of the n-type pillar surrounding part 73 is larger than that of the n-type pillar 7n.

According to such a configuration, the depletion layer does not extend to the whole n-type pillar surrounding part 73, and an electrical field strength of the n-type pillar surrounding part 73 is suppressed to be low, thus increase in leakage current and discharge risk is suppressed. In this case, the width of the n-type pillar surrounding part 73 can be at least 1.2 times as large as that of the n-type pillar 7n.

<Method of Manufacturing Semiconductor Device

Figure 69:
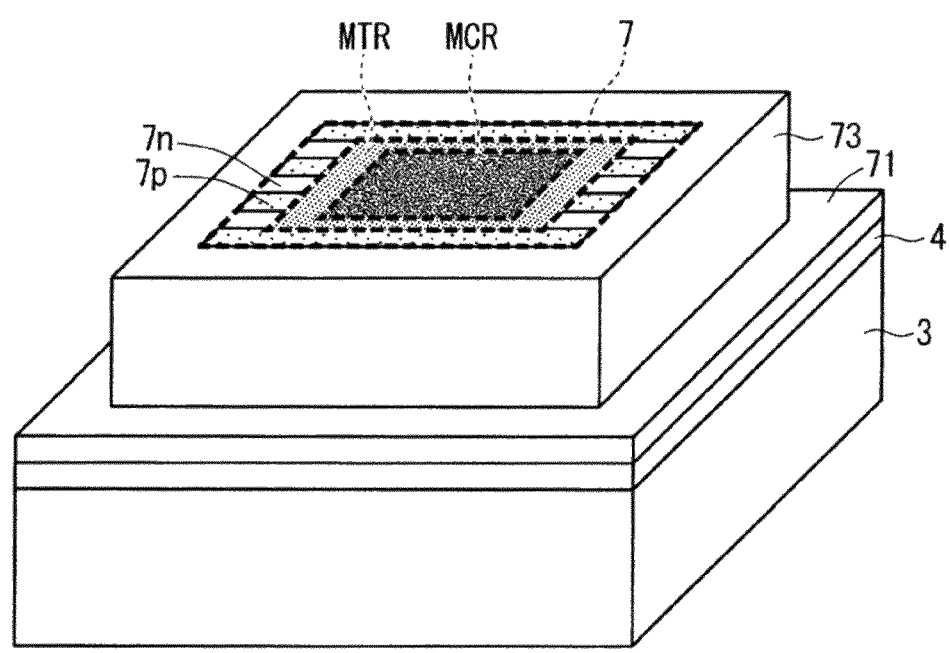
FIG. 69 A perspective view schematically illustrating the silicon carbide semiconductor device according to the embodiment 3.
Figure 70:
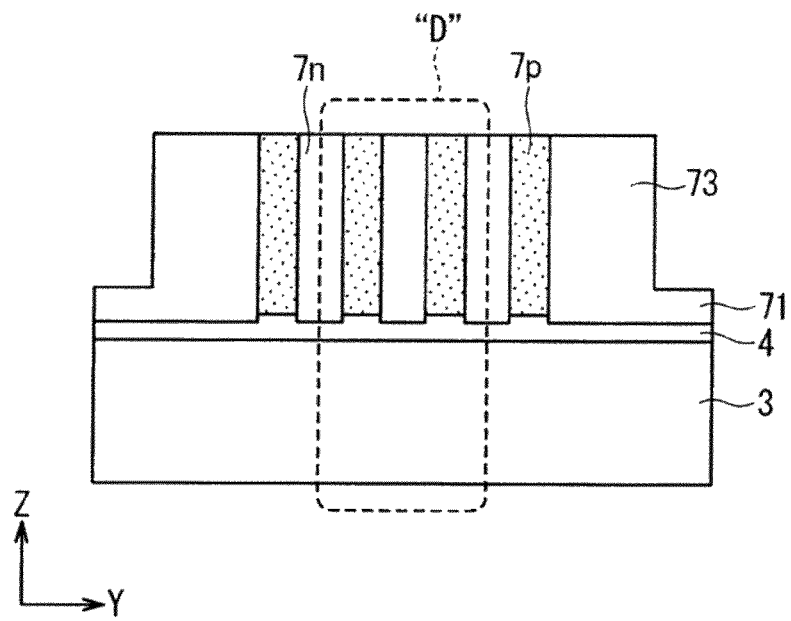
FIG. 70 A cross-sectional view illustrating a process of manufacturing the MOSFET cell in the MOSFET cell region.

FIG. 69 is a perspective view of the silicon carbide semiconductor device 300 schematically showing the MOSFET cell region MCR in the case where the MOSFET unit cell is provided in the pillar part 7 and the MOSFET terminal region MTR provided on the outer periphery thereof.

Figure 71:
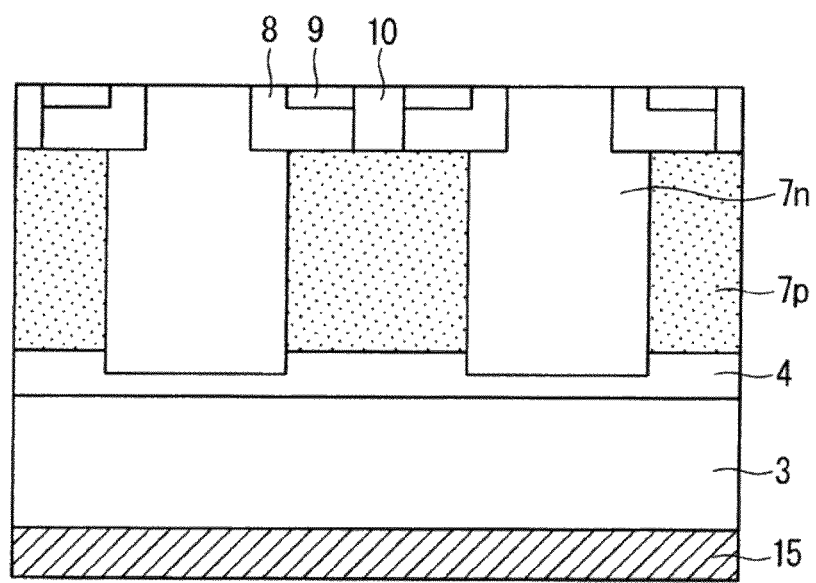
FIG. 71 A cross-sectional view illustrating a process of manufacturing the MOSFET cell in the MOSFET cell region.
Figure 72:
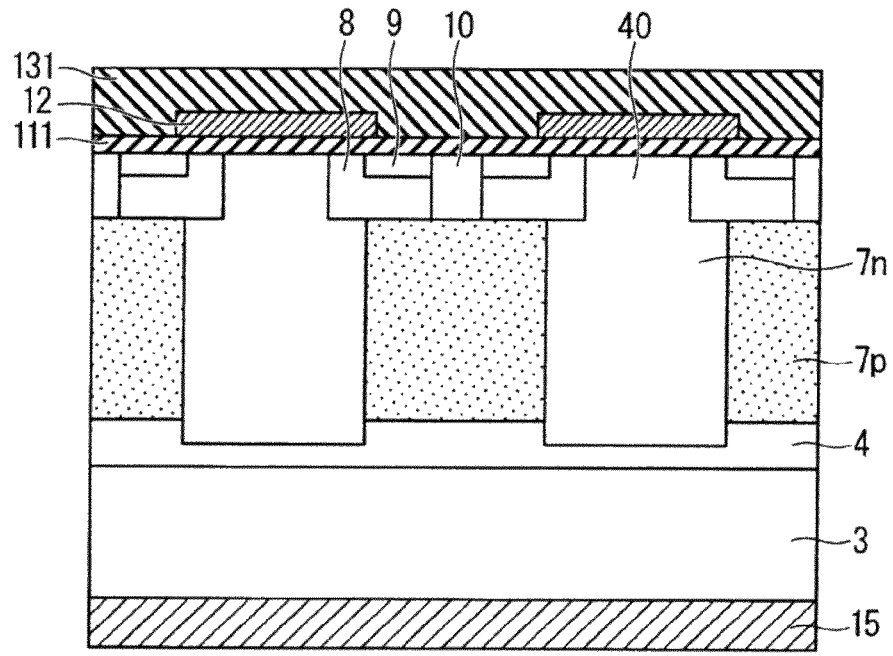
FIG. 72 A cross-sectional view illustrating a process of manufacturing the MOSFET cell in the MOSFET cell region.

A process of manufacturing the MOSFET cell in the MOSFET cell region MCR using FIG. 70 to FIG. 73. FIG. 72 is a cross-sectional view corresponding to FIG. 67, and FIG. 71 illustrates an enlarged view of a region D in FIG. 70. In FIG. 71, the same reference numerals are assigned to the same constituent elements as those in the configuration described using FIG. 7, and the repetitive description is omitted.

As illustrated in FIG. 71, the n-type SiC layer 4 is provided on one main surface of the semiconductor substrate 3, and the plurality of p-type pillars 7p and the plurality of n-type pillars 7n are alternately provided on the n-type SiC layer 4. Then, the plurality of p-type well regions 8 are selectively formed by ion implantation of the p-type impurity from the upper layer portion of the p-type pillar 7p to the upper layer portion of the n-type pillar 7n. The p-type contact region 10 is formed in each well region 8 by ion implantation of the p-type impurity to pass through the well region 8. The n-type source region 9 is formed in the upper layer portion of the well region 8 by ion implantation of the n-type impurity to have contact with both side surfaces of the contact region 10. Activation annealing is performed to recover crystal defect formed by the ion implantation to activate the implanted impurity.

The p-type well region 8 can have the thickness of 0.2 to 1.5 μm and the p-type impurity concentration of $1\times10^{14}$ to $1\times10^{19}$ cm$^{-3}$, for example, the source region 9 can have the thickness of 0.1 to 0.5 μm and the n-type impurity concentration of $1\times10^{17}$ to $1\times10^{21}$ cm$^{-3}$, for example, and the contact region 10 can have the thickness of 0.2 to 1.5 μm and the p-type impurity concentration of $1\times10^{18}$ to $1\times10^{21}$ cm$^{-3}$, for example.

Subsequently, in a process illustrated in FIG. 72, an insulating film such as the silicon oxide film 111 as the material of the gate insulating film 11 is formed on the pillar part 7, and the conductor film such as the polysilicon film as the gate electrode 12 is further formed on the silicon oxide film 111. Then, the polysilicon film is patterned to form the gate electrode 12 over the upper side of the end edge portions of the source regions 9 adjacent to each other. Subsequently, the insulating film such as the silicon oxide film 131 as the material of the interlayer insulating film 13 is formed to cover the gate electrode 12 and the silicon oxide film 111.

Subsequently, in a process illustrated in FIG. 73, the silicon oxide films 111 and 131 are patterned to form the interlayer insulating film 13 covering the gate insulating film 11 and the gate electrode 12. Formed in this patterning is the contact hole passing through the interlayer insulating film 13 in the thickness direction to reach the part of the source region 9 and the whole surface of the contact region 10. Subsequently, the conductor film is formed to fill the contact hole and cover the interlayer insulating film 13, thereby forming the source electrode 14, and the drain electrode 15 is formed on the other main surface (rear surface) of the semiconductor substrate 3 on the side opposite to the side on which the source electrode 14 is provided, thus the silicon carbide semiconductor device 300 is completed.

Figure 73:
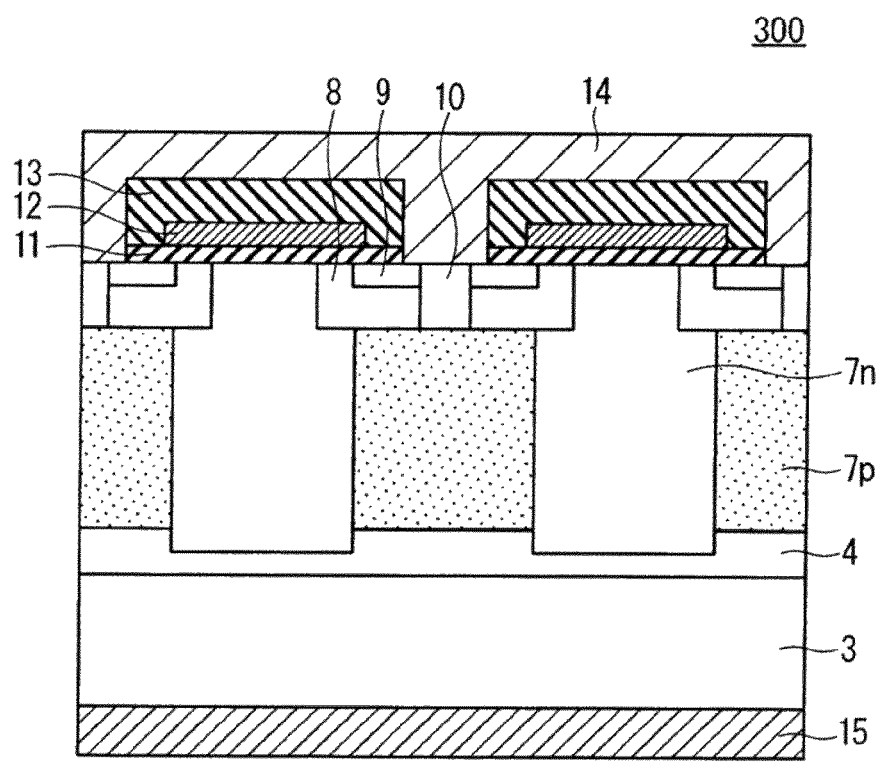
FIG. 73 A cross-sectional view illustrating a process of manufacturing the MOSFET cell in the MOSFET cell region.

The silicon carbide semiconductor device 300 illustrated in FIG. 73 has the configuration that the plurality of p-type well regions 8 are selectively provided from the upper layer portion of the p-type pillar 7p to the upper layer portion of the n-type pillar 7n, and the p-type contact region 10 and the n-type source region 9 are provided in each well region 8. However, also applicable is a configuration that the p-type well region 8, for example, is not provided on the upper layer portions of the n-type pillar 7n and the p-type pillar 7p but the n-type SiC layer 40 (third n-type SiC layer) is formed on the n-type pillar 7n and the p-type pillar 7p, thus the p-type well region 8, for example, is provided in the n-type SiC layer 40. A manufacturing process thereof is described hereinafter using FIG. 74 to FIG. 78 as the other example of a method of manufacturing the semiconductor device.

Figure 74:
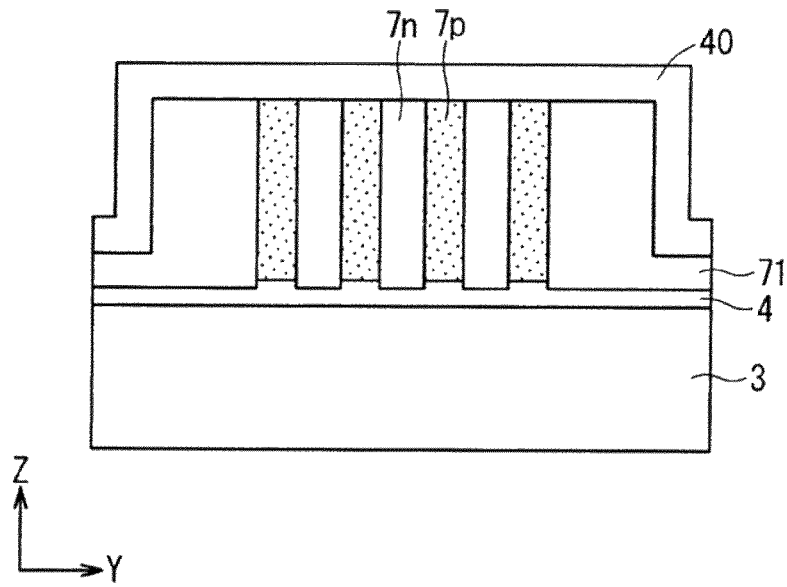
FIG. 74 A cross-sectional view illustrating a process of manufacturing the MOSFET cell in the MOSFET cell region.

After the process described using FIG. 59, the n-type SiC layer 40 is formed by epitaxial growth to cover a region from the pillar part 7 to the n-type chip surrounding part 71 of the n-type SiC layer 70 in the process illustrated in FIG. 74. The n-type SiC layer 40 may be formed on the whole surface of the semiconductor chip, only the MOSFET cell region forming the MOSFET cell, or the MOSFET cell region and the MOSFET terminal region.

Figure 75:
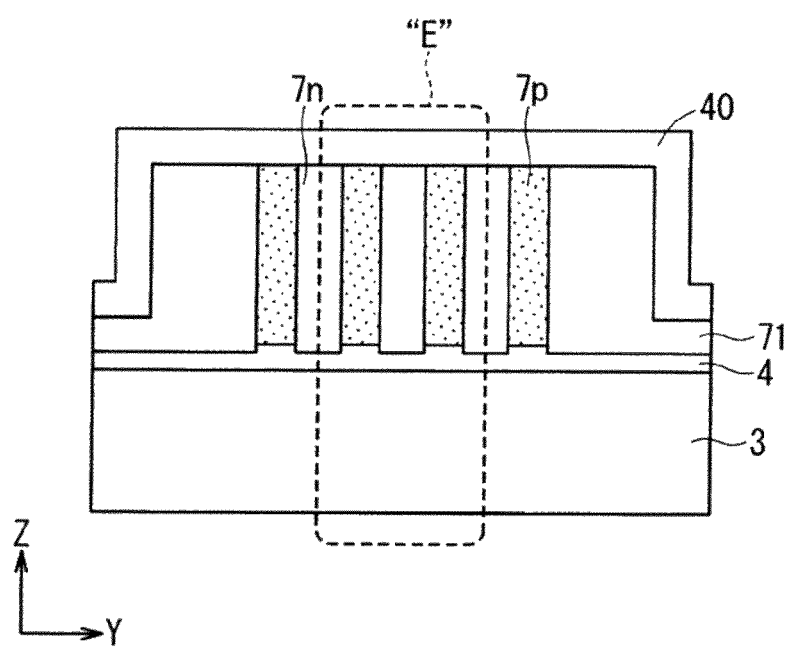
FIG. 75 A cross-sectional view illustrating a process of manufacturing the MOSFET cell in the MOSFET cell region.
Figure 76:
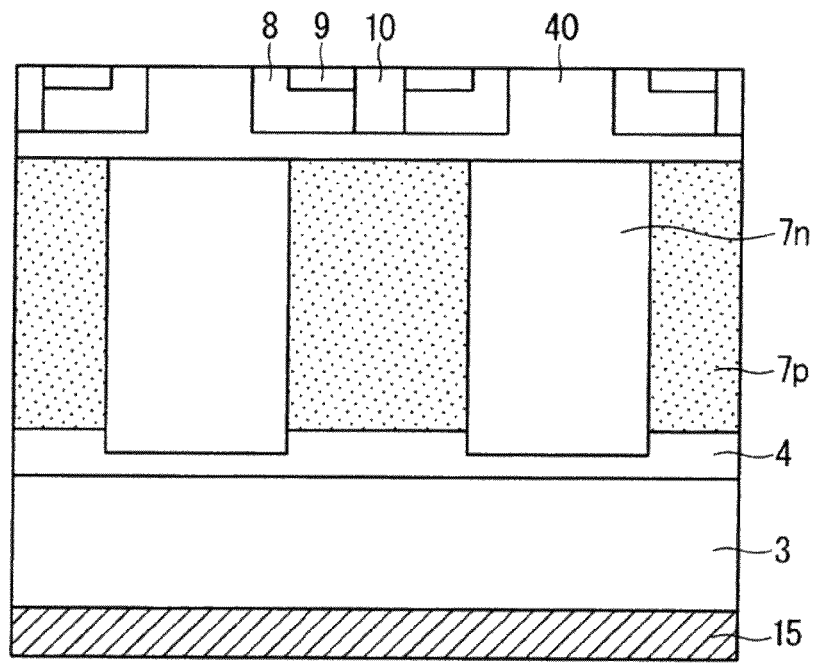
FIG. 76 A cross-sectional view illustrating a process of manufacturing the MOSFET cell in the MOSFET cell region.

FIG. 75 is a diagram illustrating an enlarged region in FIG. 74, and FIG. 76 illustrates an enlarged view of a region E in FIG. 75. In FIG. 76, the same reference numerals are assigned to the same constituent elements as those in the configuration described using FIG. 7, and the repetitive description is omitted.

As illustrated in FIG. 76, the plurality of p-type well regions 8 are selectively formed by ion implantation of the p-type impurity in the n-type SiC layer 40 from the upper side of the p-type pillar 7p to the upper side of the n-type pillar 7n. The p-type contact region 10 is formed in each well region 8 by ion implantation of the p-type impurity to pass through the well region 8. The n-type source region 9 is formed in the upper layer portion of the well region 8 by ion implantation of the n-type impurity to have contact with both side surfaces of the contact region 10. Activation annealing is performed to recover crystal defect formed by the ion implantation to activate the implanted impurity.

Figure 77:
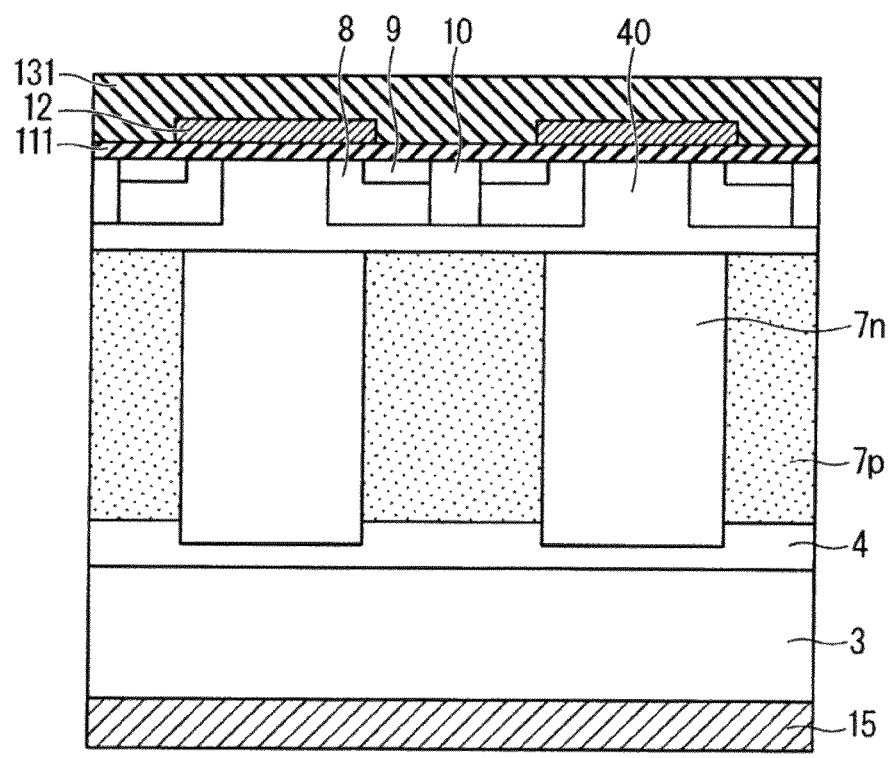
FIG. 77 A cross-sectional view illustrating a process of manufacturing the MOSFET cell in the MOSFET cell region.

Subsequently, in a process illustrated in FIG. 77, the insulating film such as the silicon oxide film 111 as the material of the gate insulating film 11 is formed on the n-type SiC layer 40, and the conductor film such as the polysilicon film as the gate electrode 12 is further formed on the silicon oxide film 111. Then, the polysilicon film is patterned to form the gate electrode 12 over the upper side of the end edge portions of the source regions 9 adjacent to each other. Subsequently, the insulating film such as the silicon oxide film 131 as the material of the interlayer insulating film 13 is formed to cover the gate electrode 12 and the silicon oxide film 111.

Subsequently, in a process illustrated in FIG. 78, the silicon oxide films 111 and 131 are patterned to form the interlayer insulating film 13 covering the gate insulating film 11 and the gate electrode 12. Formed in this patterning is the contact hole passing through the interlayer insulating film 13 in the thickness direction to reach the part of the source region 9 and the whole surface of the contact region 10. Subsequently, the conductor film is formed to fill the contact hole and cover the interlayer insulating film 13, thereby forming the source electrode 14, and the drain electrode 15 is formed on the other main surface (rear surface) of the semiconductor substrate 3 on the side opposite to the side on which the source electrode 14 is provided, thus the silicon carbide semiconductor device 300A is completed.

In the silicon carbide semiconductor devices 300 and 300A according to the embodiment 2 described above, the void is not formed when the n-type pillar 7n is formed by epitaxial growth, thus the invalid region can be reduced. Thus, processing for separating the void is unnecessary, and manufacturing cost can be reduced.

Figure 78:
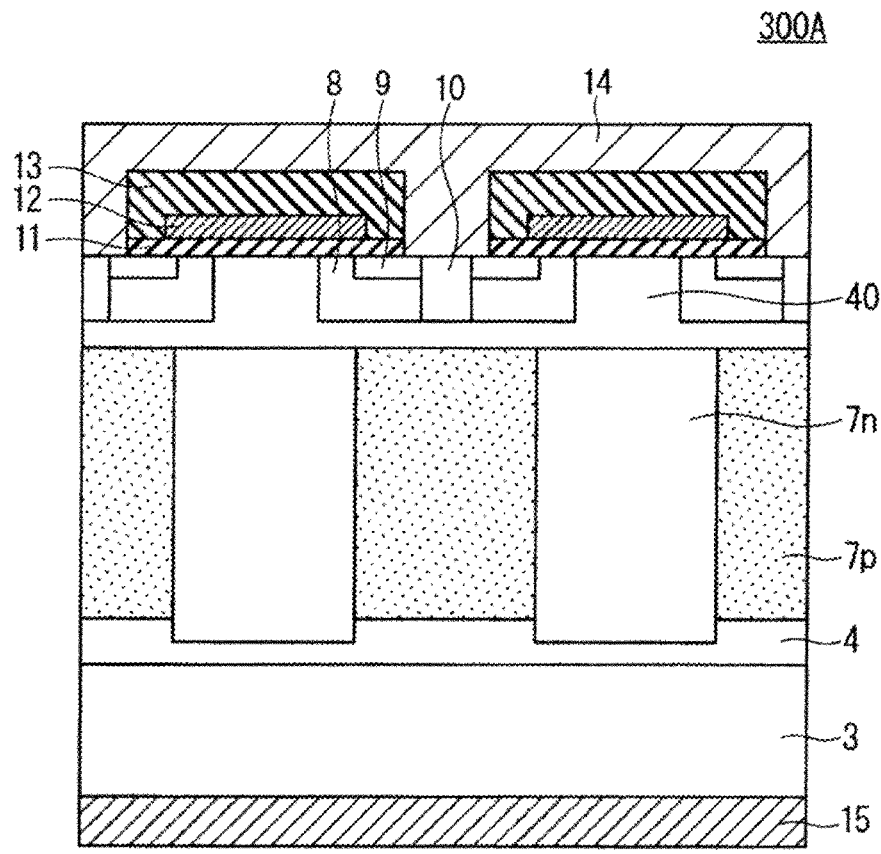
FIG. 78 A cross-sectional view illustrating a configuration of the modification example of the silicon carbide semiconductor device according to the embodiment 3.

FIG. 73 and FIG. 78 illustrate the configuration of providing two MOSFET unit cells, however, the unit cell, the number of which corresponds to a size of the silicon carbide semiconductor device, is actually formed.

Modification Example 1 of Method of Manufacturing Semiconductor Device

Figure 79:
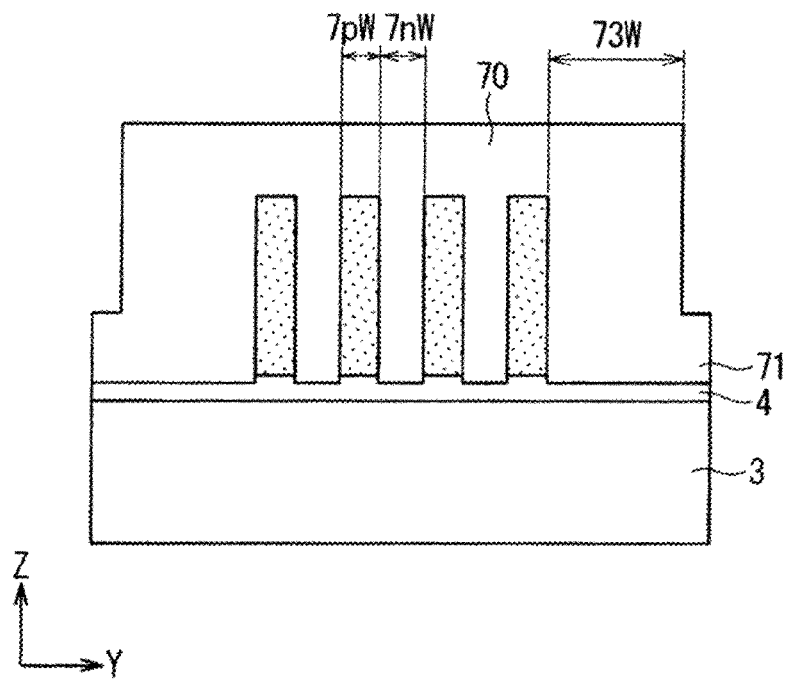
FIG. 79 A cross-sectional view illustrating a modification example 1 of the method of manufacturing the silicon carbide semiconductor device according to the embodiment 3.
Figure 80:
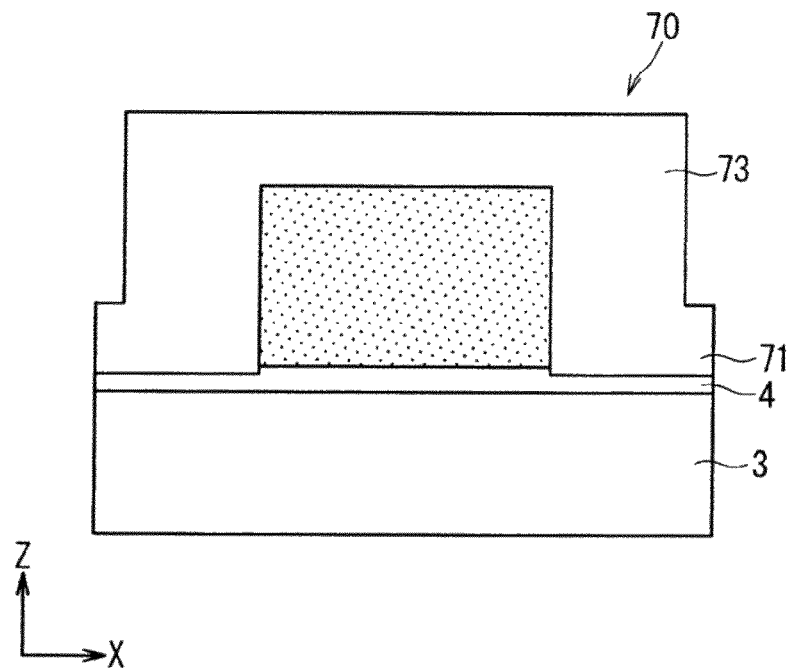
FIG. 80 A cross-sectional view illustrating a modification example 1 of the method of manufacturing the silicon carbide semiconductor device according to the embodiment 3.

A modification example 1 of the method of manufacturing the silicon carbide semiconductor device according to the embodiment 3 is described using FIG. 79 and FIG. 80. FIG. 79 and FIG. 80 are diagrams corresponding to FIG. 65 and FIG. 66, respectively.

As described using FIG. 57 and FIG. 63, the epitaxial growth of the n-type SiC layer 70 is continued even after the n-type SiC layer 70 fills the portion between the convex parts 62 of the p-type SiC layer 60 as illustrated in FIG. 79 and FIG. 80 when the n-type SiC layer 70 is formed to cover the convex part 62 of the p-type SiC layer 60 and the surrounding part of the n-type SiC layer 4 around the convex part 62 by the epitaxial growth after the convex part 62 of the p-type SiC layer 60 is formed and the surface of the surrounding part of the n-type SiC layer 4 is exposed, thus the width 73W of the n-type pillar surrounding part 73 is formed to be significantly larger than the width 7nW of the n-type pillar 7n.

As a result, when the n-type pillar surrounding part 73 and the n-type pillar 7n have the same impurity concentration, the product of the impurity concentration and the width of the n-type pillar surrounding part 73 is significantly larger than that of the n-type pillar 7n. According to such a configuration, the depletion layer does not extend to the whole n-type pillar surrounding part 73, and an electrical field strength of the n-type pillar surrounding part 73 is suppressed to be low, thus increase in leakage current and discharge risk is suppressed.

Modification Example 2 of Method of Manufacturing Semiconductor Device

Figure 81:
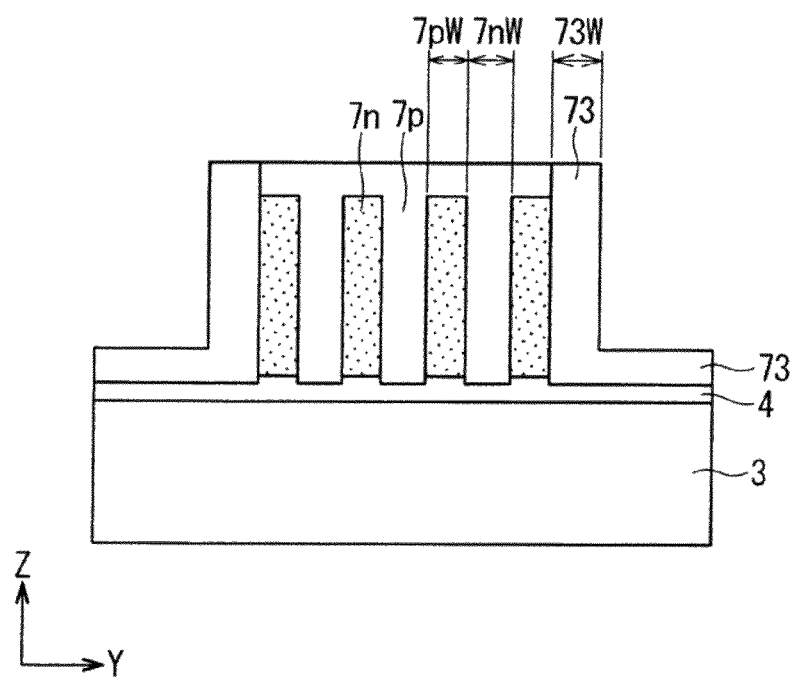
FIG. 81 A cross-sectional view illustrating a modification example 2 of the method of manufacturing the silicon carbide semiconductor device according to the embodiment 3.
Figure 82:
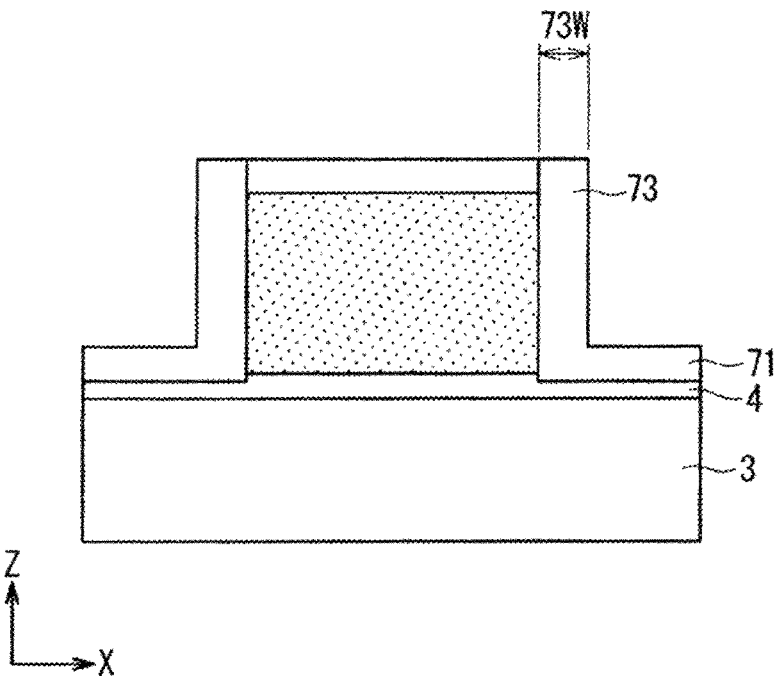
FIG. 82 A cross-sectional view illustrating the modification example 2 of the method of manufacturing the silicon carbide semiconductor device according to the embodiment 3.

A modification example 2 of the method of manufacturing the silicon carbide semiconductor device according to the embodiment 3 is described using FIG. 81 and FIG. 82. FIG. 81 and FIG. 82 are diagrams corresponding to FIG. 65 and FIG. 66, respectively.

As described using FIG. 57 and FIG. 63, the n-type pillar surrounding part 73 is formed so that the n-type impurity concentration is higher than that of the n-type pillar 7n as illustrated in FIG. 81 and FIG. 82 when the n-type SiC layer 70 is formed to cover the convex part 62 of the p-type SiC layer 60 and the surrounding part of the n-type SiC layer 4 around the convex part 62 by the epitaxial growth after the convex part 62 of the p-type SiC layer 60 is formed and the surface of the surrounding part of the n-type SiC layer 4 is exposed. For this purpose, an epitaxial condition of the n-type SiC layer 70 is adjusted so that the n-type pillar surrounding part 73 takes in the n-type impurity more easily than the portion between the convex parts 62 of the p-type SiC layer 60.

That is to say, a material gas ratio, a temperature, and a pressure are adjusted at the time of epitaxial growth, thus an intake amount of the impurity at a crystal surface is changed. Crystal growth in the n-type pillar surrounding part 73 is almost limited to crystal growth from a bottom surface of a trench, however, crystal growth is performed from a plurality of surfaces, that is a bottom surface and a sidewall of the trench between the convex parts 62, thus the intake amount of the impurity is different from each other. There is also an influence of difference of a degree of easiness of supplying material gas and impurity gas between the n-type pillar surrounding part 73 dug down over a large area and the portion between the convex parts 62 dug down at a small width, thus the epitaxial condition of the n-type SiC layer 70 is adjusted in consideration of these elements.

As a result, even when the width 73W of the n-type pillar surrounding part 73 and the width 7nW of the n-type pillar 7n are the same as each other, the product of the impurity concentration and the width of the n-type pillar surrounding part 73 is larger than that of the n-type pillar 7n. According to such a configuration, the depletion layer does not extend to the whole n-type pillar surrounding part 73, and an electrical field strength of the n-type pillar surrounding part 73 is suppressed to be low, thus increase in leakage current and discharge risk is suppressed.

The n-type SiC layer 70 is formed by combining the configurations of FIG. 79 to FIG. 82, thus the product of the impurity concentration and the width of the n-type pillar surrounding part 73 can be set to be significantly larger than the product of that of the n-type pillar 7n. According to such a configuration, the depletion layer does not extend to the whole n-type pillar surrounding part 73, and an electrical field strength of the n-type pillar surrounding part 73 is suppressed to be low, thus increase in leakage current and discharge risk is suppressed.

Modification Example 3 of Method of Manufacturing Semiconductor Device

Figure 83:
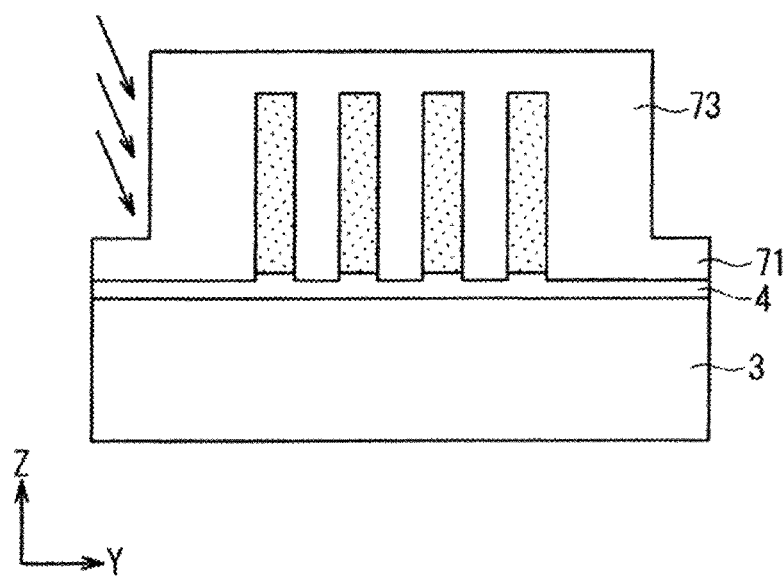
FIG. 83 A cross-sectional view illustrating the modification example 3 of the method of manufacturing the silicon carbide semiconductor device according to the embodiment 3.
Figure 84:
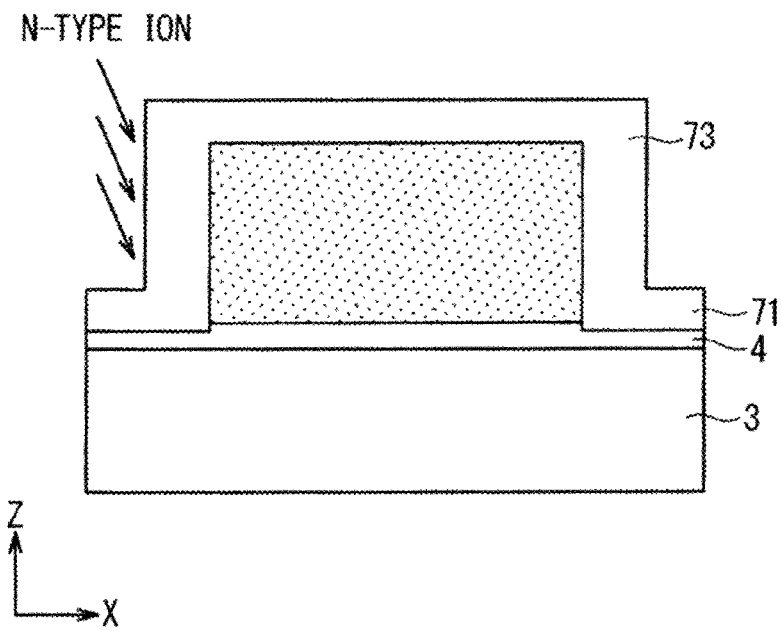
FIG. 84 A cross-sectional view illustrating the modification example 3 of the method of manufacturing the silicon carbide semiconductor device according to the embodiment 3.

A modification example 3 of the method of manufacturing the silicon carbide semiconductor device according to the embodiment 3 is described using FIG. 83 and FIG. 84. FIG. 83 and FIG. 84 are diagrams corresponding to FIG. 65 and FIG. 66, respectively.

As described using FIG. 57 and FIG. 63, ion implantation of the n-type impurity is performed on the n-type pillar surrounding part 73 so that the concentration of the n-type impurity of the n-type pillar surrounding part 73 is higher than that of the n-type pillar 7n as illustrated in FIG. 83 and FIG. 84 when the n-type SiC layer 70 is formed to cover the convex part 62 of the p-type SiC layer 60 and the surrounding part of the n-type SiC layer 4 around the convex part 62 by the epitaxial growth after the convex part 62 of the p-type SiC layer 60 is formed and the surface of the surrounding part of the n-type SiC layer 4 is exposed.

As a result, the product of the impurity concentration and the width of the n-type pillar surrounding part 73 is larger than that of the n-type pillar 7n. According to such a configuration, the depletion layer does not extend to the whole n-type pillar surrounding part 73, and an electrical field strength of the n-type pillar surrounding part 73 is suppressed to be low, thus increase in leakage current and discharge risk is suppressed.

The ion implantation can be performed on only a necessary position in the n-type pillar surrounding part 73. In the case of SiC, an epitaxial growth speed and an epitaxial concentration are different depending on a crystal orientation in some cases. As a result, when the n-type SiC layer 70 is epitaxially grown, the product of the impurity concentration and the width of the n-type pillar surrounding part 73 is not uniform in some cases, thus there is a position where the product of the impurity concentration and the width of the n-type pillar surrounding part 73 is smaller than that of the n-type pillar 7n. In this case, the ion implantation is performed on only a portion where the product of the concentration and the width of the n-type pillar surrounding part 73 is smaller than the product of the impurity concentration and the width of the n-type pillar surrounding part 73, thus the product of the concentration and the width of the n-type pillar surrounding part 73 can be larger than the product of the impurity concentration and the width of the n-type pillar surrounding part 73.

In a case of a semiconductor device having the same structure and size, a position where the product of the impurity concentration and the width of the n-type pillar surrounding part 73 is smaller than the product of the impurity concentration and the width of the n-type pillar 7n always occurs in the same position, thus can be specified by making a sample, and resolving and testing the sample.

Considered as a cause that the product of the impurity concentration and the width of the n-type pillar surrounding part 73 is smaller than that of the n-type pillar 7n is that the width of the n-type pillar surrounding part 73 is small, or an intake amount of the n-type impurity in the crystal surface is small, thus the concentration of the n-type impurity is small depending on the epitaxial condition.

Modification Example 4 of Method of Manufacturing Semiconductor Device

Figure 85:
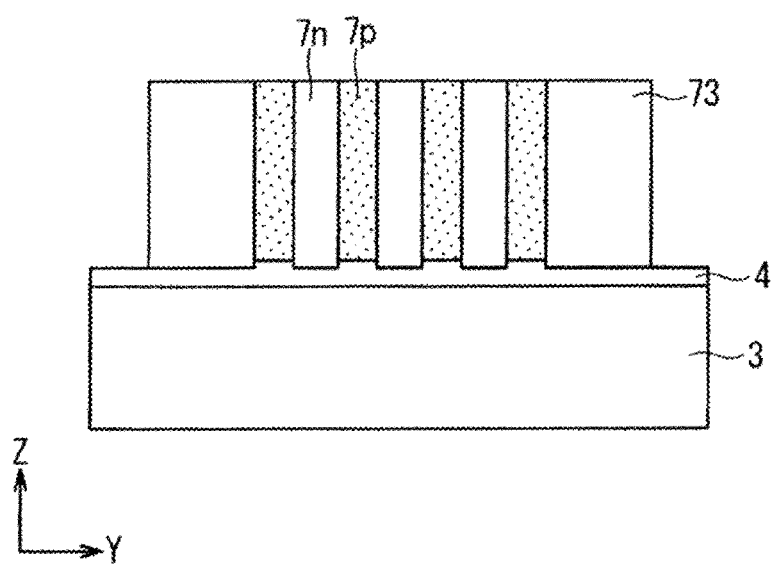
FIG. 85 A cross-sectional view illustrating a modification example 4 of the method of manufacturing the silicon carbide semiconductor device according to the embodiment 3.

A modification example 4 of the method of manufacturing the silicon carbide semiconductor device according to the embodiment 3 is described using FIG. 85. FIG. 85 is a diagram corresponding to FIG. 67.

As described using FIG. 59 and FIG. 67, when the n-type SiC layer 70 on the convex part 62 of the p-type SiC layer 600 is removed by polishing or dry etching to expose the upper surface of the convex part 62, the n-type chip surrounding part 71 on the outer side of the n-type pillar surrounding part 73 is removed as illustrated in FIG. 85.

According to such a configuration, the n-type chip surrounding part 71 can be removed together with the n-type SiC layer 70 on the convex part 62 of the n-type SiC layer 70 by whole surface etching, thus the manufacturing process can be simplified. At this time, the surrounding part of the n-type SiC layer 4 can also be partially removed.

Modification Example 5 of Method of Manufacturing Semiconductor Device

Figure 86:
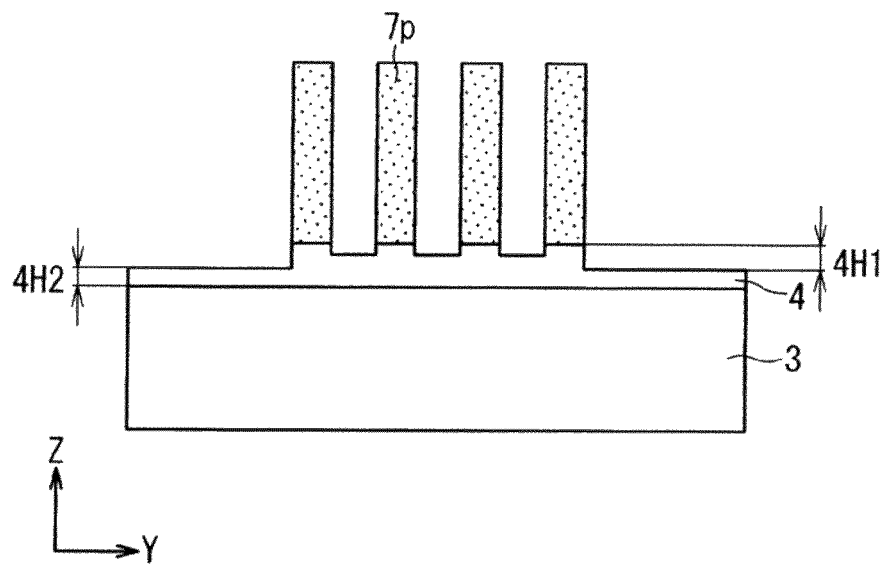
FIG. 86 A cross-sectional view illustrating a modification example 5 of the method of manufacturing the silicon carbide semiconductor device according to the embodiment 3.
Figure 87:
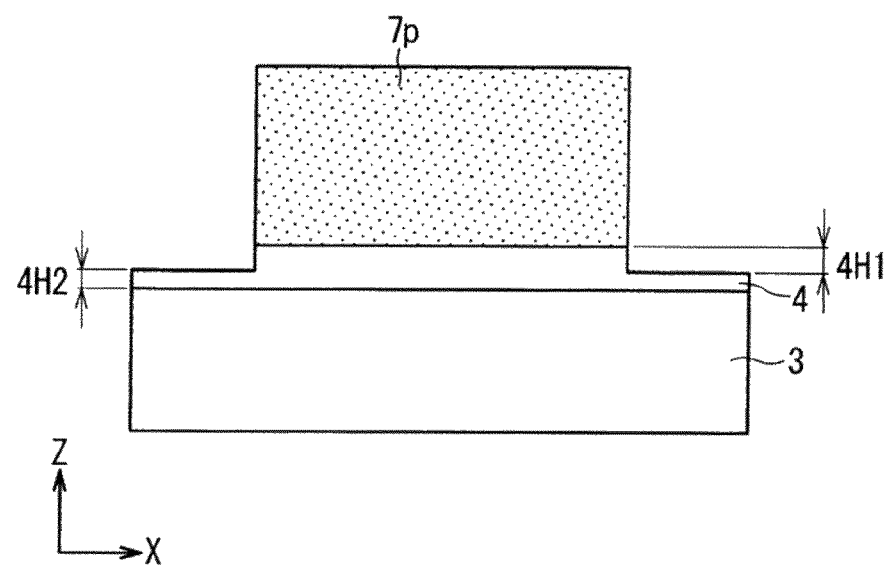
FIG. 87 A cross-sectional view illustrating the modification example 5 of the method of manufacturing the silicon carbide semiconductor device according to the embodiment 3.

A modification example 5 of the method of manufacturing the silicon carbide semiconductor device according to the embodiment 3 is described using FIG. 86 and FIG. 87. FIG. 86 and FIG. 87 are diagrams corresponding to FIG. 63 and FIG. 64, respectively.

As described using FIG. 57, the n-type SiC layer 4 is partially removed to form a concave-convex portion on the surface of the n-type SiC layer 4 when the p-type SiC layer 60 is etched by dry etching to form the convex part 62 of the p-type SiC layer 60 and the p-type SiC layer 60 around the convex part 62 is removed to expose the surface of the surrounding part of the n-type SiC layer 4, thus the pillar surrounding part height 4H2 of the n-type SiC layer 4 is lower than the height 4H1 of the n-type SiC layer 4 in the pillar part 7.

The thickness of the n-type SiC layer 4 of the chip surrounding part is reduced in this manner, thus the main current of the MOSFET hardly flows in the chip surrounding part as described using FIG. 12, and current capacity increases in a case where large current flows as the main current in the MOSFET.

<Dicing Process>

Figure 88:
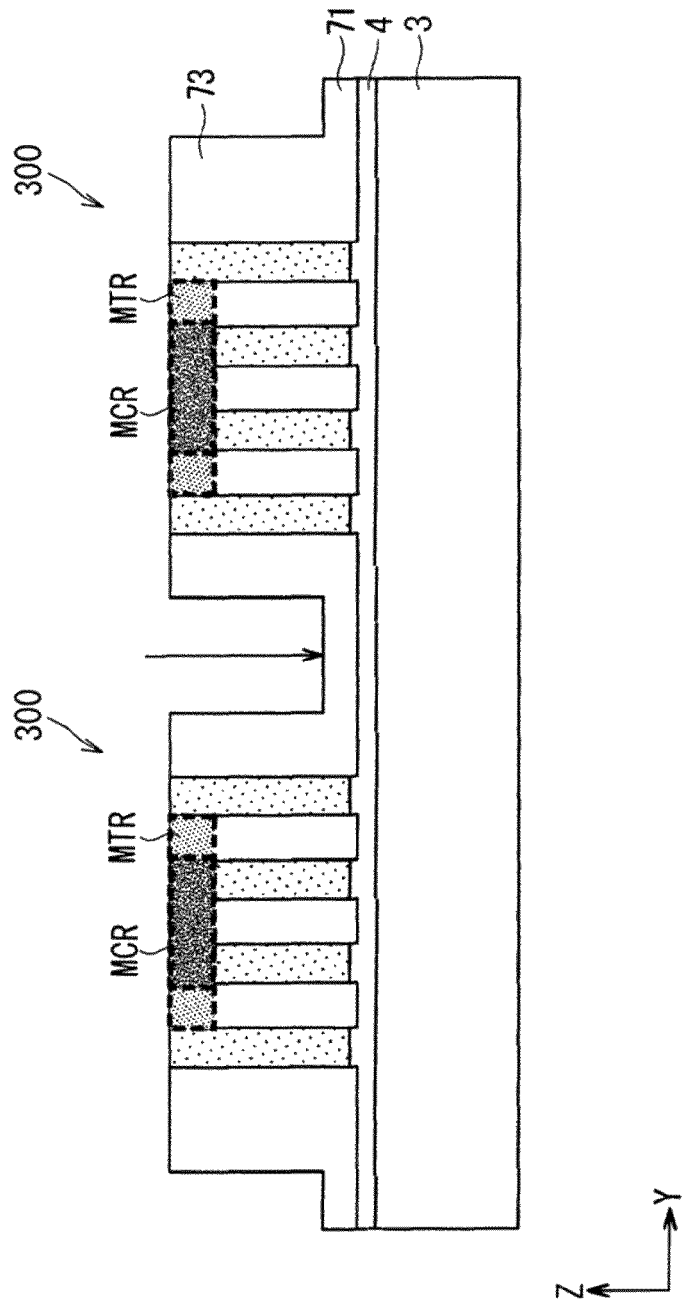
FIG. 88 A cross-sectional view for describing a dicing process of adjacent two silicon carbide semiconductor devices.
Figure 89:
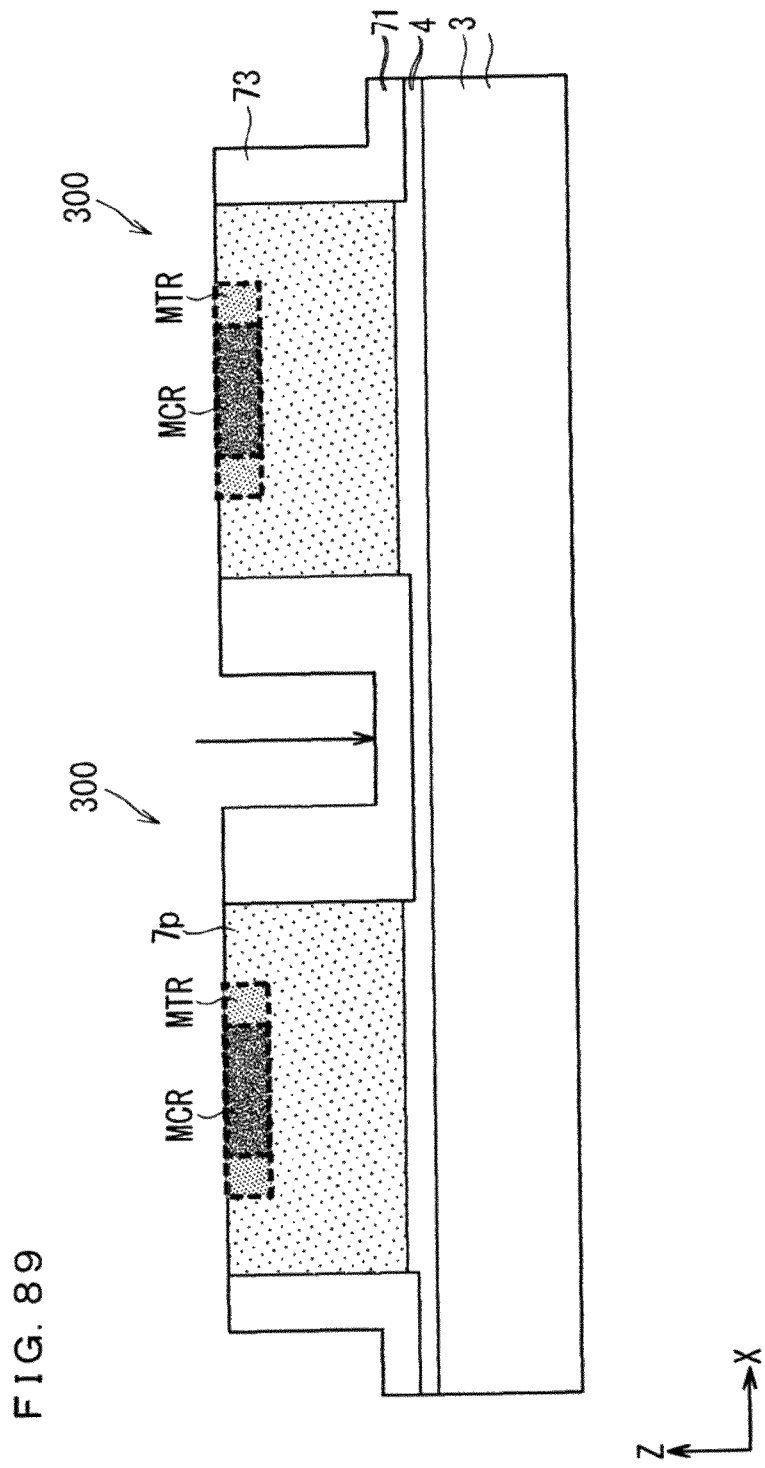
FIG. 89 A cross-sectional view for describing a dicing process of the adjacent two silicon carbide semiconductor devices.

Described using FIG. 88 and FIG. 89 is a dicing process of separating the semiconductor device manufactured through the wafer process into chips. FIG. 88 and FIG. 89 correspond to cross-sectional views illustrating the silicon carbide semiconductor devices 300 adjacent to each other in a form of wafer, FIG. 88 is a cross-sectional view along an A-A line in an arrow direction in FIG. 69, and FIG. 89 corresponds to a cross-sectional view along a B-B line in an arrow direction in FIG. 69. The silicon carbide semiconductor device 300 is in the state illustrated in FIG. 73, however, the source electrode 14 and the drain electrode 15, for example, are omitted.

In FIG. 88 and FIG. 89, dicing is performed at a position indicated by an arrow between two silicon carbide semiconductor devices 300 to separate the silicon carbide semiconductor device 300 into chips. In order to perform such a dicing, an interval of the convex parts 62 of the p-type SiC layer 60 is set to be at least ten times as large as a pillar width 0.5 to 5 μm of the n-type pillar 7n and the p-type pillar 7p, that is 50 μm or more, for example, in the silicon carbide semiconductor device adjacent to each other.

Figure 90:
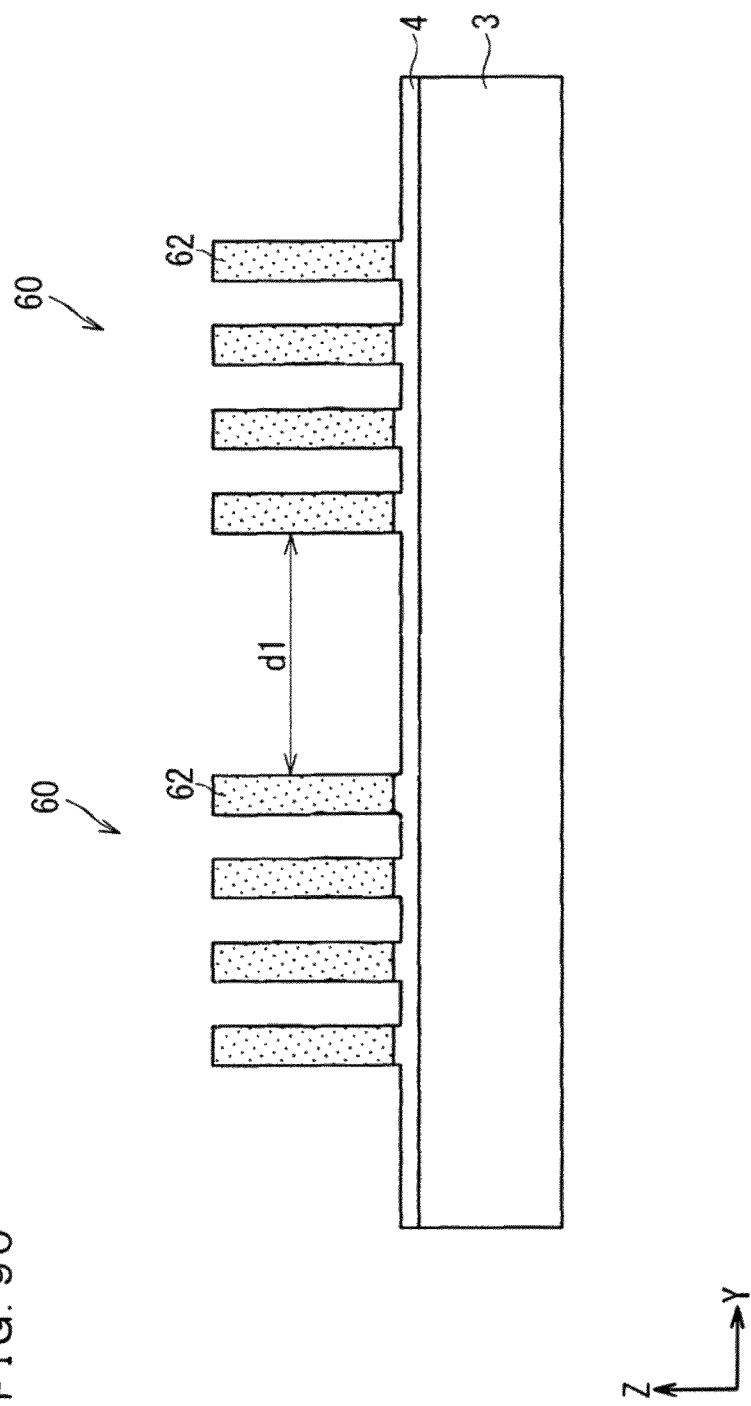
FIG. 90 A cross-sectional view illustrating a method of manufacturing the adjacent two silicon carbide semiconductor devices.
Figure 91:
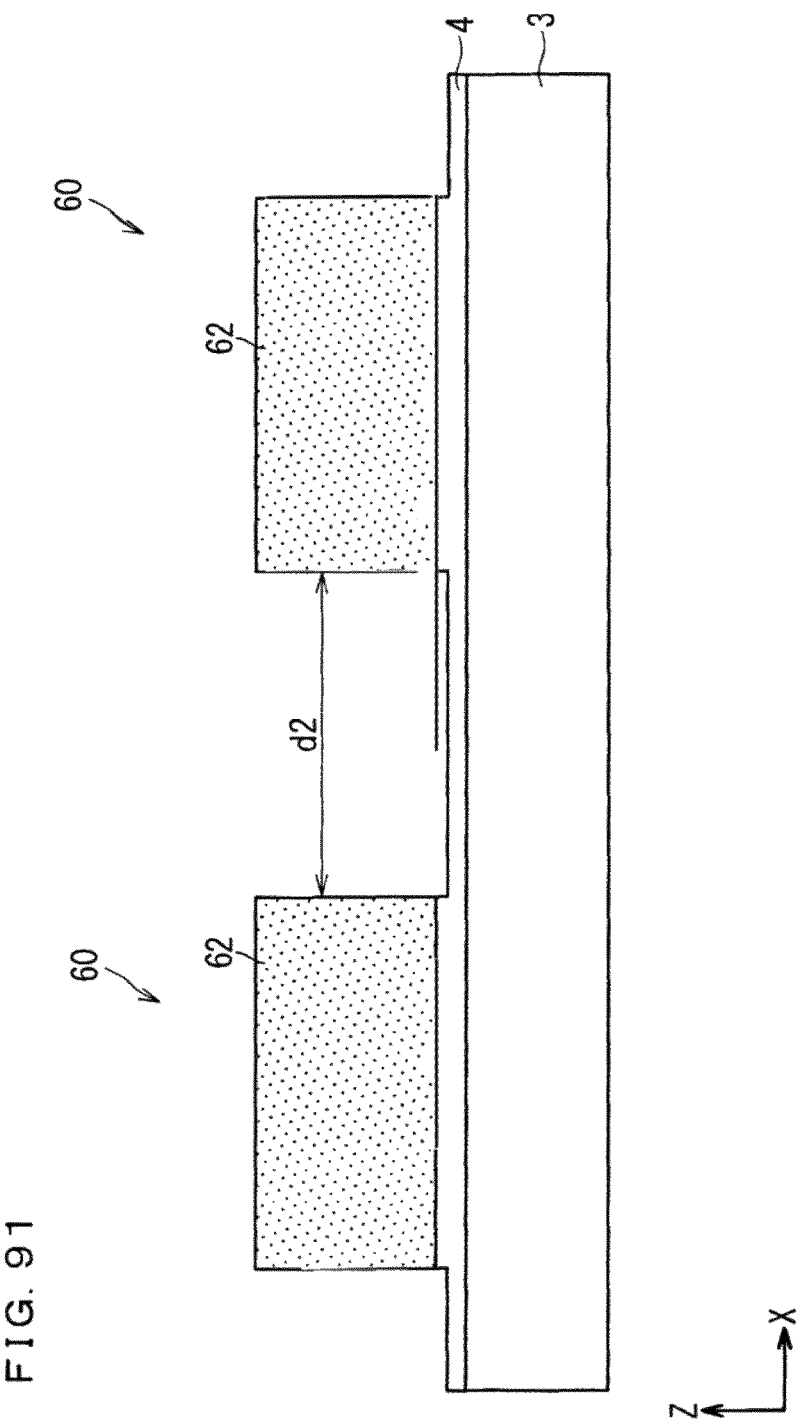
FIG. 91 A cross-sectional view illustrating a method of manufacturing the adjacent two silicon carbide semiconductor devices.

FIG. 90 and FIG. 91 illustrate the convex part 62 of the p-type SiC layer 60 in the process illustrated in FIG. 63, and FIG. 90 and FIG. 91 correspond to FIG. 88 and FIG. 89, respectively. The interval between the convex parts 62 in the silicon carbide semiconductor devices adjacent to each other is d1 in FIG. 90, and the interval between the convex parts 62 in the silicon carbide semiconductor device adjacent to each other is d2 in FIG. 91.

The interval between the convex parts 62 of the p-type SiC layer 60 in the silicon carbide semiconductor device adjacent to each other is widened, thus the dicing can be performed, and formation of the void at a time of forming the n-type SiC layer70 by epitaxial growth can be suppressed. Particularly, the interval d2 of the convex parts 62 in the direction illustrated in FIG. 91 is larger than the interval d1 of the convex parts 62 in the direction illustrated in FIG. 90, thus the formation of the void can be suppressed more effectively.

Another Application Example

The semiconductor device according to the embodiments 1 to 3 described above indicates the silicon carbide semiconductor device in which the MOSFET cell region and the MOSFET terminal region are formed in the pillar part 7, however, the application of the present disclosure is not limited to the MOSFET. Also applicable is a silicon carbide semiconductor device in which an SBD region and an SBD terminal region are formed in the pillar part 7 or a silicon carbide semiconductor device in which an insulated gate bipolar transistor (IGBT) cell region and an IGBT terminal region are formed in the pillar part 7. The semiconductor device is not limited to a transistor, however, also applicable is a silicon carbide semiconductor device in which a pn diode region and a pn diode terminal region are formed in the pillar part 7, thus a similar effect can be obtained as long as a vertical power device is applied. The application to the silicon carbide semiconductor device is exemplified in the semiconductor device according to the embodiments 1 to 3, however, the present disclosure can also be applied to a silicon semiconductor device.

Example of MOSFET Cell Region

Figure 92:
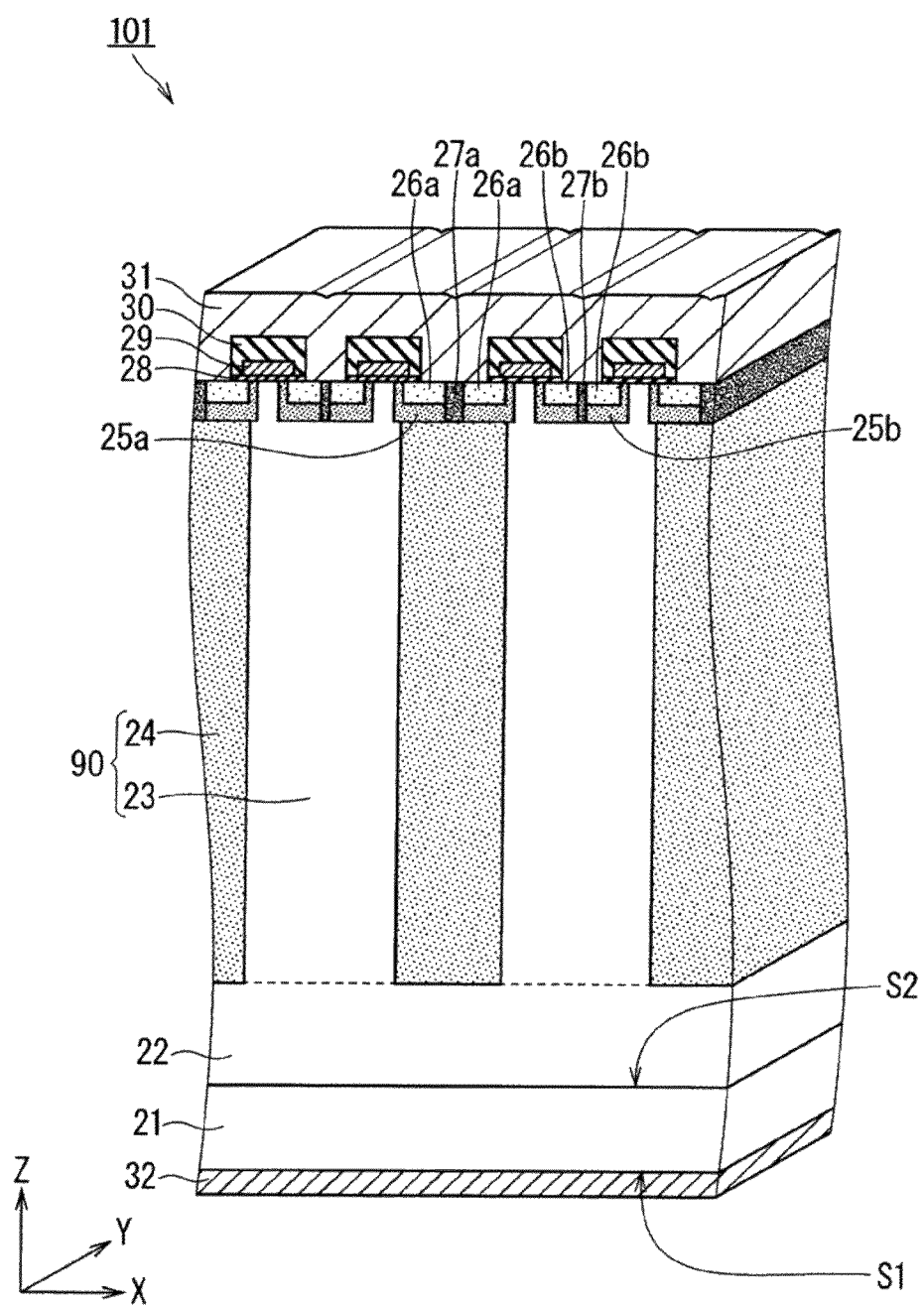
FIG. 92 A diagram illustrating an example of a configuration of a MOSFET cell region in the silicon carbide semiconductor device according to the embodiments 1 to 3.
Figure 93:
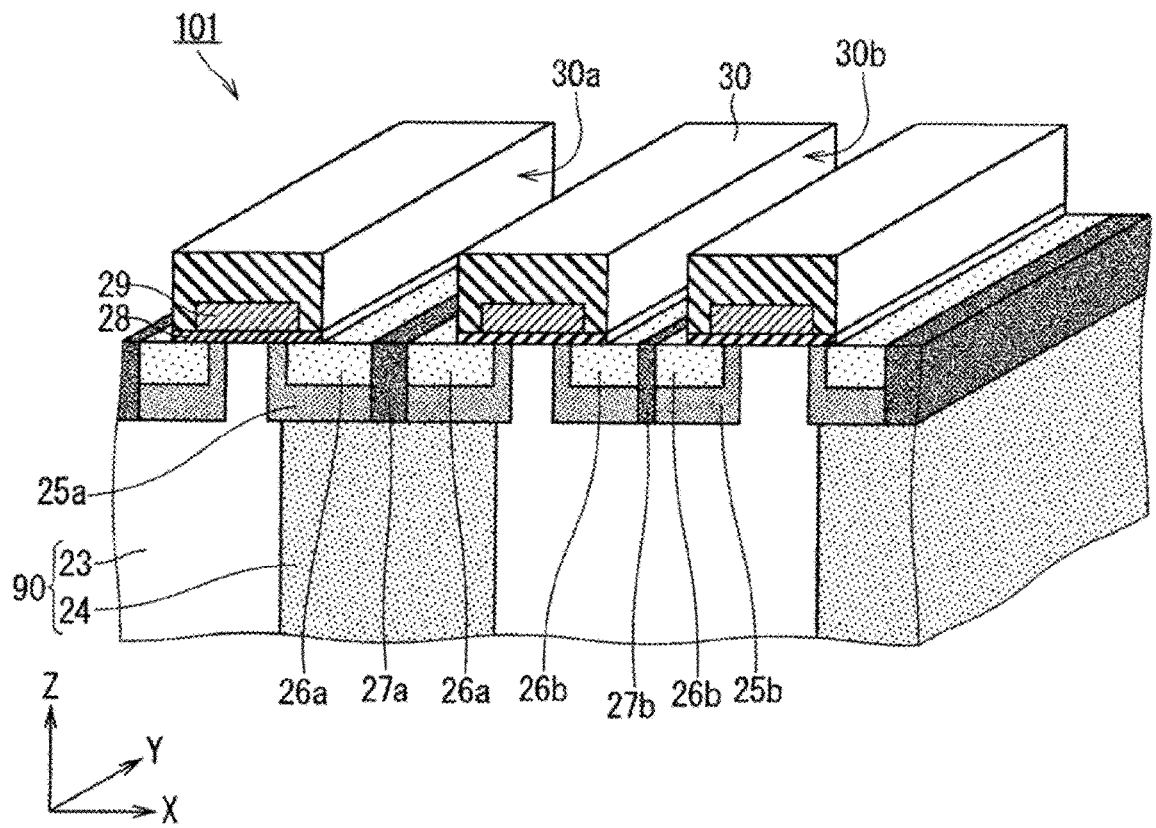
FIG. 93 A diagram illustrating an example of a configuration of the MOSFET cell region in the silicon carbide semiconductor device according to the embodiments 1 to 3.
Figure 94:
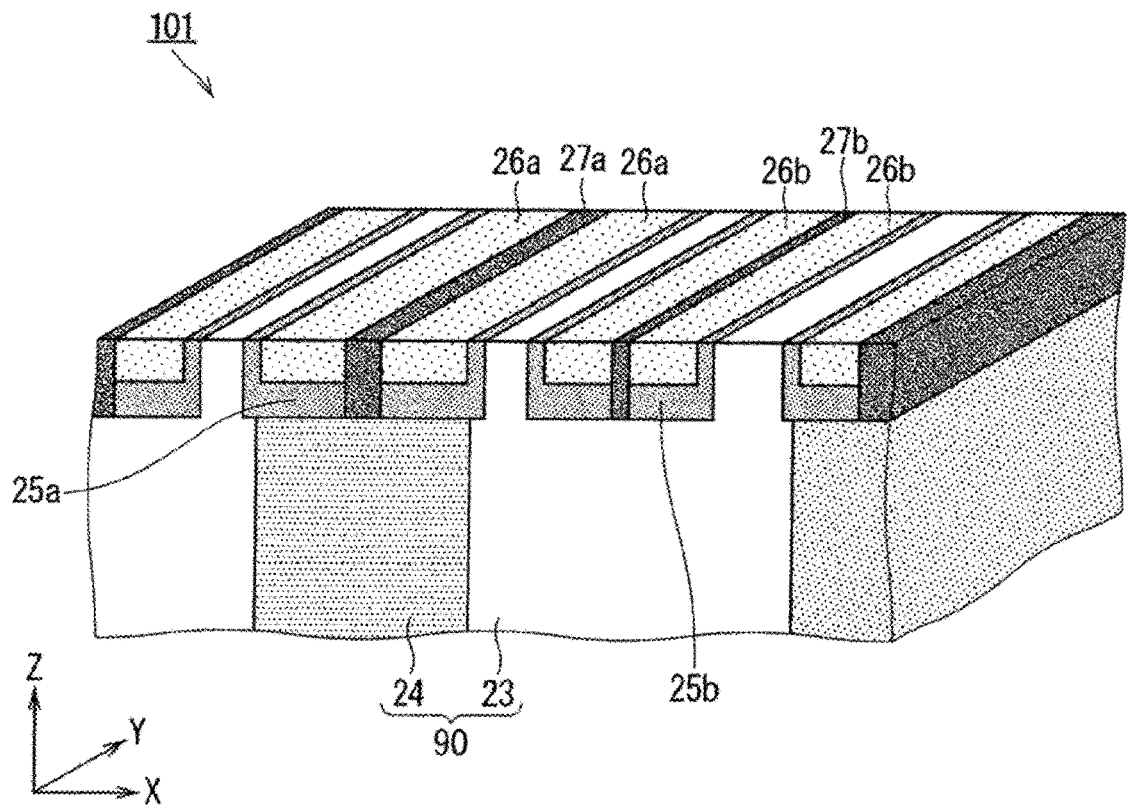
FIG. 94 A diagram illustrating an example of a configuration of the MOSFET cell region in the silicon carbide semiconductor device according to the embodiments 1 to 3.

Described using FIG. 92 to FIG. 94 is an example of a configuration of the MOSFET cell region MCR in the semiconductor device according to the embodiments 1 to 3 described above.

FIG. 92 is a cross-sectional perspective view schematically illustrating a unit cell configuration of a MOSFET 101. FIG. 93 is a partial enlarged view in which an illustration of the source electrode 31 in FIG. 92 is omitted. FIG. 94 is a diagram in which an illustration of a structure near the gate electrode 29 in FIG. 93 is omitted.

As illustrated in FIG. 92, the MOSFET 101 includes an n-type semiconductor substrate 21, a drain electrode 32, a super junction layer 90, a plurality of p-type well regions 25a, a plurality of n-type source regions 26a, a plurality of p-type well regions 25b, a plurality of n-type source regions 26b, a gate electrode 29, and a source electrode 31. The MOSFET 101 includes a gate insulating film 28, a gate electrode 29, and an interlayer insulating film 30 to constitute a MOS structure. The MOSFET 101 includes an epitaxial layer 22. The MOSFET 101 includes a p-type contact region 27a and a p-type contact region 27b.

The semiconductor substrate 21 includes a lower surface S1 and an upper surface S2 on a side opposite to the lower surface S1. An XYZ coordinate system illustrated in the diagrams is arranged so that an XY plane is parallel to the upper surface S2, and the Z axis is parallel to a thickness direction of the semiconductor substrate 21. A current route of the MOSFET 101 is formed to connect the lower surface S1 and the upper surface S2. Thus, the MOSFET 101 is a so-called vertical switching device.

The epitaxial layer 22 is a layer formed by epitaxial growth on the upper surface S2 of the semiconductor substrate 21. The epitaxial layer 22 has an n type. An impurity concentration of the epitaxial layer 22 is typically lower than that of the semiconductor substrate 21.

The super junction layer 90 is provided on the upper surface S2 of the semiconductor substrate 21 via the epitaxial layer 22. The super junction layer 90 includes a plurality of n-type pillars 23 and a plurality of p-type pillars 24 alternately arranged in an in-plane direction of the upper surface S2 (XY in-plane direction). Specifically, the n-type pillar 23 and the p-type pillar 24 are alternately disposed in the X direction in the in-plane direction (XY in-plane direction), and each of the n-type pillar 23 and the p-type pillar 24 extends along a direction (Y direction) perpendicular to one direction (X direction) in the in-plane direction (XY in-plane direction in FIG. 1). That is to say, the n-type pillar 23 and the p-type pillar 24 are disposed in a striped shape in a layout in parallel to the upper surface S2 of the semiconductor substrate 21.

The semiconductor substrate 21, the epitaxial layer 22, and the super junction layer 90 are made up of SiC.

The p-type well region 25a is provided on an upper layer portion of each p-type pillar 24. The well region 25a extends to reach the n-type pillar 23 on the super junction layer 90.

The n-type source region 26a is provided on an upper layer portion of each well region 25a, and is separated from the n-type pillar 23 by the well region 25a.

The p-type well region 25b is provided on an upper layer portion of each n-type pillar 23. The well region 25b is disposed away from the p-type pillar 24.

The n-type source region 26b is provided on an upper layer portion of each well region 25b, and is separated from the n-type pillar 23 by the well region 25b.

As illustrated in FIG. 94, the well region 25a and the well region 25b are disposed in a striped shape in a layout in parallel to the upper surface S2 of the semiconductor substrate 21. Each width of the well region 25b is smaller than that of the well region 25a. Each width of the well region 25a may be the same, and each width of the well region 25b may be the same.

The source electrode 31 is provided on a side of the upper surface S2 of the semiconductor substrate 21, and is bonded to each of the well region 25a, the well region 25b, the source region 26a, and the source region 26b.

The gate electrode 29 faces the well region 25a between the n-type pillar 23 and the source region 26a via the gate insulating film 28, and faces the well region 25b between the n-type pillar 23 and the source region 26b. The gate electrode 29 has a planar surface layout having a striped shape as illustrated in FIG. 93. The interlayer insulating film 30 isolates the gate electrode 29 and the source electrode 31.

Example of MOSFET Cell Region and MOSFET Terminal Region

Figure 95:
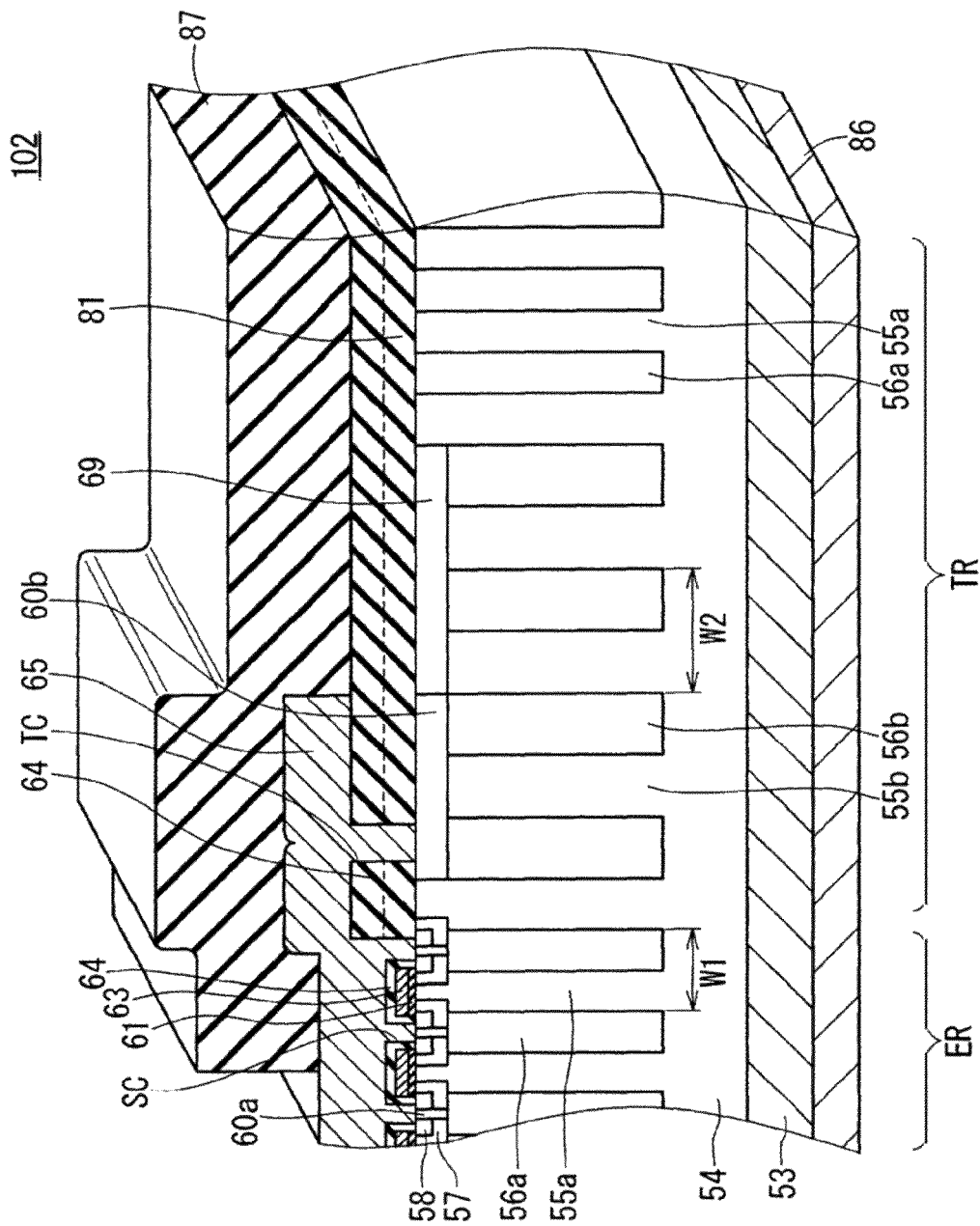
FIG. 95 A diagram illustrating an example of a configuration of a MOSFET terminal region in the silicon carbide semiconductor device according to the embodiments 1 to 3.
Figure 96:
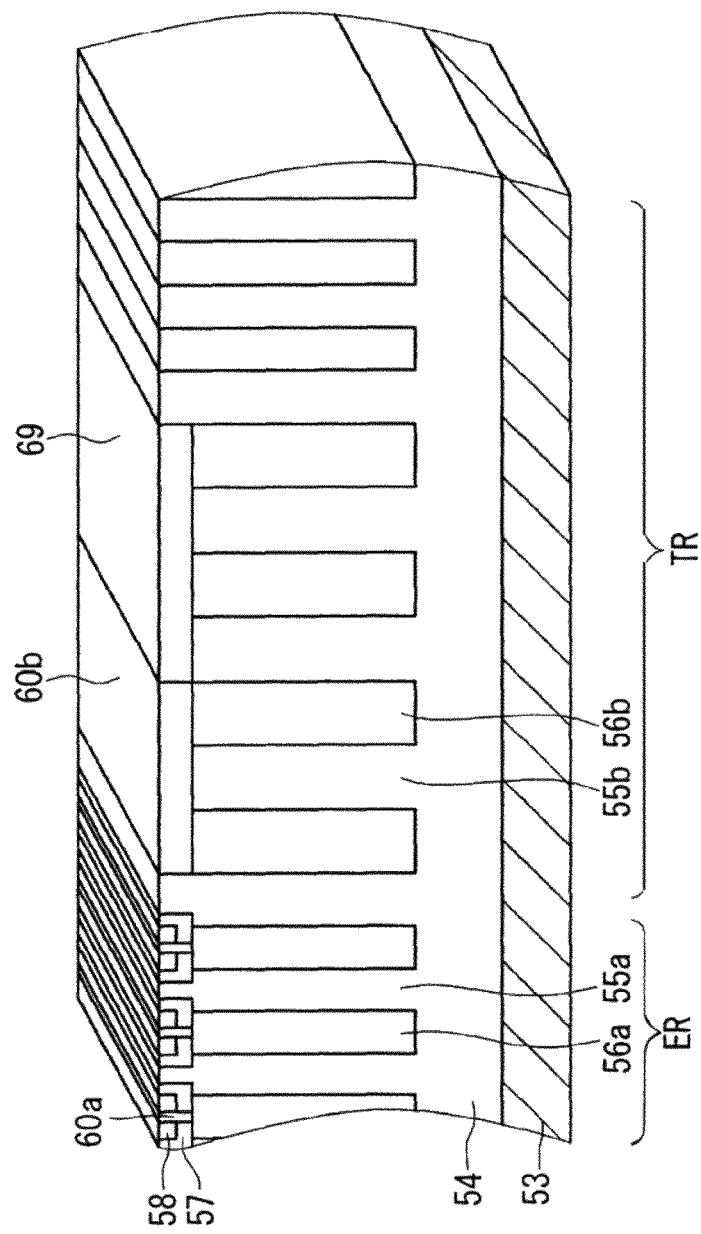
FIG. 96 A diagram illustrating an example of the configuration of the MOSFET terminal region in the silicon carbide semiconductor device according to the embodiments 1 to 3.

Described using FIG. 95 to FIG. 96 is an example of a configuration of the MOSFET cell region MCR and the MOSFET terminal region MTR in the semiconductor device according to the embodiments 1 to 3 described above.

As illustrated in FIG. 95, in a MOSFET 102, an n-type epitaxial layer 54 is provided on one main surface of an n-type semiconductor substrate 53 made of silicon carbide, a plurality of p-type well regions 57 are selectively provided on an upper layer portion of the epitaxial layer 54, and a p-type contact region 60a is provided in each well region 57 to pass through the well region 57.

An n-type source region 58 is provided to have contact with both side surfaces of a contact region 60a on the upper layer portion of the well region 57. The source region 58 is provided to have a thickness smaller than the well region 57, and the contact region 60a is provided to have a thickness substantially equal to the well region 57 or slightly deeper than the well region 57.

A gate insulating film 61 is selectively formed on the epitaxial layer 54, and a gate electrode 63 is formed on the gate insulating film 61. That is to say, the gate insulating film 61 is provided to extend from the partial upper portion of the source region 58 over the well region 57 and the epitaxial layer 54 to a partial upper portion of the source region 58 of the well regions 57 adjacent to each other between the source regions 58 adjacent to each other, and the gate electrode 63 is provided to cover the gate insulating film 61.

An interlayer insulating film 64 is formed to cover the gate insulating film 61 and the gate electrode 63, and a source electrode 65 is formed to cover the interlayer insulating film 64. Provided in the interlayer insulating film 64 is a contact hole SC passing through the interlayer insulating film 64 in a thickness direction to reach a part of the source region 58 and a whole surface of the contact region 60a in a region other than a region covering the gate electrode 63. The contact hole SC is filled with the source electrode 65, and the source electrode 65 is connected to the source region 58 and the contact region 60a.

The plurality of MOSFETs made up of the source region 58 and the like in such a manner are arranged in a horizontal direction with respect to the main surface of the semiconductor substrate 53, and parallelly connected to constitute an element group. A region where this element group is provided is an element region (active region) ER, and a terminal region TR achieving withstand voltage of the MOSFET 102 is provided in an outer peripheral portion of the element region ER. The element region ER falls under the MOSFET cell region MCR, and the terminal region TR falls under the MOSFET terminal region MTR.

A p-type contact region 60b is provided to define an outer edge of the element region ER on the upper layer portion of the epitaxial layer 54 in the terminal region TR. The contact region 60b is provided to have the same thickness as the contact region 60a, and a width thereof is larger than that of the contact region 60a.

A p-type resurf region 69 is provided to have substantially the same thickness as the contact region 60b on an outer side of the contact region 60b.

In the epitaxial layer 54, the plurality of n-type pillar layers 55a and p-type pillar layers 56a are alternately arranged so that the number thereof is equal to each other in the element region ER, and the plurality of n-type pillar layers 55b and p-type pillar layers 56b are alternately arranged in formation regions of the contact region 60b and the resurf region 69 in the terminal region TR. The plurality of n-type pillar layers 55a and p-type pillar layers 56a are alternately arranged in the terminal region TR on an outer side of an arrangement region of the n-type pillar layer 55b and the p-type pillar layer 56b.

Both the pillar layers are provided to extend in a depth direction of the epitaxial layer 54 from an outermost surface of the epitaxial layer 54 toward a side of the semiconductor substrate 53, and a deepest portion thereof is set to be shallower than the thickness of the epitaxial layer 54.

A width of each of the n-type pillar layer 55a and the p-type pillar layer 56a is the same as each other, and a total value thereof is referred to as a pillar pitch W1. A width of each of the n-type pillar layer 55b and the p-type pillar layer 56b is the same as each other. The width thereof is set to be wider than those of the n-type pillar layer 55a and the p-type pillar layer 56a, and a pillar pitch W2 as a total value of a width of each of the n-type pillar layer 55b and the p-type pillar layer 56b is larger than the pillar pitch W1.

In the terminal region TR, a field insulating film 81 is provided on the epitaxial layer 54, and an interlayer insulating film 64 is provided on the field insulating film 81.

The source electrode 65 is provided to extend from the element region ER to a laminated film made up of the field insulating film 81 and the interlayer insulating film 64 of the terminal region TR. A contact hole TC passing through the laminated film in a thickness direction thereof to reach the contact region 60b is provided in a region corresponding to an upper portion of the contact region 60b in the laminated film made up of the field insulating film 81 and the interlayer insulating film 64. The contact hole TC is filled with the source electrode 65, and the source electrode 65 is connected to the contact region 60b.

The laminated film made up of the field insulating film 81 and the interlayer insulating film 64 is provided to cover a part of an upper portion of the MOSFET on an outermost periphery of the element region ER, and a passivation film 87 is provided to cover a part of an upper portion of the source electrode 65 and an upper portion of the laminated film made up of the field insulating film 81 and the interlayer insulating film 64.

A drain electrode 86 is provided on the other main surface (rear surface) of the semiconductor substrate 53 on a side opposite to a side on which the source electrode 65 is provided.

Described next using FIG. 96 is a process of manufacturing an impurity layer after the pillar layer is formed. As illustrated in FIG. 96, after the n-type pillar layers 55a and 55b and the p-type pillar layers 56a and 56b are formed, that is to say, after the manufacturing process described using FIG. 13 to FIG. 17, for example, is performed, ion implantation of an impurity is performed using a resist mask (not shown) patterned by photolithography to selectively form the well region 57, the source region 58, the resurf region 59, and the contact regions 60a and 60b on the upper layer portion of the epitaxial layer 54.

Herein, a p-type impurity is introduced into the well region 57, the resurf region 59, and the contact regions 60a and 60b, and an n-type impurity is introduced into the source region 58. Ion implantation can be performed on the contact regions 60a and 60b using the same resist mask, and an impurity concentration thereof can be within a range of $1 \times 10^{18}$ to $1 \times 10^{21}$ cm$^{-3}$.

An impurity concentration of the well region 57 and the resurf region 59 can be within a range of $1 \times 10^{15}$ to $1 \times 10^{19}$ cm$^{-3}$, and a depth thereof may be within a range of 0.3 to 4.0 μm, for example. An impurity concentration of the source region 58 can be within a range exceeding the impurity concentration of the well region 57 such as $1 \times 10^{18}$ to $1 \times 10^{21}$ cm$^{-3}$, for example. A depth of the source region 58 is set so as not to exceed that of the well region 57.

Ion implantation can be performed on the contact regions 60a and 60b using the same resist mask, and an impurity concentration thereof can be within a range of $1 \times 10^{18}$ to $1 \times 10^{21}$ cm$^{-3}$. The ion implantation can be performed at a substrate temperature of 200° C. or more.

The contact regions 60a and 60b are regions provided to achieve favorable metal contact with the well region 57 and the resurf region 59, thus this configuration operates as a semiconductor device even without the contact regions 60a and 60b.

Although the illustration is omitted, thermal processing of 0.5 to 60 minutes is performed at a temperature of 1500 to 2200° C., for example, in inactive gas such as argon or nitrogen or in vacuum after the impurity is introduced. Accordingly, the implanted impurity is electrically activated. Subsequently, an oxide film is formed by performing sacrificial oxidation on the epitaxial layer 54, and then a surface alteration layer of the epitaxial layer 54 is removed by removing the oxide film using hydrofluoric acid to obtain a clean surface.

As illustrated in FIG. 96, in the element region ER, the well region 57 is formed to cover the upper layer portion of the p-type pillar layer 56a, and the p-type pillar layer 56a is electrically connected to the source electrode 55 (FIG. 95) via the contact region 60a. In the terminal region TR, the contact region 60b and the resurf region 59 are formed to cover the upper layer portions over the upper layer portions of the plurality of p-type pillar layers 56b, and the plurality of p-type pillar layers 56b covered by the contact region 60b have the same potential via the contact region 60b, and the plurality of p-type pillar layers 56b covered by the resurf region 59 have the same potential via the resurf region 59. The contact region 60b and the resurf region 59 are provided so that side surfaces thereof have contact with each other, thus the plurality of p-type pillar layers 56b covered by the contact region 60b are electrically connected to the source electrode 55 (FIG. 95) via the contact region 60b.

Example of SBD Region and SBD Terminal Region

Figure 97:
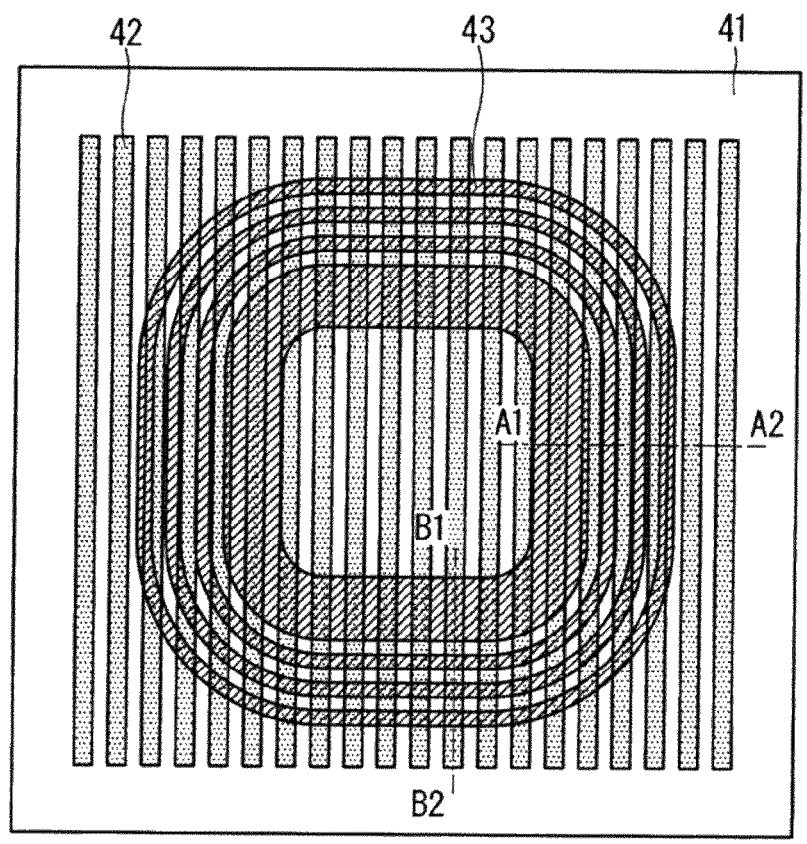
FIG. 97 A diagram illustrating an example of a configuration provided with an SBD region and an SBD terminal region in place of the MOSFET cell region in the silicon carbide semiconductor device according to the embodiments 1 to 3.
Figure 98:
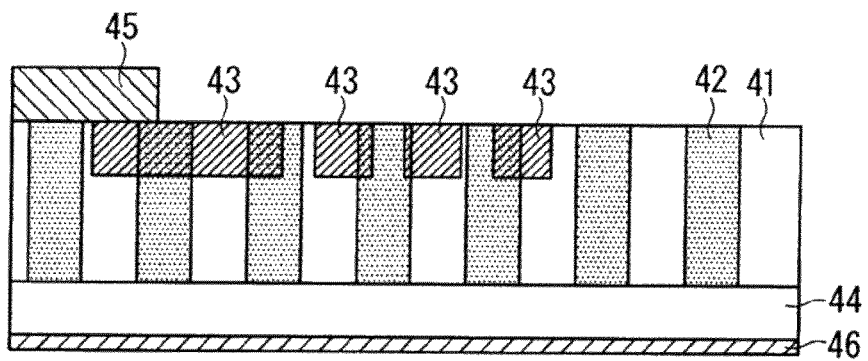
FIG. 98 A diagram illustrating an example of a configuration provided with the SBD region and the SBD terminal region in place of the MOSFET cell region in the silicon carbide semiconductor device according to the embodiments 1 to 3.
Figure 99:
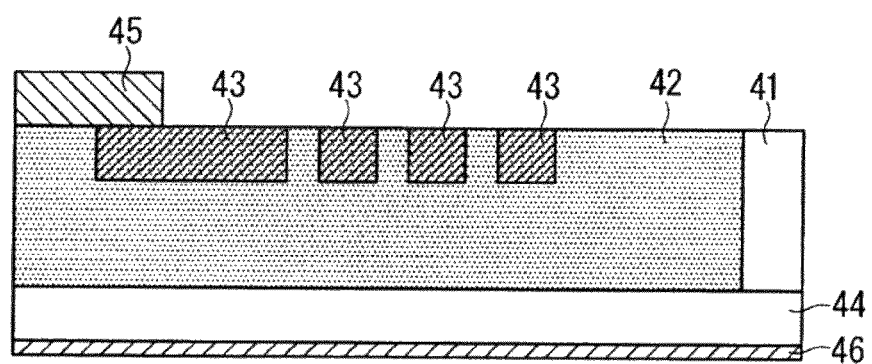
FIG. 99 A diagram illustrating an example of a configuration provided with the SBD region and the SBD terminal region in place of the MOSFET cell region in the silicon carbide semiconductor device according to the embodiments 1 to 3.

Described using FIG. 97 to FIG. 99 is an example of a configuration provided with an SBD region and an SBD terminal region in place of the MOSFET cell region MCR in the semiconductor device according to the embodiments 1 to 3 described above.

FIG. 97 is a plan view illustrating a surface structure of a semiconductor substrate 44 of a semiconductor device 103, FIG. 98 is a cross-sectional view along an A1-A2 line in FIG. 97 in an arrow direction, and FIG. 99 is a cross-sectional view along a B1-B2 line in FIG. 97 in an arrow direction.

As illustrated in FIG. 98 and FIG. 99, the semiconductor device 103 is formed using the semiconductor substrate 44 made up of an n-type SiC having an off angle. An n-type drift layer 41 is formed on the semiconductor substrate 44 by epitaxial growth.

The plurality of p-type pillar regions 42 are formed in the drift layer 41. As illustrated in FIG. 97, each of the p-type pillar regions 42 has a striped shape in a plan view. The plurality of p-type pillar regions 42 are provided in the drift layer 41, thus the drift layer 41 sandwiched by the p-type pillar regions 42 constitutes an n-type pillar region.

As illustrated in FIG. 98 and FIG. 99, a front surface electrode 45 as an anode electrode of the SBD is formed on the drift layer 41 including the p-type pillar region 42. A rear surface electrode 46 as a cathode electrode of the SBD is formed in a lower surface of the semiconductor substrate 44. The front surface electrode 45 is Schottky connected to the drift layer 41 and the p-type pillar region 42, and the rear surface electrode 46 is ohmic connected to the semiconductor substrate 44.

A plurality of withstand voltage holding structure 43 having a frame-like shape as a p-type semiconductor region are concentrically formed to surround the front surface electrode 45 on the upper layer portion of the drift layer 41 including the p-type pillar region 42. The region surrounded by the withstand voltage holding structure 43 constitutes an active region of the semiconductor device 103, and a formation region of the withstand voltage holding structure 43 and an outer side thereof constitutes a terminal region of the semiconductor device 103. An outer side of the active region including the withstand voltage holding structure 43 constitutes a terminal region in some cases.

As illustrated in FIG. 97, each withstand voltage holding structure 43 includes a side extending in parallel to the p-type pillar region 42 and a side perpendicular to the p-type pillar region 42 in a plan view. A chip of the semiconductor device 103 has a rectangular shape in a plan view. Thus, each withstand voltage holding structure 43 extends in parallel to the p-type pillar region 42 near the side in parallel to an extension direction of the p-type pillar region 42 of the semiconductor device 103, and each withstand voltage holding structure 43 extends to be perpendicular to the p-type pillar region 42 near the side perpendicular to the extension direction of the p-type pillar region 42.

At least one of the plurality of withstand voltage holding structures 43 is formed to overlap with a part of the front surface electrode 45 in a plan view. More specifically, as illustrated in FIG. 98 and FIG. 99, the withstand voltage holding structure 43 on the innermost side is formed to overlap with an end portion of the front surface electrode 45.

Although the present disclosure is described in detail, the foregoing description is in all aspects illustrative and does not restrict the disclosure. It is therefore understood that numerous modification examples can be devised without departing from the scope of the present disclosure.

In the present disclosure, each embodiment can be arbitrarily combined, or each embodiment can be appropriately varied or omitted within the scope of the disclosure.

The invention claimed is:
1. A semiconductor device, comprising:
a semiconductor base body of a first conductivity type;
a pillar part including a plurality of first pillars of a first conductivity type and a plurality of second pillars of a second conductivity type provided on the semiconductor base body to protrude in a thickness direction of the semiconductor base body;
a pillar surrounding part of a first conductivity type or a second conductivity type provided around the pillar part; and
a semiconductor element in which the pillar part is provided as an active region, wherein
the plurality of first and second pillars have a striped shape in a plan view, and are alternately arranged in parallel to each other in a pillar width direction perpendicular to a longitudinal direction of each of the pillars,
the pillar surrounding part is provided to wholly surround, with a width, the pillar part protruding on the semiconductor base body so that upper surfaces of the plurality of first and second pillars are exposed,
when a conductivity type of the pillar surrounding part is a second conductivity type, a product of a concentration of an impurity of the pillar surrounding part and the width of the pillar surrounding part is set to be larger than a product of a concentration of an impurity of a second conductivity type of the second pillar and a width of the second pillar, and
when a conductivity type of the pillar surrounding part is a first conductivity type, a product of a concentration of an impurity of the pillar surrounding part and the width of the pillar surrounding part is set to be larger than a product of a concentration of an impurity of a first conductivity type of the first pillar and a width of the first pillar.
2. The semiconductor device according to claim 1, wherein a conductivity type of the pillar surrounding part is a second conductivity type, a concentration of an impurity of a second conductivity type of the pillar surrounding part is identical with a concentration of an impurity of a second conductivity type of the second pillar, and the width of the pillar surrounding part is set to be larger than the width of the second pillar.

3. The semiconductor device according to claim 1, wherein a conductivity type of the pillar surrounding part is a first conductivity type, a concentration of an impurity of a first conductivity type of the pillar surrounding part is identical with a concentration of an impurity of a first conductivity type of the first pillar, and the width of the pillar surrounding part is set to be larger than the width of the first pillar.

4. The semiconductor device according to claim 1, further comprising a surrounding part provided on the semiconductor base body on an outer side of the pillar surrounding part and having a conductivity type identical with the pillar surrounding part.

5. The semiconductor device according to claim 1, wherein silicon carbide is used as a material of a semiconductor in the semiconductor base body.

6. The semiconductor device according to claim 1, wherein a ratio of a height of the semiconductor layer provided below the pillar part to a height of the semiconductor layer provided below the pillar surrounding part is 2:1.

7. A semiconductor device, comprising:

a semiconductor base body of a first conductivity type;

a pillar part including a plurality of first pillars of a first conductivity type and a plurality of second pillars of a second conductivity type provided on the semiconductor base body to protrude in a thickness direction of the semiconductor base body;

a pillar surrounding part of a first conductivity type or a second conductivity type provided around the pillar part; and a semiconductor element in which the pillar part is provided as an active region, wherein the plurality of first and second pillars have a striped shape in a plan view, and are alternately arranged in parallel to each other in a pillar width direction perpendicular to a longitudinal direction of each of the pillars, the semiconductor base body includes:

a semiconductor substrate of a first conductivity type; and a semiconductor layer of a first conductivity type provided on the semiconductor substrate, and a height of the semiconductor layer provided below the pillar surrounding part is lower than a height of the semiconductor layer provided below the pillar part, and a ratio of the height of the semiconductor layer provided below the pillar part to the height of the semiconductor layer provided below the pillar surrounding part is 2:1.

8. A method of manufacturing a semiconductor device, comprising:

a step (a) of forming a first semiconductor layer of a first conductivity type on a semiconductor substrate of a first conductivity type by epitaxial growth;

a step (b) of etching the first semiconductor layer to form a plurality of convex parts protruding in a thickness direction of the semiconductor substrate at intervals and forming a surrounding part of the plurality of convex parts;

a step (c) of forming a second semiconductor layer of a second conductivity type between the plurality of convex parts, an upper portion of the plurality of convex parts, and an upper portion of the surrounding part by epitaxial growth;

a step (d) of removing at least the second semiconductor layer on an upper portion of the plurality of convex parts and exposing upper surfaces of the plurality of convex parts to constitute a plurality of first pillars of a first conductivity type and making the second semiconductor layer between the plurality of convex parts constitute a plurality of second pillars of a second conductivity type, thereby forming a pillar part, and making the second semiconductor layer on the upper portion of the surrounding part constitute a pillar surrounding part of a second conductivity type surrounding the pillar part; and a step (e) of forming a semiconductor element in which the pillar part constitutes an active region, wherein the step (b) includes a step of performing etching so that each of the plurality of convex parts has a striped shape in a plan view, and is arranged in parallel to each other at intervals in a width direction perpendicular to a longitudinal direction of the convex parts, and the plurality of first and second pillars have a striped shape in a plan view, and are alternately arranged in parallel to each other in the width direction perpendicular to a longitudinal direction of each of the pillars.

9. The method of manufacturing the semiconductor device according to claim 8, wherein the step (c) includes steps of epitaxially growing the second semiconductor layer to wholly surround, with a width, the pillar part protruding on the semiconductor substrate and make a product of a concentration of an impurity of a second conductivity type and the width larger than a product of a concentration of an impurity of a second conductivity type of the second pillar and a width of the second pillar.

10. The method of manufacturing the semiconductor device according to claim 9, wherein the step (c) includes steps of epitaxially growing the second semiconductor layer so that a concentration of an impurity of a second conductivity type of the pillar surrounding part is identical with a concentration of an impurity of a second conductivity type of the second pillar and the width of the pillar surrounding part is larger than the pillar width of the second pillar.

11. The method of manufacturing the semiconductor device according to claim 8, wherein the step (c) includes a step of epitaxially growing the second semiconductor layer to wholly surround, with a width, the pillar part protruding on the semiconductor substrate, and a step of performing ion implantation on the second semiconductor layer in the surrounding part of the plurality of convex parts is further included between the step (c) and the step (d), thus a product of a concentration of an impurity of a second conductivity type of the pillar surrounding part and the width is larger than a product of a concentration of an impurity of a second conductivity type of the second pillar and a width of the second pillar.

12. The method of manufacturing the semiconductor device according to claim 8, wherein the step (d) includes a step of, by whole surface etching, removing the second semiconductor layer on an upper portion of the plurality of convex parts and removing a surrounding part on an outer side of the pillar surrounding part having an identical conductivity type with the pillar surrounding part.

13. The method of manufacturing the semiconductor device according to claim 8, wherein
the step (b) includes a step of etching the first semiconductor layer so that a height of the first semiconductor layer located below the pillar surrounding part of the first semiconductor layer is lower than a height of the first semiconductor layer located below the pillar part in forming the plurality of convex parts and the surrounding part of the plurality of convex parts.

14. The method of manufacturing the semiconductor device according to claim 8, wherein
silicon carbide is used as a material of a semiconductor in the semiconductor substrate.

15. A method of manufacturing a semiconductor device, comprising:
a step (a) of forming a first semiconductor layer of a first conductivity type on a semiconductor base body of a first conductivity type by epitaxial growth;
a step (b) of etching the first semiconductor layer to form a plurality of convex parts protruding in a thickness direction of the semiconductor base body at intervals and exposing the semiconductor base body around the plurality of convex parts to constitute a surrounding part;
a step (c) of forming a second semiconductor layer of a first conductivity type between the plurality of convex parts, an upper portion of the plurality of convex parts, and an upper portion of the surrounding part of the plurality of convex parts by epitaxial growth;
a step (d) of removing at least the first semiconductor layer on an upper portion of the plurality of convex parts and exposing upper surfaces of the plurality of convex parts to constitute a plurality of second pillars of a second conductivity type and making the first semiconductor layer between the plurality of convex parts constitute a plurality of first pillars of a first conductivity type, thereby forming a pillar part, and making the first semiconductor layer on the upper portion of the surrounding part constitute a pillar surrounding part of a first conductivity type surrounding the pillar part; and
a step (e) of forming a semiconductor element in which the pillar part constitutes an active region, wherein
the step (b) includes a step of performing etching so that each of the plurality of convex parts has a striped shape in a plan view, and is arranged in parallel to each other at intervals in a width direction perpendicular to a longitudinal direction of the convex parts, and
the plurality of first and second pillars have a striped shape in a plan view, and are alternately arranged in parallel to each other in the width direction perpendicular to a longitudinal direction of each of the pillars.

16. The method of manufacturing the semiconductor device according to claim 15, wherein
the semiconductor base body includes a semiconductor layer of a first conductivity type formed on a semiconductor substrate of a first conductivity type by epitaxial growth, and
the first semiconductor layer is formed on the semiconductor layer.

17. The method of manufacturing the semiconductor device according to claim 15, wherein
the step (c) includes steps of epitaxially growing the first semiconductor layer to wholly surround, with a width, the pillar part protruding on the semiconductor base body and make a product of a concentration of an impurity of a first conductivity type and the width larger than a product of a concentration of an impurity of a first conductivity type of the first pillar and a width of the first pillar.

18. The method of manufacturing the semiconductor device according to claim 15, wherein
the step (c) includes a step of epitaxially growing the second semiconductor layer to wholly surround, with a width, the pillar part protruding on the semiconductor base body, and
a step of performing ion implantation on the first semiconductor layer in the surrounding part of the plurality of convex parts is further included between the step (c) and the step (d), thus a product of a concentration of an impurity of a first conductivity type of the pillar surrounding part and the width is larger than a product of a concentration of an impurity of a first conductivity type of the first pillar and a width of the first pillar.

19. The method of manufacturing the semiconductor device according to claim 15, wherein
the step (d) includes a step of, by whole surface etching, removing the first semiconductor layer on an upper portion of the plurality of convex parts and removing a surrounding part on an outer side of the pillar surrounding part having an identical conductivity type with the pillar surrounding part.

20. The method of manufacturing the semiconductor device according to claim 15, wherein
the step (b) includes a step of etching the semiconductor base body so that a height of the semiconductor base body located below the pillar surrounding part of the semiconductor base body is lower than a height of the semiconductor base body located below the pillar part in forming the plurality of convex parts and the surrounding part of the plurality of convex parts.

21. The method of manufacturing the semiconductor device according to claim 15, wherein
silicon carbide is used as a material of a semiconductor in the semiconductor base body.

* * * * *